United States Patent
Shibuya et al.

(10) Patent No.: US 6,292,066 B1
(45) Date of Patent: Sep. 18, 2001

(54) FUNCTION GENERATOR, CRYSTAL OSCILLATION DEVICE AND METHOD OF ADJUSTING CRYSTAL OSCILLATION DEVICE

(75) Inventors: Shuji Shibuya; Hisato Takeuchi; Junichi Matsuura; Yuichi Tateyama, all of Kanagawa; Takaharu Saeki, Kyoto, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/462,564

(22) PCT Filed: Jul. 8, 1998

(86) PCT No.: PCT/JP98/03062

§ 371 Date: Jun. 5, 2000

§ 102(e) Date: Jun. 5, 2000

(87) PCT Pub. No.: WO99/03195

PCT Pub. Date: Jan. 21, 1999

(30) Foreign Application Priority Data

Jul. 11, 1997 (JP) .................................................... 9-186297

(51) Int. Cl.[7] .................................. H03L 1/02; H03B 5/32
(52) U.S. Cl. ...................... 331/176; 327/513; 331/116 R; 331/158; 331/177 V
(58) Field of Search .......................... 331/116 R, 116 FE, 331/158, 176, 177 V; 327/513

(56) References Cited

U.S. PATENT DOCUMENTS 5,473,289 * 12/1995 Ishizaki et al. ........................ 331/176
5,691,671 * 11/1997 Bushman .............................. 331/176
5,731,742 * 3/1998 Wojewoda et al. ................... 331/176

FOREIGN PATENT DOCUMENTS

| | | |
|---|---|---|
| 48-101860 | 12/1973 | (JP) . |
| 1-265708 | 10/1989 | (JP) . |
| 8-116214 | 5/1996 | (JP) . |
| 8-288741 | 11/1996 | (JP) . |
| 9-55624 | 2/1997 | (JP) . |
| 9-153104 | 6/1997 | (JP) . |
| 9-266409 | 10/1997 | (JP) . |

* cited by examiner

Primary Examiner—Siegfried H. Grimm
(74) Attorney, Agent, or Firm—Eric J. Robinson; Nixon Peabody LLP

(57) ABSTRACT

A temperature compensating crystal oscillation device includes a constant voltage circuit (12) for outputting a predetermined voltage independent of the ambient temperature, a temperature sensor circuit (13) for outputting a voltage in proportion to the ambient temperature, and a control circuit (14) for receiving the constant voltage output from the constant voltage circuit (12) and the voltage output in proportion to the temperature from the temperature sensor circuit (13) and for generating a control voltage (Vc) used for compensating a temperature characteristic of a quartz oscillator in the entire range of the ambient temperature through polygonal lines approximation of a negative cubic curve by using continuous lines. Furthermore, the crystal oscillation device includes a VCXO (15) whose oscillation frequency is controlled to be a predetermined value by the control voltage (Vc), and a ROM/RAM circuit (16) for storing temperature compensating parameters used for compensation of a temperature characteristic of the control voltage (Vc) for optimizing the oscillation frequency of the VCXO (15).

28 Claims, 28 Drawing Sheets

Fig. 10
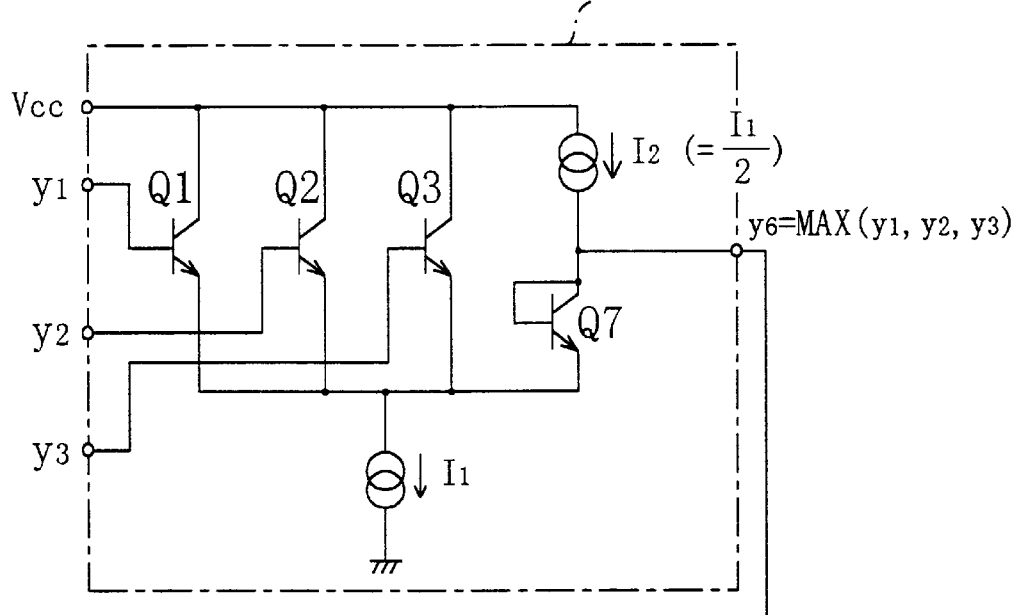
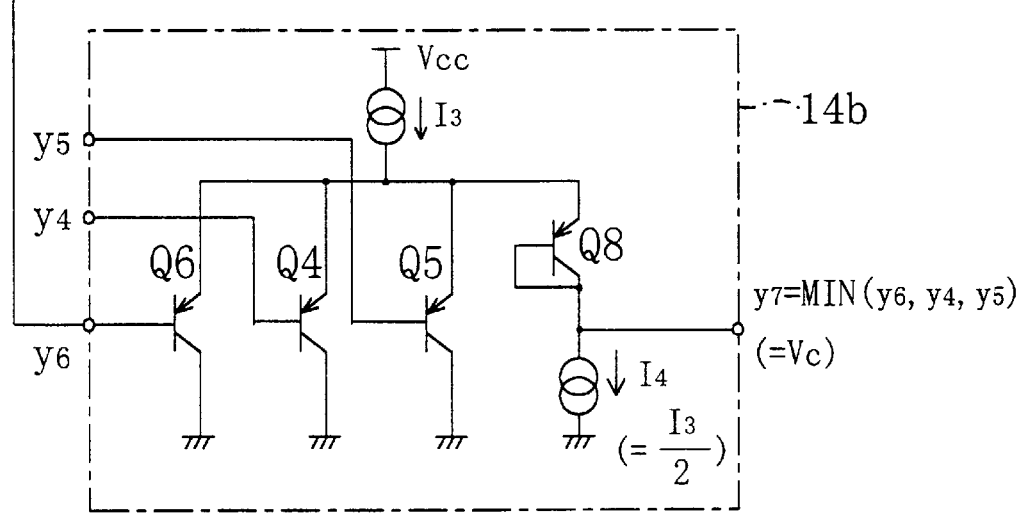

Fig. 15
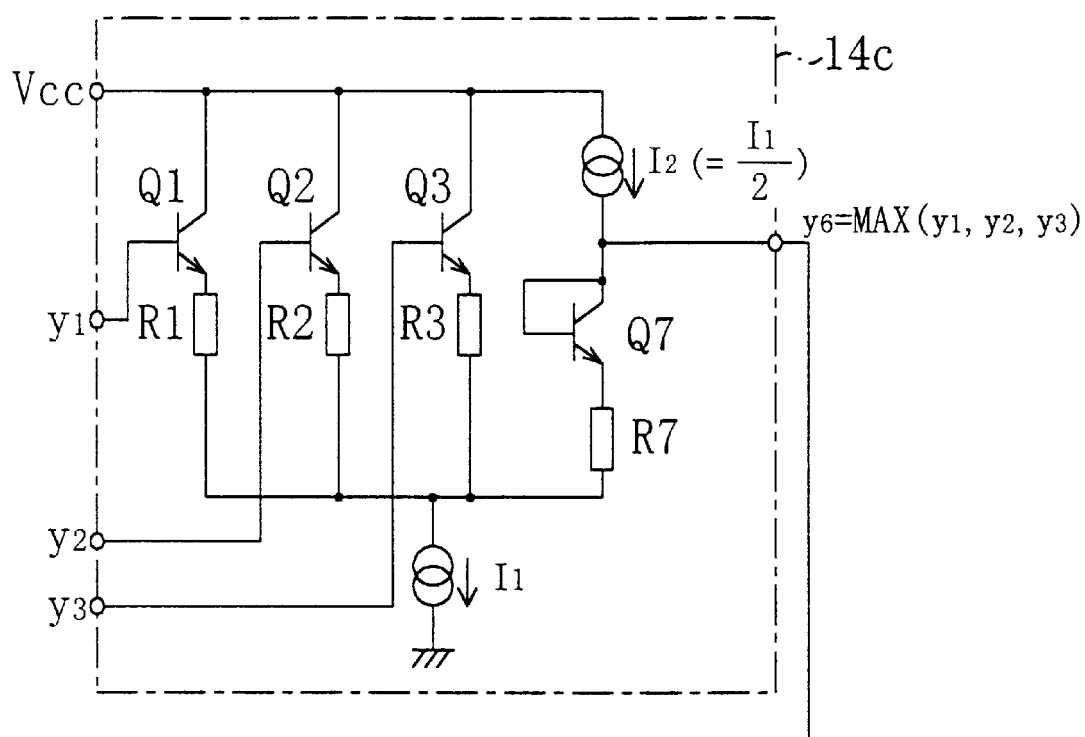
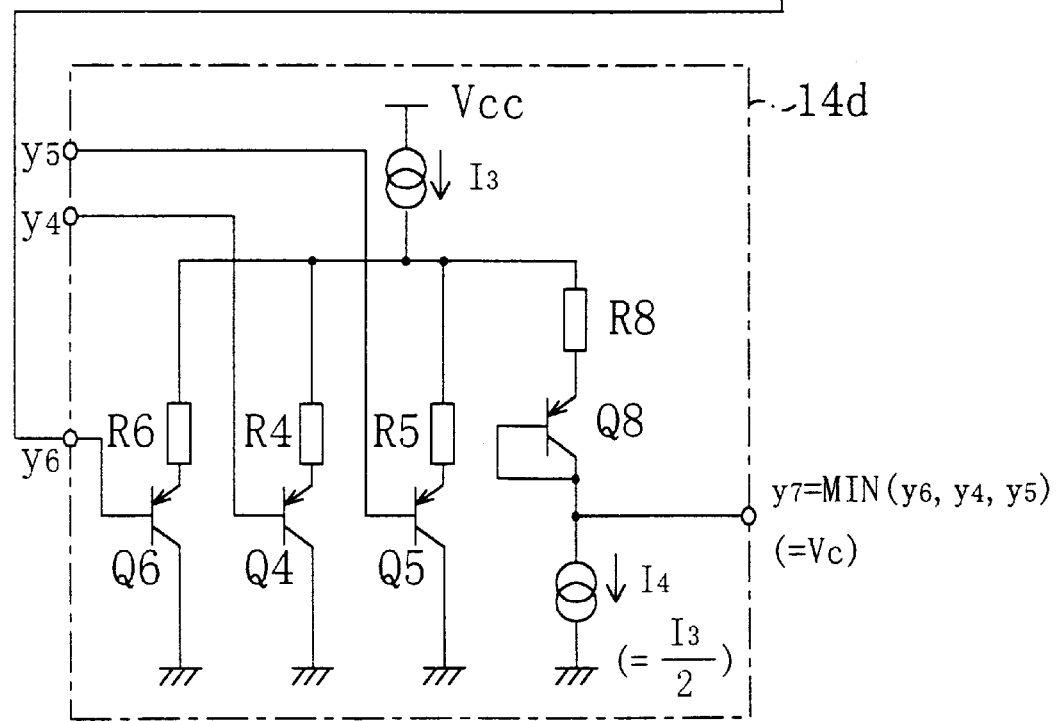

Fig. 18

| PARAMETER OF CRYSTAL OSCILLATOR | | PARAMETER OF CONTROL VOLTAGE | y1 – y5 INDEPENDENTLY ADJUSTED | POINT-SYMMETRY AT LOW AND HIGH TEMPERATURE SIDES | PROPORTIONS GIVEN TO a1 – a5 AND b1 – b5 |
|---|---|---|---|---|---|
| α | y1 { a1<br>b1 | | 4<br>4 | 4<br>4 | ⎫<br>⎪ |
| | y2 b2 | | 2 | 2 | ⎪ |
| | y3 a3 | | 4 | 4 | ⎬ 6 IN TOTAL |
| | y4 b4 | | 2 | (b4=b2) | ⎪ |
| | y5 { a5<br>b5 | | 4<br>4 | (a5=a1)<br>(b5=b1) | ⎪<br>⎭ |
| SUBTOTAL | | — | 24BITS | 14BITS | 6BITS |
| β | | βVc | 6 | 6 | 6 |
| γ | | γVc | 7 | 7 | 7 |
| Ti | | TiVc | 3 | 3 | 3 |
| TOTAL | | — | 40BITS | 30BITS | 22BITS |

US 6,292,066 B1

FUNCTION GENERATOR, CRYSTAL OSCILLATION DEVICE AND METHOD OF ADJUSTING CRYSTAL OSCILLATION DEVICE

TECHNICAL FIELD

The present invention relates to a function generator for generating a control signal for compensating temperature dependency of an oscillation frequency output from a crystal oscillation device, a crystal oscillation device using the function generator and a method of adjusting the crystal oscillation device.

BACKGROUND ART

Recently, there is a sharp rise in demand for portable electronic equipment, and a compact and accurate crystal oscillation device for generating a reference clock signal is indispensable to such electronic equipment.

The oscillation frequency of a crystal oscillator in a crystal oscillation device has a temperature characteristic including cubic and linear components derived from a quartz oscillator used in the crystal oscillator. Specifically, with the abscissa indicating the ambient temperature $T_a$ and the ordinate indicating the oscillation frequency f as is shown in FIG. 26(a), the oscillation frequency f of a crystal oscillator whose temperature characteristic is not compensated is represented as a substantially cubic curve 101 with a difference of approximately 10 ppm through 30 ppm between the maximum value and the minimum value. Herein, the ambient temperature $T_a$, is assumed to be approximately −30° C. through +80° C. Accordingly, when an ideal control voltage curve 102 as is shown in FIG. 26(b), with the abscissa indicating the ambient temperature $T_a$ and the ordinate indicating a control voltage Vc, is generated and applied to the crystal oscillator, $df/dT_a$ can be zero and the oscillation frequency f can be substantially independent of the temperature as is shown in FIG. 26(c).

The temperature characteristic can be compensated, for example, as follows: A varactor diode (i.e.,a variable capacity diode) serving as a frequency adjustment device is connected with the crystal oscillator, and a control voltage having a cubic and linear temperature characteristic for compensating the temperature characteristic of the crystal oscillator is applied to the varactor diode. Thus, the temperature characteristic of the oscillation frequency can be stabilized.

Actually, it is technically very difficult to generate a control voltage Vc having the ideal temperature characteristic as is shown in FIG. 26(b). Therefore, in general, a control voltage having a pseudo cubic temperature characteristic is generated by any of various methods so as attain the temperature compensation of the oscillation frequency.

Now, a conventional temperature compensating crystal oscillation device disclosed in Japanese Laid-Open Patent Publication No. 8-288741 will be described with reference to accompanying drawings.

FIG. 27 shows the functional block configuration of the conventional temperature compensating crystal oscillation device. In the temperature compensation of this crystal oscillation device, the cubic and linear temperature characteristic of the crystal oscillator is divided into plural temperature regions, and voltages in the respective divided temperature regions represented as a function of the temperature are subjected to polygonal lines approximation to obtain temperature lines.

Specifically, a memory 111 of FIG. 27 stores each divided temperature region, a temperature coefficient (proportional coefficient) of the temperature line in the temperature region, and a voltage value at room temperature on the temperature line of each region of the voltage line. Voltage line data corresponding to the ambient temperature detected by a temperature sensor circuit 112 is selectively read from the memory 111, and a predetermined control voltage is generated in an amplifier circuit 113 on the basis of the read control voltage data. The thus generated control voltage is applied to a voltage control crystal oscillator 114, so that the oscillation frequency can be stabilized through the temperature compensation of the oscillation frequency.

Furthermore, as is shown in FIG. 28(a), the temperature sensor circuit 112 performs the polygonal lines approximation by using A/D conversion. Therefore, frequency skip, namely, temporary discontinuity of the voltage lines, is caused between temperature regions as is shown in FIG. 28(c). In order to avoid this frequency skip, a sample and hold circuit 115 is interposed between the amplifier circuit 113 and the voltage control crystal oscillator 114, so as to make the frequency vary smoothly with time.

However, since such a conventional temperature compensating crystal oscillation device uses the A/D conversion for the polygonal lines approximation for generating the control voltage to be used for the temperature compensation, a quantum noise is unavoidably caused, and the frequency skip cannot be avoided in principle. Moreover, a clock signal generator is indispensable, and hence, there arises a problem of a clock noise. In addition, it disadvantageously takes time to stabilize the oscillation frequency after the actuation due to a time constant of the sample and hold circuit 115.

Furthermore, in measurement and adjustment of the temperature characteristic, the temperature characteristic of the oscillation frequency of the crystal oscillation device is measured with the ambient temperature changed discretely in order to compensate the temperature characteristic. Therefore, an error can be caused in the adjustment itself. In order to reduce the error, it is necessary to increase the number of the divided temperature regions, which leads to another problem that the storage capacity of the memory 111 is increased.

The object of the invention is eliminating the frequency skip from the control voltage itself and easing the adjustment of the temperature compensation.

DISCLOSURE OF INVENTION

In order to achieve the aforementioned object, a control voltage for temperature compensation is generated in this invention by using merely analog circuits free from frequency skip in principle.

The function generator of this invention for generating a control signal as a function of a temperature, comprises a first analog signal generating circuit for generating and outputting a predetermined analog signal independent of an ambient temperature; a second analog signal generating circuit for outputting an analog signal dependent upon the ambient temperature; and a control circuit for receiving the signal from the first analog signal generating circuit and the signal from the second analog signal generating circuit, and for generating, with a feasible range of the ambient temperature continuously divided into a first temperature region, a second temperature region, a third temperature region, a fourth temperature region and a fifth temperature region in this order along a direction from a low temperature to a high temperature, control signals respectively corresponding to the five temperature regions, wherein the control circuit outputs a first control signal whose output value is varied in proportion to increase of the temperature at a first change rate when the ambient temperature is in the first temperature region; a second control signal whose output value is continuous with the first control signal and is a predetermined value independent of the temperature when the ambient temperature is in the second temperature region; a third control signal whose output value is continuous with the second control signal and is varied in proportion to increase of the temperature at a second change rate when the ambient temperature is in the third temperature region; a fourth control signal whose output value is continuous with the third control signal and is a predetermined value independent of the temperature when the ambient temperature is in the fourth temperature region; and a fifth control signal whose output value is continuous with the fourth control signal and is varied in proportion to increase of the temperature at a third change rate having the same polarity as the first change rate.

Thus, the function generator of this invention includes the first analog signal generating circuit for generating and outputting the predetermined analog signal independent of the ambient temperature, the second analog signal generating circuit for generating and outputting the analog signal dependent upon the ambient temperature and the control circuit for receiving the signal from the first analog signal generating circuit and the signal from the second analog signal generating circuit and for generating the control signals continuously corresponding to the entire regions ranging from the low temperature to the high temperature. Accordingly, although the ambient temperature is divided into the five regions, the frequency skip is not caused in the vicinity of the boundary between the regions, resulting in attaining good approximation with a small approximation error. Moreover, since the function generator includes the analog circuits alone, a clock generator is not required differently from a digital circuit, and hence, a clock noise can also be avoided.

Furthermore, when the ambient temperature is in the first temperature region, the first control signal whose output value is varied in proportion to the increase of the temperature at the first change rate is output; when the ambient temperature is in the second temperature region, the second control signal having the predetermined value independent of the temperature is output; when the ambient temperature is in the third temperature region, the third control signal whose output value is varied in proportion to the temperature at the second change rate is output; when the ambient temperature is in the fourth temperature region, the fourth control signal having the predetermined value independent of the temperature is output; and when the ambient temperature is in the fifth temperature region, the fifth control signal whose output value is varied in proportion to the temperature at the third change rate having the same polarity as the first change rate is output. Accordingly, the temperature function having a positive cubic component can be compensated through polygonal lines approximation using five straight lines. As a result, even though the number of lines used in the approximation is five and comparatively small, the approximation can be sufficiently performed. Therefore, the number of combinations of adjustment parameters such as proportional coefficients and constants of the lines used in the polygonal lines approximation can be decreased, and hence, the adjustment of the respective temperature functions to be compensated can be eased.

Preferably, in the function generator, the analog signal is a voltage signal, the first and third change rates are negative rates, and the second change rate is a positive rate. In this manner, the temperature function having the positive cubic component can be definitely compensated by the polygonal lines approximation using the five lines. Furthermore, when the voltage signal is used as a control signal for a voltage control crystal oscillating circuit controlled to have an oscillation frequency of a predetermined value through voltage control, a desired oscillation frequency whose dependency on the ambient temperature is negligible can be definitely obtained.

Preferably, in the function generator, on a graph of the first control signal, the second control signal, the third control signal, the fourth control signal and the fifth control signal for representing a temperature characteristic of a quartz oscillator against the ambient temperature, the first control signal and the fifth control signal are point-symmetrical about a coordinate point on the graph determined by a temperature of an inflection point of an oscillation frequency of the quartz oscillator and a value of the third control signal at the temperature of the inflection point, the second control signal and the fourth control signal are point-symmetrical about the coordinate point, and the third control signal is point-symmetrical about the coordinate point. In this manner, the number of the combinations of the adjustment parameters such as the proportional coefficients and the constants of the lines used in the polygonal lines approximation can be further decreased, and hence, the adjustment of the respective temperature functions to be compensated can be further eased.

Preferably, the function generator further comprises storage means, wherein when the ambient temperature is in the first temperature region, the storage means has a first proportion value for defining a relationship between a proportional coefficient between a temperature used for generating the first control signal and the output value thereof and a cubic coefficient of a temperature characteristic of an oscillation frequency of a quartz oscillator, and the first proportion value is output to the control circuit, when the ambient temperature is in the second temperature region, the storage means has a second proportion value for defining a relationship between a constant between a temperature used for generating the second control signal and the output value thereof and the cubic coefficient, and the second proportion value is output to the control circuit, when the ambient temperature is in the third temperature region, the storage means has a third proportion value for defining a relationship between a proportional coefficient between a temperature used for generating the third control signal and the output value thereof and the cubic coefficient, and the third proportion value is output to the control circuit, when the ambient temperature is in the fourth temperature region, the storage means has a fourth proportion value for defining a relationship between a constant between a temperature used for generating the fourth control signal and the output value thereof and the cubic coefficient, and the fourth proportion value is output to the control circuit, when the ambient temperature is in the fifth temperature region, the storage means has a fifth proportion value for defining a relationship between a proportional coefficient between a temperature used for generating the fifth control signal and the output value thereof and the cubic coefficient, and the fifth proportion value is output to the control circuit, and the storage means stores the first proportion value, the second proportion value, the third proportion value, the fourth proportion value and the fifth proportion value. In this manner, in the adjustment of a cubic temperature coefficient of a quartz oscillator, circuit constants corresponding to the proportional coefficients of the lines and circuit constants corresponding to the constants of the lines can be set in a batch. Therefore, fluctuations of a cubic temperature coefficient and a linear temperature coefficient derived from the AT cut angle of a quartz oscillator and fluctuation of the absolute value of the oscillation frequency can be easily and definitely adjusted.

Preferably, in the function generator, the control circuit includes a first NPN transistor whose collector is supplied with a supply voltage, whose base is supplied with a first electric signal decreasing in proportion to the ambient temperature and whose emitter is connected with an input of a first current source; a second NPN transistor whose collector is supplied with the supply voltage, whose base is supplied with a second electric signal retaining a predetermined value independent of the ambient temperature and whose emitter is connected with the input of the first current source; a third NPN transistor whose collector is supplied with the supply voltage, whose base is supplied with a third electric signal increasing inproportion to the ambient temperature and whose emitter is connected with the input of the first current source; a fourth NPN transistor whose collector and base are connected with an output of a second current source having a current value a half as large as a current value of the first current source and whose emitter is connected with the input of the first current source; a first PNP transistor whose base is connected with the collector of the fourth NPN transistor, whose emitter is connected with an output of a third current source and whose collector is grounded; a second PNP transistor whose base is supplied with a fourth electric signal retaining a predetermined value independent of the ambient temperature, whose emitter is connected with the output of the third current source and whose collector is grounded; a third PNP transistor whose base is supplied with a fifth electric signal decreasing in proportion to the ambient temperature, whose emitter is connected with the output of the third current source and whose collector is grounded; and a fourth PNP transistor whose emitter is connected with the output of the third current source and whose collector and base are connected with an input of a fourth current source having a current value a half as large as a current value of the third current source, the fourth NPN transistor selects an electric signal having a maximum voltage value among the first electric signal, the second electric signal and the third electric signal and outputs the selected electric signal at the collector thereof as a sixth electric signal, the fourth PNP transistor selects an electric signal having a minimum voltage value among the fourth electric signal, the fifth electric signal and the sixth electric signal and outputs the selected electric signal at the collector thereof as a seventh electric signal, and the control circuit outputs the seventh electric signal as the control signal. In this manner, the control signal can be definitely generated by using the analog signals alone.

Preferably, in the function generator, a first resistance is serially connected between the emitter of the first NPN transistor and the first current source, a second resistance is serially connected between the emitter of the second NPN transistor and the first current source, a third resistance is serially connected between the emitter of the third NPN transistor and the first current source, a fourth resistance is serially connected between the emitter of the fourth NPN transistor and the first current source, a fifth resistance is serially connected between the emitter of the first PNP transistor and the third current source, a sixth resistance is serially connected between the emitter of the second PNP transistor and the third current source, a seventh resistance is serially connected between the emitter of the third PNP transistor and the third current source, and an eighth resistance is serially connected between the emitter of the fourth PNP transistor and the third current source. In this manner, connecting portions of the control signals in the boundaries between the temperature regions can be smoothed, and hence, even though the polygonal lines approximation is adopted, the approximation error at the connecting portion can be made small.

The crystal oscillation device of this invention comprises a first analog signal generating circuit for generating and outputting a predetermined analog signal independent of an ambient temperature; a second analog signal generating circuit for generating and outputting an analog signal dependent upon the ambient temperature; a control circuit for receiving the signal from the first analog signal generating circuit and the signal from the second analog signal generating circuit, and for generating, with a feasible range of the ambient temperature continuously divided into a first temperature region, a second temperature region, a third temperature region, a fourth temperature region and a fifth temperature region in this order along a direction from a low temperature to a high temperature, control signals respectively corresponding to the five temperature regions; and a crystal oscillating circuit for receiving a control signal from the control circuit so as to be controlled to have an oscillation frequency at a predetermined value by the control signal, wherein the control circuit compensates a temperature dependency of the oscillation frequency output by the crystal oscillating circuit by outputting a first control signal whose output value is decreased in proportion to increase of the temperature when the ambient temperature is in the first temperature region; a second control signal whose output value is continuous with the first control signal and is a predetermined value independent of the temperature when the ambient temperature is in the second temperature region; a third control signal whose output value is continuous with the second control signal and is increased in proportion to increase of the temperature when the ambient temperature is in the third temperature region; a fourth control signal whose output value is continuous with the third control signal and is a predetermined value independent of the temperature when the ambient temperature is in the fourth temperature region; and a fifth control signal whose output value is continuous with the fourth control signal and is decreased in proportion to increase of the temperature when the ambient temperature is in the fifth temperature region.

The crystal oscillation device of this invention includes the first analog signal generating circuit for generating and outputting the predetermined analog signal independent of the ambient temperature, the second analog signal generating circuit for generating and outputting the analog signal dependent upon the ambient temperature, and the control circuit for receiving the signal from the first analog signal generating circuit and the signal from the second analog signal generating circuit and for generating the control signals continuously corresponding to the entire regions ranging from the low temperature and the high temperature. Accordingly, even when the ambient temperature is divided into the five regions, the frequency skip is not caused in the vicinity of the boundary between the regions, resulting in attaining good approximation. Moreover, when the ambient temperature is in the first temperature region, the first control signal whose output value is decreased in proportion to the increase of the temperature is output; when the ambient temperature is in the second temperature region, the second control signal having the predetermined value independent of the temperature is output; when the ambient temperature is in the third temperature region, the third control signal whose output value is varied in proportion to the temperature is output; when the ambient temperature is in the fourth temperature region, the fourth control signal having the predetermined value independent of the temperature is output; and when the ambient temperature is in the fifth temperature region, the fifth control signal whose output value is decreased in proportion to the increase of the temperature is output. Accordingly, the temperature function having a positive cubic component can be compensated through the polygonal lines approximation using five straight lines.

Preferably, in the crystal oscillation device, on a graph of the first control signal, the second control signal, the third control signal, the fourth control signal and the fifth control signal for representing a temperature characteristic of a quartz oscillator against the ambient temperature, the first control signal and the fifth control signal are point-symmetrical about a coordinate point on the graph determined by a temperature of an inflection point of an oscillation frequency of the quartz oscillator and a value of the third control signal at the temperature of the inflection point, the second control signal and the fourth control signal are point-symmetrical about the coordinate point, and the third control signal is point-symmetrical about the coordinate point. In this manner, the number of the combinations of the adjustment parameters such as the proportional coefficients and the constants of the lines used in the polygonal lines approximation can be further decreased, resulting in further easing the adjustment of the respective temperature functions to be compensated.

Preferably, the crystal oscillation device further comprises storage means, wherein when the ambient temperature is in the first temperature region, the storage means has a first proportion value for defining a relationship between a proportional coefficient between a temperature used for generating the first control signal and the output value thereof and a cubic coefficient of a temperature characteristic of an oscillation frequency of a quartz oscillator, and the first proportion value is output to the control circuit, when the ambient temperature is in the second temperature region, the storage means has a second proportion value for defining a relationship between a constant between a temperature used for generating the second control signal and the output value thereof and the cubic coefficient, and the second proportion value is output to the control circuit, when the ambient temperature is in the third temperature region, the storage means has a third proportion value for defining a relationship between a proportional coefficient between a temperature used for generating the third control signal and the output value thereof and the cubic coefficient, and the third proportion value is output to the control circuit, when the ambient temperature is in the fourth temperature region, the storage means has a fourth proportion value for defining a relationship between a constant between a temperature used for generating the fourth control signal and the output value thereof and the cubic coefficient, and the fourth proportion value is output to the control circuit, when the ambient temperature is in the fifth temperature region, the storage means has a fifth proportion value for defining a relationship between a proportional coefficient between a temperature used for generating the fifth control signal and the output value thereof and the cubic coefficient, and the fifth proportion value is output to the control circuit, and the storage means stores the first proportion value, the second proportion value, the third proportion value, the fourth proportion value and the fifth proportion value. In this manner, in the adjustment of a cubic temperature coefficient of a quartz oscillator, circuit constants corresponding to the proportional coefficients of the lines and circuit constants corresponding to the constants of the lines can be set in a batch. As a result, fluctuations of a cubic temperature coefficient and a linear temperature coefficient derived from the AT cut angle of a quartz oscillator and fluctuation of the absolute value of the oscillation frequency can be easily and definitely adjusted.

Preferably, in the crystal oscillation device, the control circuit includes a first NPN transistor whose collector is supplied with a supply voltage, whose base is supplied with a first electric signal decreasing in proportion to the ambient temperature and whose emitter is connected with an input of a first current source; a second NPN transistor whose collector is supplied with the supply voltage, whose base is supplied with a second electric signal retaining a predetermined value independent of the ambient temperature and whose emitter is connected with the input of the first current source; a third NPN transistor whose collector is supplied with the supply voltage, whose base is supplied with a third electric signal increasing in proportion to the ambient temperature and whose emitter is connected with the input of the first current source; a fourth NPN transistor whose collector and base are connected with an output of a second current source having a current value a half as large as a current value of the first current source and whose emitter is connected with the input of the first current source; a first PNP transistor whose base is connected with the collector of the fourth NPN transistor, whose emitter is connected with an output of a third current source and whose collector is grounded; a second PNP transistor whose base is supplied with a fourth electric signal retaining a predetermined value independent of the ambient temperature, whose emitter is connected with the output of the third current source and whose collector is grounded; a third PNP transistor whose base is supplied with a fifth electric signal decreasing in proportion to the ambient temperature, whose emitter is connected with the output of the third current source and whose collector is grounded; and a fourth PNP transistor whose emitter is connected with the output of the third current source and whose collector and base are connected with an input of a fourth current source having a current value a half as large as a current value of the third current source, the fourth NPN transistor selects an electric signal having a maximum voltage value among the first electric signal, the second electric signal and the third electric signal and outputs the selected electric signal at the collector thereof as a sixth electric signal, the fourth PNP transistor selects an electric signal having a minimum voltage value among the fourth electric signal, the fifth electric signal and the sixth electric signal and outputs the selected electric signal at the collector thereof as a seventh electric signal, and the control circuit outputs the seventh electric signal as the control signal. In this manner, the control signal can be definitely generated by using the analog signals alone.

Preferably, in the crystal oscillation device, a first resistance is serially connected between the emitter of the first NPN transistor and the first current source, a second resistance is serially connected between the emitter of the second NPN transistor and the first current source, a third resistance is serially connected between the emitter of the third NPN transistor and the first current source, a fourth resistance is serially connected between the emitter of the fourth NPN transistor and the first current source, a fifth resistance is serially connected between the emitter of the first PNP transistor and the third current source, a sixth resistance is serially connected between the emitter of the second PNP transistor and the third current source, a seventh resistance is serially connected between the emitter of the third PNP transistor and the third current source, and an eighth resistance is serially connected between the emitter of the fourth PNP transistor and the third current source. In this manner, connecting portions of the control signals in the boundaries between the temperature regions can be smoothed, and hence, even though the polygonal lines approximation is adopted, the approximation error at the connection portion can be made small.

Preferably, the crystal oscillation device further comprises a RAM circuit for storing parameters, for compensating the temperature dependency of the oscillation frequency of the crystal oscillating circuit, of the first through fifth control signals output by the control circuit, with varying each of the parameters with regard to each of the control signals; and a programmable ROM circuit for storing optimal parameters of the parameters with regard to each of the control signals. In this manner, the control signals can be adjusted with appropriately varying externally input data of the RAM circuit on each of the control signals and an optimal control signal characteristic can be detected. In addition, the detected optimal data can be read, after writing them in a PROM circuit, under actual use conditions, so as to confirm that a control signal in accordance with the ambient temperature can be definitely output.

Preferably, the crystal oscillation device further comprises optimizing means for optimizing the control signals output by the control circuit independently of one another and in accordance with a cubic temperature coefficient, a linear temperature coefficient, a frequency difference from a reference frequency at a temperature of an inflection point and the temperature of the inflection point of the temperature dependency of the oscillation frequency of the crystal oscillating circuit. In this manner, the temperature dependency of the oscillation frequency of each quartz oscillator can be definitely coped with, resulting in improving the approximation characteristic of the temperature compensation.

The method of this invention of adjusting a crystal oscillation device is adopted in a crystal oscillation device including a first analog signal generating circuit for generating and outputting a predetermined analog signal independent of an ambient temperature; a second analog signal generating circuit for generating and outputting an analog signal dependent upon the ambient temperature; a control circuit for receiving the signal from the first analog signal generating circuit and the signal from the second analog signal generating circuit, and for generating, with a feasible range of the ambient temperature continuously divided into a first temperature region, a second temperature region, a third temperature region, a fourth temperature region and a fifth temperature region in this order along a direction from a low temperature to a high temperature, control signals respectively corresponding to the five temperature regions; a crystal oscillating circuit for receiving a control signal from the control circuit so as to be controlled to have an oscillation frequency at a predetermined value by the control signal; a RAM circuit for storing parameters, for compensating a temperature dependency of the oscillation frequency of the crystal oscillating circuit, of the first through fifth control signals output by the control circuit, with varying each of the parameters with regard to each of the control signals; and a programmable ROM circuit for storing optimal parameters of the parameters with regard to each of the control signals, the control circuit outputting a first control signal whose output value is decreased in proportion to increase of the temperature when the ambient temperature is in the first temperature region; a second control signal whose output value is continuous with the first control signal and is a predetermined value independent of the temperature when the ambient temperature is in the second temperature region; a third control signal whose output value is continuous with the second control signal and is increased in proportion to increase of the temperature when the ambient temperature is in the third temperature region; a fourth control signal whose output value is continuous with the third control signal and is a predetermined value independent of the temperature when the ambient temperature is in the fourth temperature region; and a fifth control signal whose output value is continuous with the fourth control signal and is decreased in proportion to increase of the temperature when the ambient temperature is in the fifth temperature region, and the method comprises a peculiar parameter determining step of determining peculiar parameters by allowing the crystal oscillation device to stand at a temperature continuously varying from the first temperature region to the fifth temperature region and by calculating parameters of the control signals respectively corresponding to a cubic temperature coefficient, a linear temperature coefficient, a frequency difference from a reference frequency at a temperature of an inflection point and the temperature of the inflection point of the temperature characteristic of the crystal oscillating circuit so as to make variation of the oscillation frequency output by the crystal oscillating circuit caused by the temperature substantially zero; an initial parameter determining step of determining initial parameters by measuring an initial temperature characteristic of the control signals output by the control circuit and by calculating the parameters of the control signals respectively corresponding to the cubic temperature coefficient, the linear temperature coefficient, the frequency difference from the reference frequency at the temperature of the inflection point and the temperature of the inflection point; and an optimal parameter writing step of obtaining change amounts of the control signals per unit of data corresponding to temperature compensating parameters stored in the RAM circuit by measuring a change amount of the initial temperature characteristic with changing the data corresponding to the temperature compensating parameters, obtaining differences between the initial parameters and the peculiar parameters, determining optimal parameters of the control signals so as to minimize the differences on the basis of the change amounts of the control signals per unit of the data, and writing the optimal parameters in the ROM circuit.

According to the method of this invention of adjusting a crystal oscillation device, each peculiar parameter of the control signal is determined, by allowing the crystal oscillation device to stand at a temperature continuously changing from the first temperature region to the fifth temperature region, so that the variation of the oscillation frequency output by the crystal oscillating circuit caused by the change of the temperature can be substantially zero. After determining each initial parameter of the control signal, by measuring the change amount of the initial temperature characteristic with changing data corresponding to the temperature compensating parameter stored in the RAM circuit, the change amount of the control signal per unit of the data corresponding to the temperature compensating parameter is obtained. After obtaining the difference between the initial parameter and the peculiar parameter, the optimal parameter of the control signal is determined on the basis of the change amount of the control signal per unit of the data so as to make the difference small. Accordingly, the fluctuation of the AT cut angle of a quartz oscillator, offset fluctuation of the oscillation frequency, and the fluctuation of the temperature of an inflection point can be easily and definitely adjusted with regard to each crystal oscillation device. Moreover, since the ambient temperature is divided into five regions and polygonal lines approximation using five lines is adopted, the number of the temperature characteristic compensating parameters can be small. As a result, the circuit scale of the RAM circuit and the ROM circuit can be made small, and hence, the entire device can easily attain compactness.

BRIEF DESCRIPTION OF DRAWINGS

FIG. 10 is a detailed circuit diagram of a control circuit of the temperature compensating crystal oscillation device of the first embodiment;

FIGS. 11(a) through 11(c) show compensation of an oscillation frequency of the voltage control crystal oscillating circuit using a control voltage in the temperature compensating crystal oscillation device of the first embodiment, wherein FIG. 11(a) is a graph for showing the ambient temperature dependency of the oscillation frequency before temperature compensation, FIG. 11(b) is a graph for showing the ambient temperature dependency of the control voltage used for the temperature compensation output by the control circuit and FIG. 11(c) is a graph for showing the ambient temperature dependency of a difference between the oscillation frequency and a reference frequency attained by applying the control voltage to the voltage control crystal oscillating circuit;

FIG. 15 is a detailed circuit diagram of a control circuit of a temperature compensating crystal oscillation device according to a first modification of the first embodiment;

FIGS. 16(a) through 16(c) show compensation of an oscillation frequency of a voltage control crystal oscillating circuit using a control voltage in a temperature compensating crystal oscillation device according to a second modification of the first embodiment, wherein FIG. 16(a) is a graph for showing the ambient temperature dependency of the oscillation frequency before temperature compensation, FIG. 16(b) is a graph for showing the ambient temperature dependency of the control voltage to be used for the temperature compensation output by a control circuit and FIG. 16(c) is a graph for showing the ambient temperature dependency of a difference between the oscillation frequency and a reference frequency attained by applying the control voltage to the voltage control crystal oscillating circuit;

FIGS. 17(a) through 17(c) show compensation of an oscillation frequency of a voltage control crystal oscillating circuit using a control voltage in a temperature compensating crystal oscillation device according to a third modification of the first embodiment, wherein FIG. 17(a) is a graph for showing the ambient temperature dependency of the oscillation frequency before temperature compensation, FIG. 17(b) is a graph for showing the ambient temperature dependency of the control voltage used for the temperature compensation output by a control circuit and FIG. 17(c) is a graph for showing the ambient temperature dependency of a difference between the oscillation frequency and a reference frequency attained by applying the control voltage to the voltage control crystal oscillating circuit;

FIG. 18 is a table for showing comparison in a memory capacity attained by various control circuit systems of the control circuit in the temperature compensating crystal oscillation device of the first embodiment;

FIGS. 26(a) through 26(c) are graphs for illustrating adjustment of an ideal temperature compensating crystal oscillation device, wherein FIG. 26(a) is a graph for showing the ambient temperature dependency of an oscillation frequency before temperature compensation, FIG. 26(b) is a graph for showing the ambient temperature dependency of a control voltage used for the temperature compensation and FIG. 26(c) is a graph for showing the ambient temperature dependency of a difference between the oscillation frequency and a reference frequency after the temperature compensation;

BEST MODE FOR CARRYING OUT THE INVENTION

Embodiment 1

A first embodiment of the invention will now be described with reference to the accompanying drawings.

Figure 1:
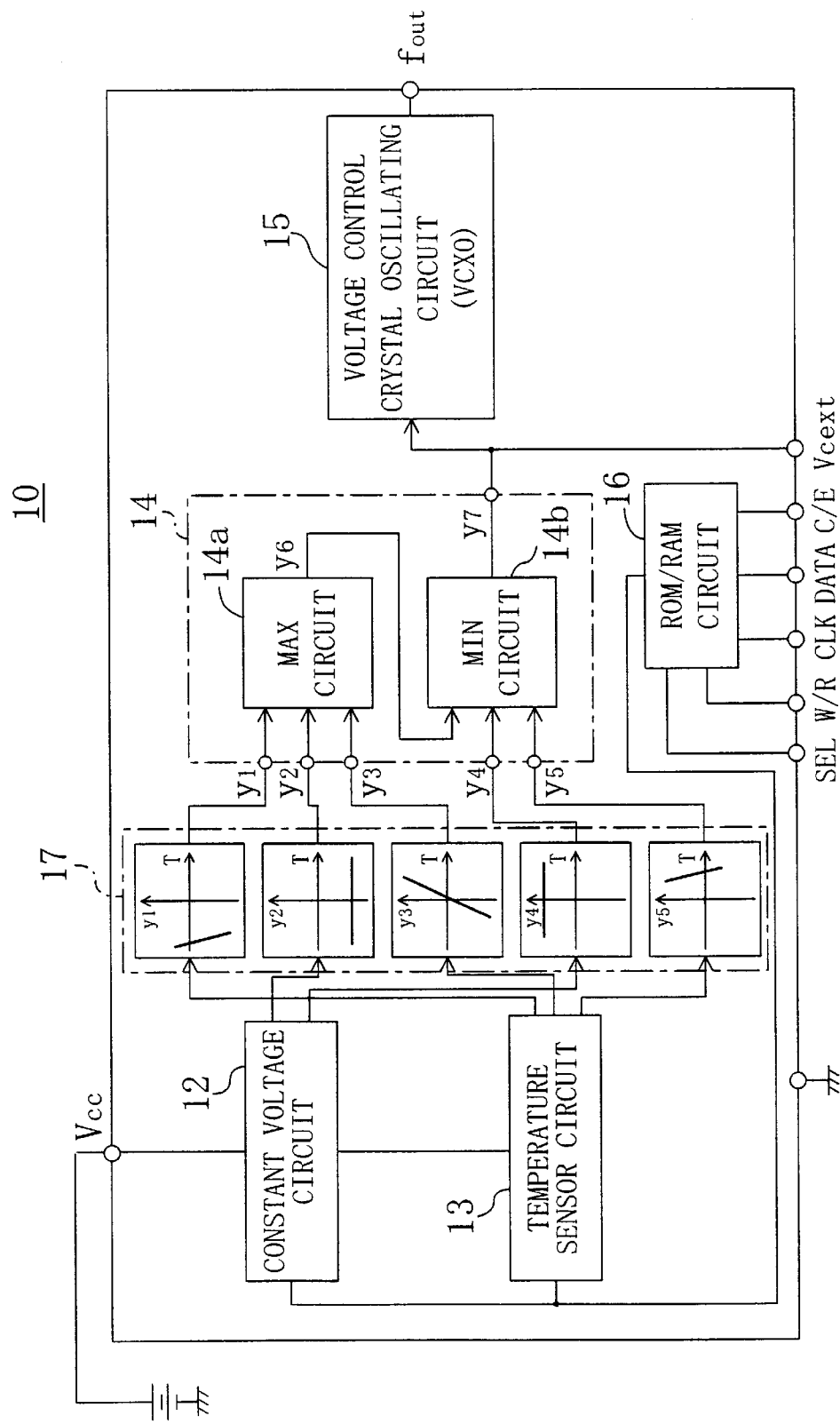
FIG. 1 is a functional block diagram for showing a temperature compensating crystal oscillation device according to a first embodiment of the invention.

FIG. 1 is a functional block diagram of a temperature compensating crystal oscillation device of the first embodiment. The temperature compensating crystal oscillation device (TCXO) 10 shown in FIG. 1 is, for example, an oscillation device for generating a reference clock signal in a portable telephone, and is required to have stable frequency accuracy such that variation of the oscillation frequency can be within a range of ±2.5 ppm or less in the entire temperature range.

As is shown in FIG. 1, the temperature compensating crystal oscillation device 10 includes a constant voltage circuit 12 serving as a first analog signal generating circuit for generating and outputting a predetermined voltage independent of the ambient temperature; a temperature sensor circuit 13 serving as a second analog signal generating circuit for generating and outputting a voltage varied in proportion to the ambient temperature; a third analog signal generating circuit 17 for receiving the constant voltage output by the constant voltage circuit 12 and the voltage in proportion to the temperature output by the temperature sensor circuit 13 and for outputting a voltage which corresponds to a given temperature within each of five temperature regions obtained by dividing the entire range of a feasible ambient temperature into five parts; and a control circuit 14 for receiving the voltage outputted from the third analog signal generating circuit 17 and for generating a control voltage Vc used for polygonal lines approximation of a negative cubic curve by using continuous straight lines for compensating the temperature characteristic of a quartz oscillator in the entire range of the ambient temperature; a voltage control crystal oscillating circuit (hereinafter referred to as the VCXO) 15 whose oscillation frequency is controlled to be a predetermined value by the control voltage Vc received from the control circuit 14; and a ROM/RAM circuit 16 for storing temperature compensating parameters for compensating the temperature characteristic of the control voltage Vc for optimizing the oscillation frequency output by the VCXO 15 in accordance with the control voltage Vc output by the control circuit 14.

In this case, the ambient temperature may be the temperature of VCXO 15 or may be the temperature of the crystal oscillation device 10.

Figure 2:
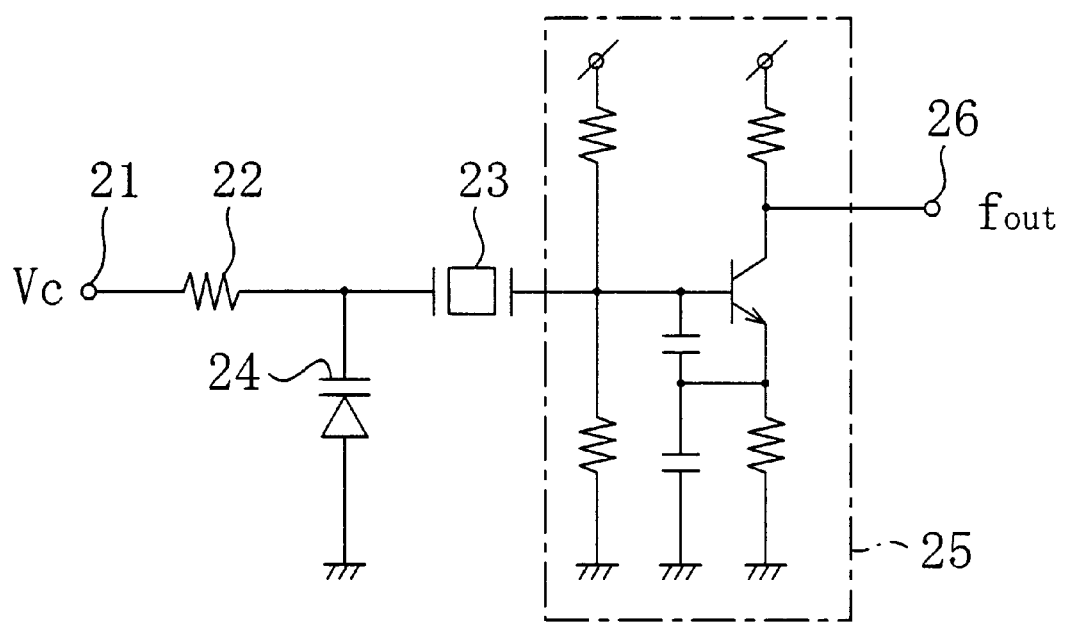
FIG. 2 is a circuit diagram of a voltage control crystal oscillating circuit of the temperature compensating crystal oscillation device of the first embodiment.

FIG. 2 is an exemplified circuit diagram of the VCXO 15 of this embodiment and shows a known circuit configuration. As is shown in FIG. 2, an input terminal 21 for receiving the control voltage Vc is connected with one terminal of a quartz oscillator 23 with a bias resistance 22 interposed therebetween. Between the bias resistance 22 and the quartz oscillator 23 is connected the cathode terminal of a varactor diode 24 with its anode terminal grounded. The oscillation frequency of the quartz oscillator 23 is changed by varying the capacitance of the varactor diode 24 by changing the control voltage Vc. The other terminal of the quartz oscillator 23 is connected with a Colpitts crystal oscillating circuit 25, and the oscillation output fout of the Colpitts crystal oscillating circuit 25 is output to an output terminal 26.

Now, the constant voltage circuit 12 and the temperature sensor circuit 13 of this embodiment are described in detail with reference to the accompanying drawings.

Figure 3:
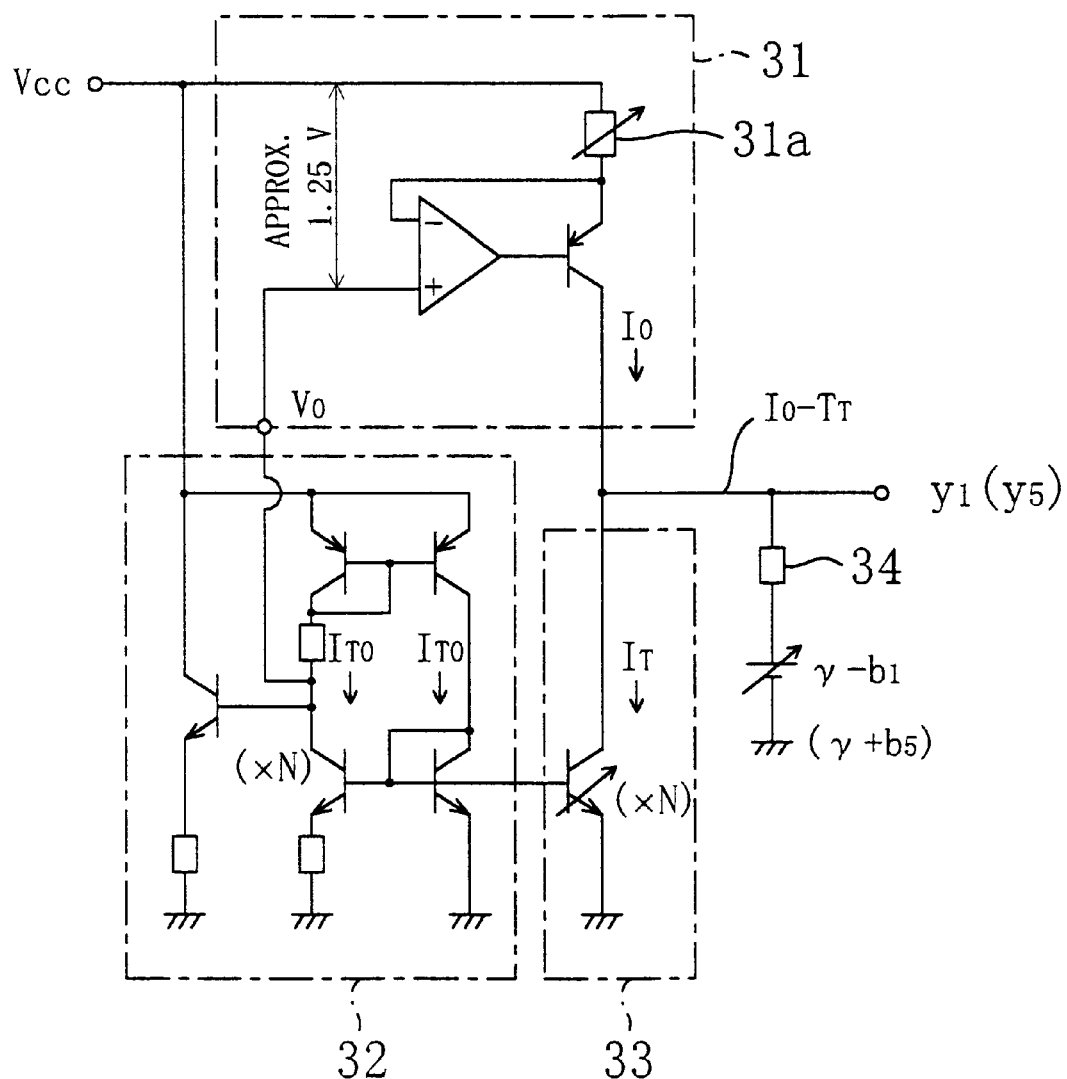
FIG. 3 is a circuit diagram of a constant voltage circuit and a temperature sensor circuit of the temperature compensating crystal oscillation device of the first embodiment.

FIG. 3 is a circuit diagram for showing the configuration of a monotone decrease voltage generating circuit 30, including the constant voltage circuit 12 and the temperature sensor circuit 13 of FIG. 1, for generating and outputting a first control voltage $y_1$ or a fifth control voltage $y_5$ which decreases in proportion to increase of the ambient temperature $T_a$. As is shown in FIG. 3, the monotone decrease voltage generating circuit 30 includes a constant voltage circuit 31, and a bandgap reference circuit 32 and a current mirror circuit 33 working as the temperature sensor circuit. A reference voltage V0 of approximately 1.25 V independent of the ambient temperature $T_a$ is generated in the bandgap reference circuit 32, and a constant current $I_0$ is generated on the basis of the reference voltage V0 in the constant voltage circuit 31.

Also, a current $I_{T0}$ dependent upon the ambient temperature $T_a$ is generated in the bandgap reference circuit 32, and a current $I_T$ in proportion to the ambient temperature $T_a$ is generated in the current mirror circuit 33, so that a difference current $I_0-I_T$ between the constant current $I_0$ and the current $I_T$ in proportion to the ambient temperature $T_a$ can be taken out at a node between the constant voltage circuit 31 and the current mirror circuit 33. The difference current $I_0-I_T$ is subjected to current/voltage conversion by using a resistance 34, thereby generating the first control voltage $y_1$ or the fifth control voltage $y_5$ which decreases in accordance with the increase of the ambient temperature $T_a$. At this point, the absolute value of the first control voltage $y_1$ or the fifth control voltage $y_5$ is set by adjusting a resistance value of a resistance 31a supplied with a supply voltage Vcc in the constant voltage circuit 31.

Figure 4:
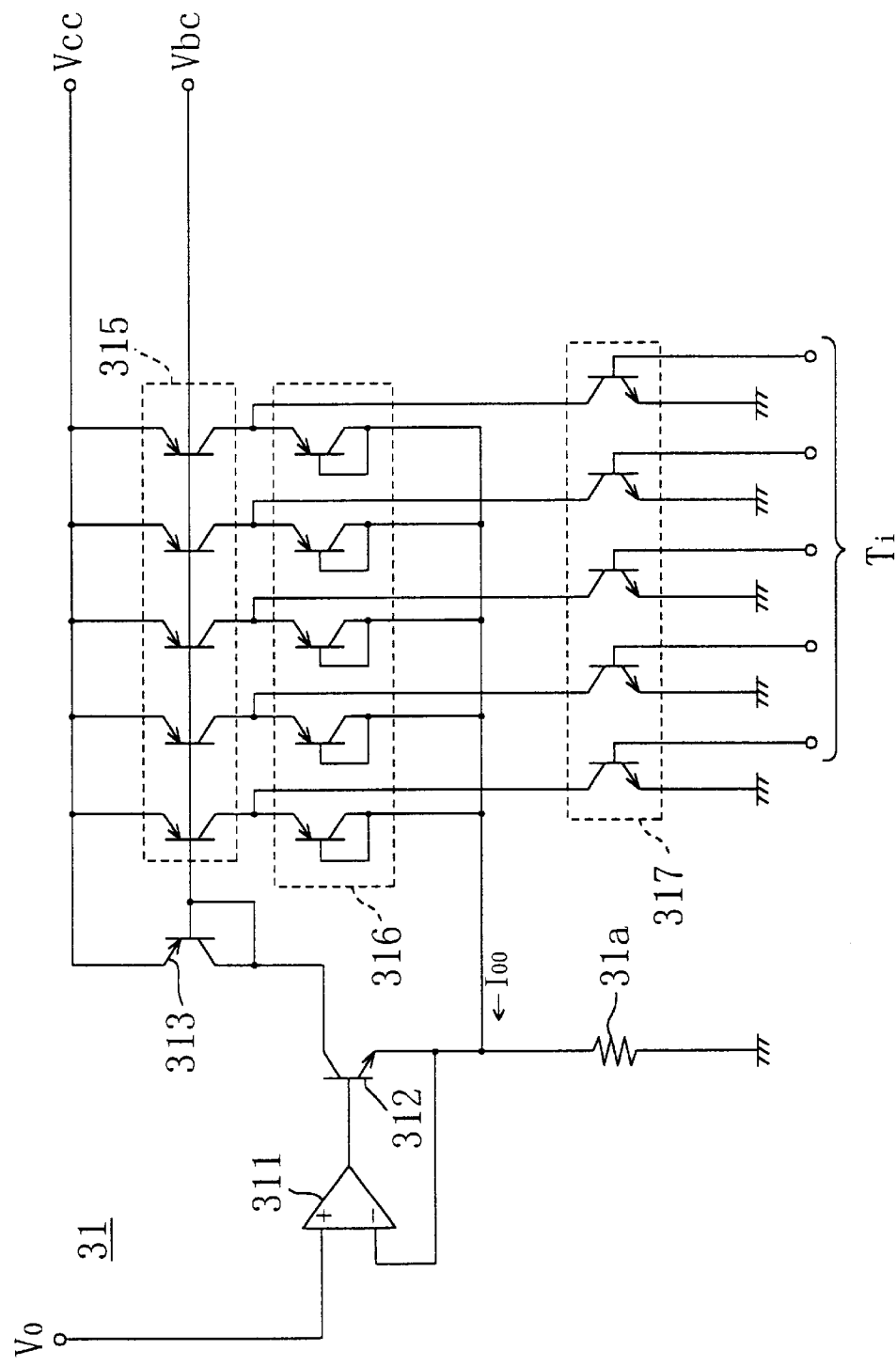
FIG. 4 is a detailed circuit diagram of the constant voltage circuit of the temperature compensating crystal oscillation device of the first embodiment.

FIG. 4 is a circuit diagram for showing another configuration of the constant voltage circuit 31 shown in FIG. 3. As is shown in FIG. 4, the constant voltage circuit 31 includes an operational amplifier 311 supplied, at its positive terminal, with the reference voltage V0 independent of the ambient temperature $T_a$ output by the bandgap reference circuit 32; an NPN transistor 312 whose base is supplied with the output of the operational amplifier 311 and whose emitter is connected with a negative terminal of the operational amplifier 311 and the resistance 31a; a PNP transistor 313 whose collector is connected with the collector of the NPN transistor 312; and the resistance 31a connected with the emitter of the NPN transistor 312 at its one end and grounded at the other end. A current $I_{00}$ flowing from PNP transistors 315 through PNP transistors 316 flows into the resistance 31a, so as to generate the reference voltage V0 independent of the ambient temperature $T_a$, namely, a voltage Vbc at the base of the PNP transistor 313 makes a contribution to the generation of the constant current $I_0$ independent of the ambient temperature $T_a$.

Also, the constant voltage circuit 31 is connected with the ROM/RAM circuit 16 of FIG. 1, so that plural temperature compensating parameters can be adjusted. For example, in order to copewith change of a 5-bit signal Ti for defining an inflection point temperature input from the ROM/RAM circuit 16, the constant voltage circuit 31 includes five PNP transistors 315 supplied with the base voltage Vbc at their shared base, five PNP transistors 316 for feeding back a current to the emitter of the NPN transistor 312 and five switching NPN transistors 317 each of which is closed/opened in accordance with each bit of the 5-bit signal Ti.

Figure 5:
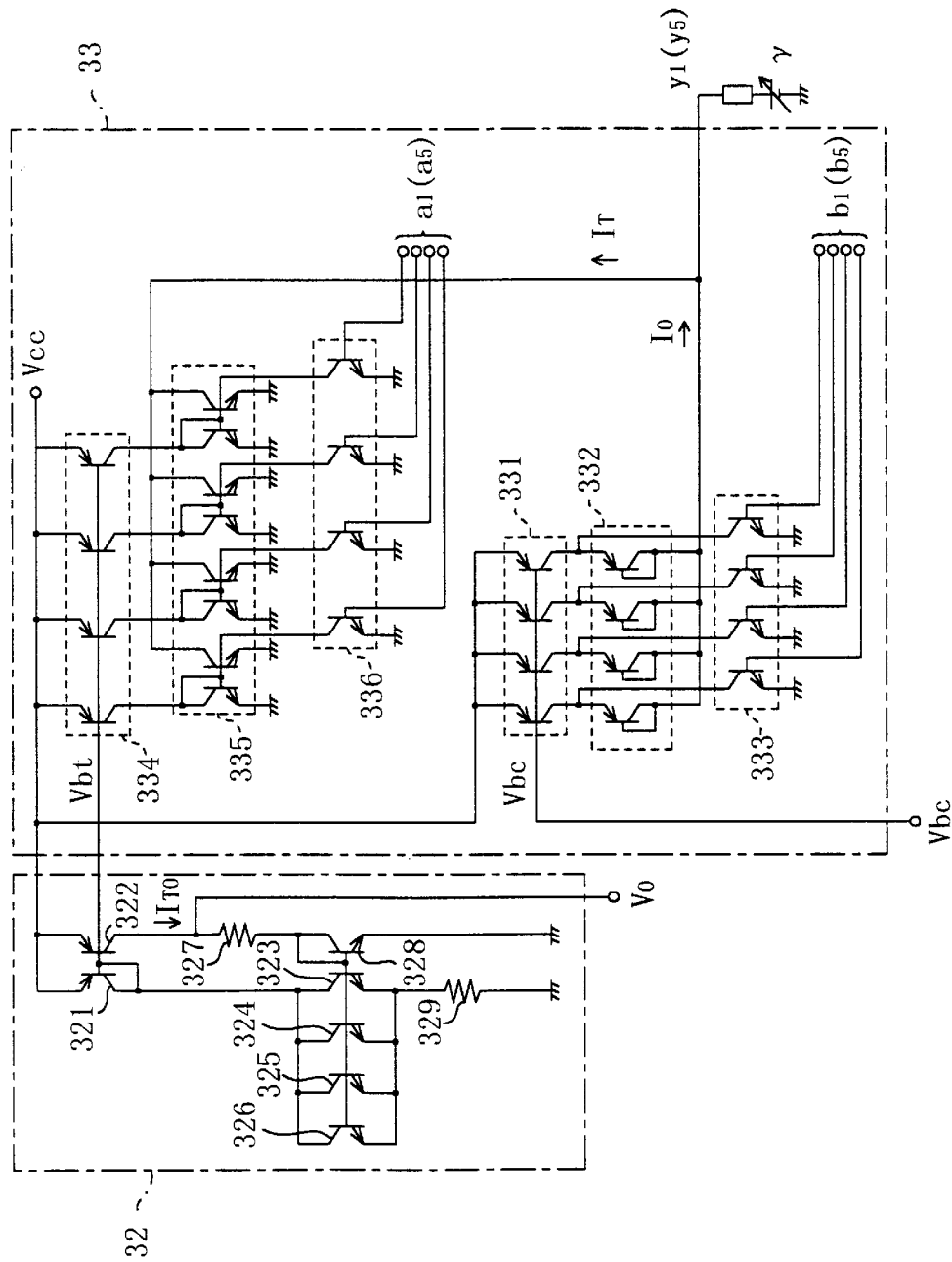
FIG. 5 is a detailed circuit diagram of the temperature sensor circuit of the temperature compensating crystal oscillation device of the first embodiment.

FIG. 5 shows another circuit configuration of the bandgap reference circuit 32 and the current mirror circuit 33 shown in FIG. 3. As is shown in FIG. 5, the bandgap reference circuit 32 includes a pair of PNP transistors 321 and 322 connected with each other at their bases; four NPN transistors 323, 324, 325 and 326 connected in parallel with the collector and the base of the PNP transistor 321 and connected with each other at their bases; an NPN transistor 328 sharing the base with the NPN transistors 323, 324, 325 and 326 and connected with the collector of the PNP transistor 322 through a resistance 327; and a resistance 329 connected with the emitter shared by the four NPN transistors 323, 324, 325 and 326 at its one end and grounded at the other end. The base voltage Vbt of the pair of PNP transistors 321 and 322 is a voltage used for transferring a current increasing in proportion to the ambient temperature $T_a$.

Furthermore, the current mirror circuit 33 of FIG. 5 is connected with the ROM/RAM circuit 16 of FIG. 1, so that the temperature compensating parameters can be adjusted. For example, in order to cope with change of a 4-bit signal $b_1$ corresponding to the constant term of the first control voltage $y_1$ or a 4-bit signal $b_5$ corresponding to the constant term of the fifth control voltage $y_5$ input from the ROM/RAM circuit 16, the current mirror circuit 33 includes four PNP transistors 331 supplied with the base voltage Vbc from the constant voltage circuit 31 at their shared base, four PNP transistors 332 for transferring the constant current $I_0$, and four switching NPN transistors 333 respectively connected in parallel with the four PNP transistors 332 and closed/opened in accordance with the 4-bit signal $b_1$ or $b_5$. Furthermore, the current mirror circuit 33 includes four PNP transistors 334 supplied, at their shared base, with the base voltage Vbt dependent upon the temperature supplied from the bandgap reference circuit 32; eight NPN transistors 335 constituting four current mirror circuits respectively connected in parallel with the four PNP transistors 334 for absorbing a current through mirror inversion; and four switching NPN transistors 336 connected in parallel with the four groups of NPN transistors 335 and closed/opened in accordance with a 4-bit signal $a_1$ corresponding to the proportional coefficient of the first control voltage $y_1$ or a 4-bit signal $a_5$ corresponding to the proportional coefficient of the fifth control voltage $y_5$. When, among the four switching NPN transistors 333, the number of transistors in an on-state is changed in accordance with the 4-bit signal $b_1$ or $b_5$, the constant current $I_0$ is increased/decreased, and when, among the four switching NPN transistors 336, the number of transistors in an on-state is changed in accordance with the 4-bit signal $a_1$ or $a_5$, the current $I_T$ dependent upon the temperature is increased/decreased. As a result, the output current $I_0-I_T$ for determining the first control voltage $y_1$ or the fifth control voltage $y_5$ is increased/decreased.

Figure 6:
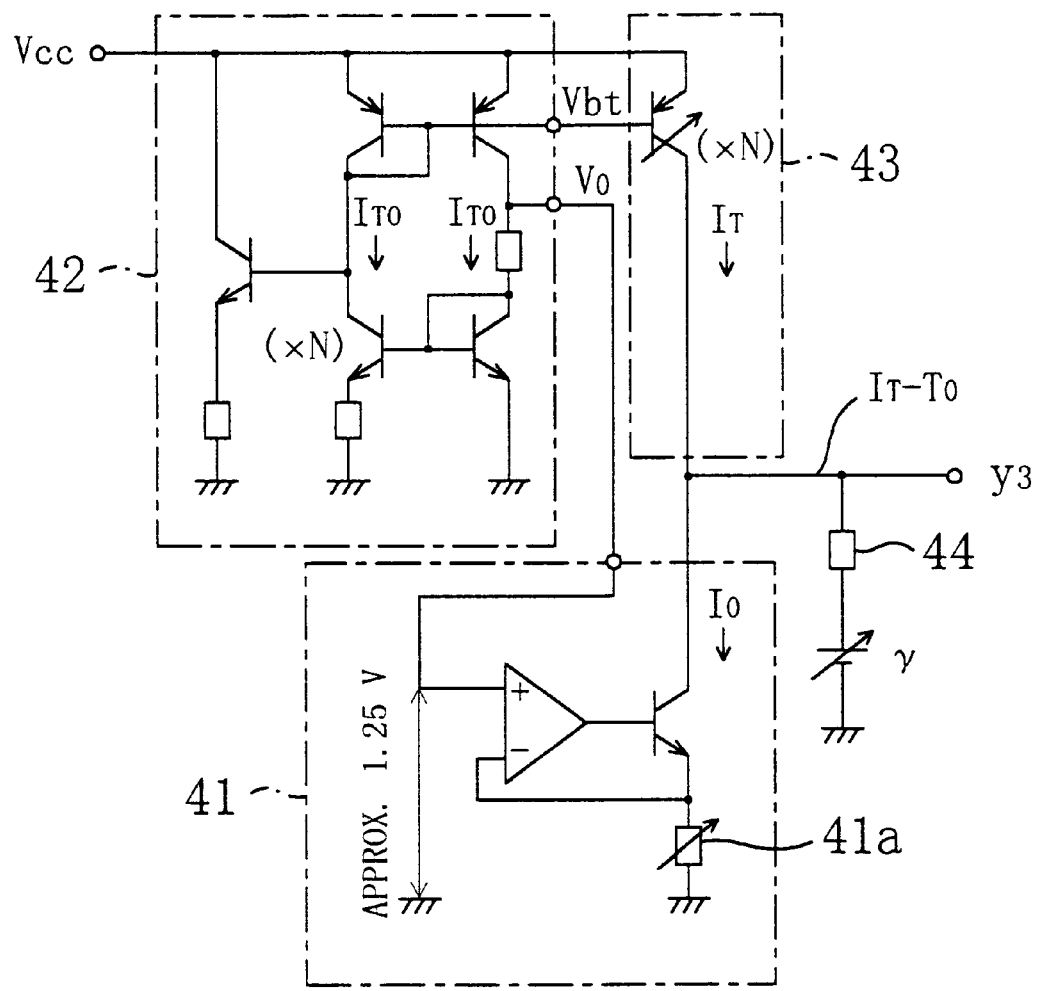
FIG. 6 is another circuit diagram of the constant voltage circuit and the temperature sensor circuit of the temperature compensating crystal oscillation device of the first embodiment.

FIG. 6 shows the detailed circuit configuration of a monotone increase voltage generating circuit 40, including the constant voltage circuit 12 and the temperature sensor circuit 13 of FIG. 1, for generating and outputting a third control voltage $y_3$ which increases in accordance with the increase of the ambient temperature $T_a$. As is shown in FIG. 6, the monotone increase voltage generating circuit 40 includes a constant voltage circuit 41, and a bandgap reference circuit 42 and a current mirror circuit 43 serving as the temperature sensor circuit. A reference voltage V0 of approximately 1.25 V independent of the ambient temperature $T_a$ is generated in the bandgap reference circuit 42, and a constant current $I_0$ is generated on the basis of the reference voltage V0 in the constant voltage circuit 41.

Also, a current $I_{T0}$ dependent upon the ambient temperature $T_a$ is generated in the bandgap reference circuit 42, and a current $I_T$ in proportion to the ambient temperature $T_a$ is generated in the current mirror circuit 43, so that a difference current $I_T-I_0$ between the current $I_T$ in proportion to the ambient temperature $T_a$ and the constant current $I_0$ can be taken out at a node between the constant voltage circuit 41 and the current mirror circuit 43. The difference current $I_T-I_0$ is subjected to the current/voltage conversion by using a resistance 44, thereby generating the third control voltage $y_3$ in proportion to the ambient temperature $T_a$. At this point, a difference at room temperature between the third control voltage $y_3$ and a voltage for attaining a reference frequency at the inflection point temperature is set by adjusting the resistance value of a resistance 41a of the constant voltage circuit 41.

Figure 7:
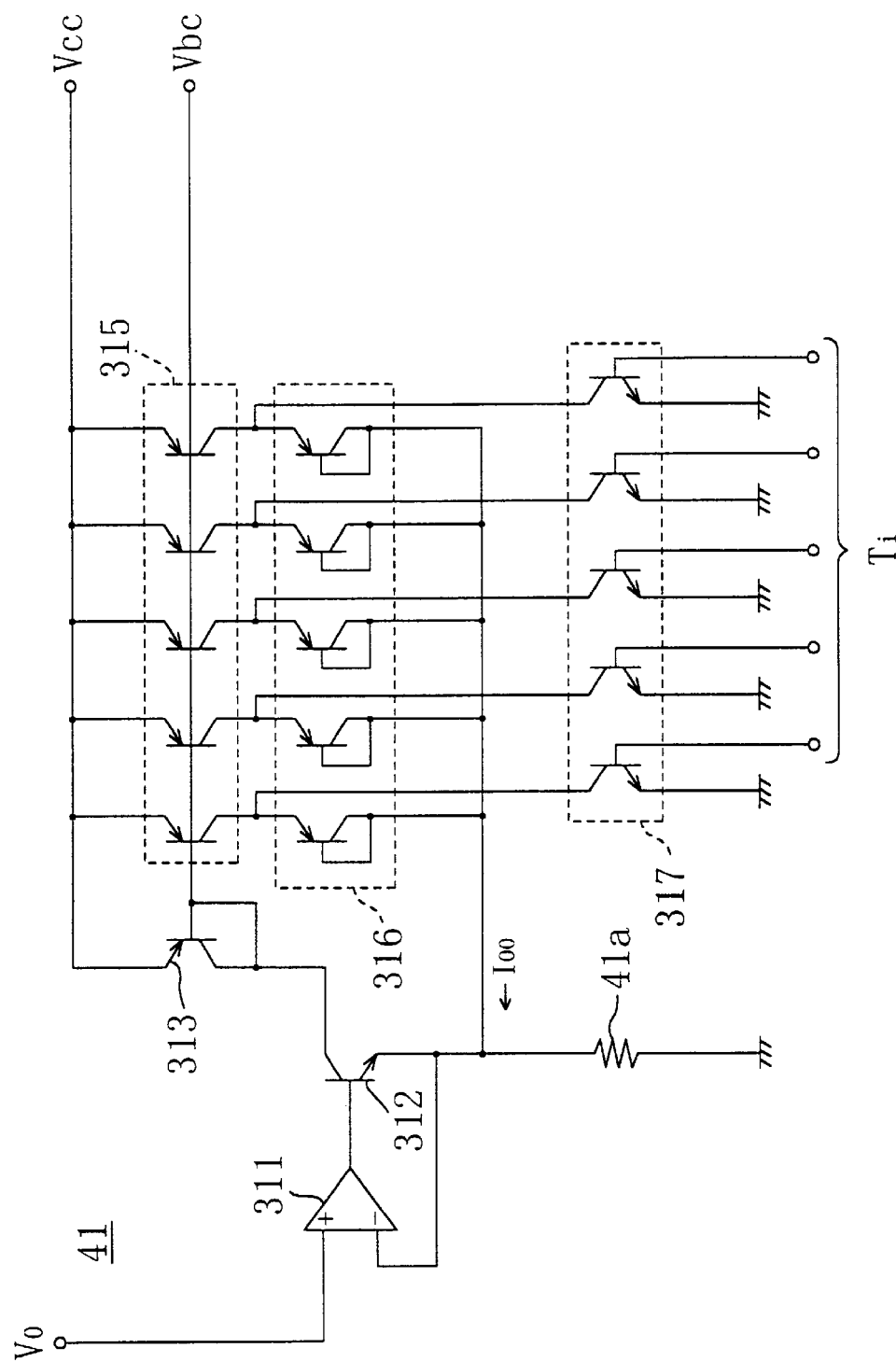
FIG. 7 is another detailed circuit diagram of the constant voltage circuit of the temperature compensating crystal oscillation device of the first embodiment.

FIG. 7 shows the detailed circuit configuration of the constant voltage circuit 41. In FIG. 7, like reference numerals are used to refer to like elements shown in FIG. 4 and the description is omitted. In this case, it goes without saying that the constant voltage circuit 41 has a different circuit constant from the constant voltage circuit 31.

Figure 8:
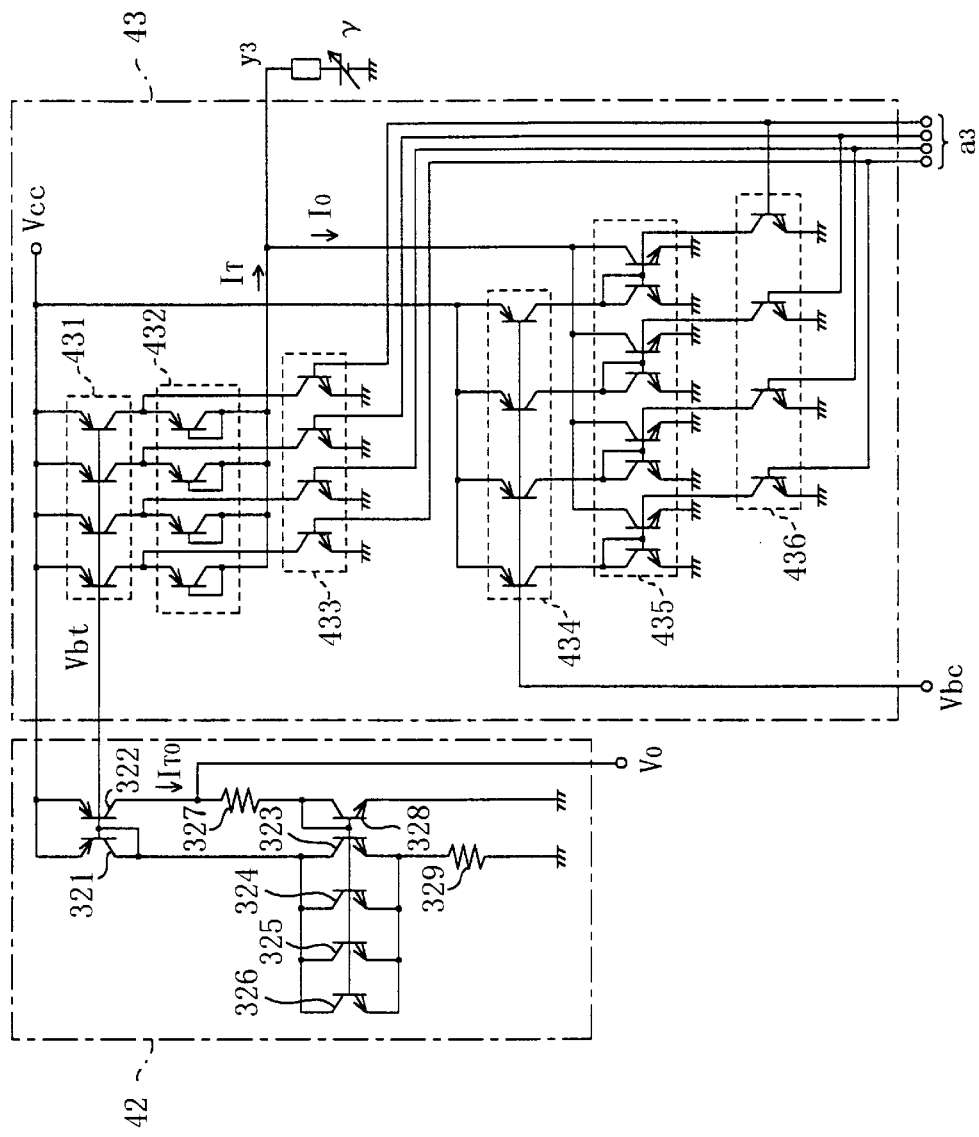
FIG. 8 is another detailed circuit diagram of the temperature sensor circuit of the temperature compensating crystal oscillation device of the first embodiment.

FIG. 8 shows the detailed circuit configuration of the bandgap reference circuit 42 and the current mirror circuit 43. The bandgap reference circuit 42 of FIG. 8 has the same configuration as the bandgap reference circuit 32 of FIG. 5, and hence, the description is omitted with like reference numerals used to refer to like elements shown in FIG. 5. In FIG. 8, the current mirror circuit 43 is connected with the ROM/RAM circuit 16 of FIG. 1, so that the temperature compensating parameters can be adjusted. For example, in order to cope with change of a 4-bit signal $a_3$ corresponding to the proportional coefficient of the third control voltage $y_3$ input from the ROM/RAM circuit 16, the current mirror circuit 43 includes four PNP transistors 431 supplied, at their shared base, with the base voltage Vbt dependent upon the temperature input from the band gap reference circuit 42, four PNP transistors 432 for transferring the current $I_T$ in proportion to the ambient temperature $T_a$, and four switching NPN transistors 433 respectively connected in parallel with the four PNP transistors 432 and closed/opened in accordance with the 4-bit signal $a_3$. Moreover, the current mirror circuit 43 includes four PNP transistors 434 supplied, at their shared base, with the base voltage Vbc input from the constant voltage circuit 41, eight NPN transistors 435 constituting four current mirror circuits respectively connected in parallel with the four PNP transistors 434 for absorbing the current through the mirror inversion, and four switching NPN transistors 436 respectively connected in parallel with the four groups of NPN transistors 435 and closed/opened in accordance with the 4-bit signal $a_3$. When, the number of transistors in an on-state among the four switching NPN transistors 433 and the number of transistors in an on-state among the four switching NPN transistors 436 are changed in accordance with the 4-bit signal $a_3$, the output current $I_T$–$I_0$ for determining the third control voltage $y_3$ is increased/decreased.

Figure 9:
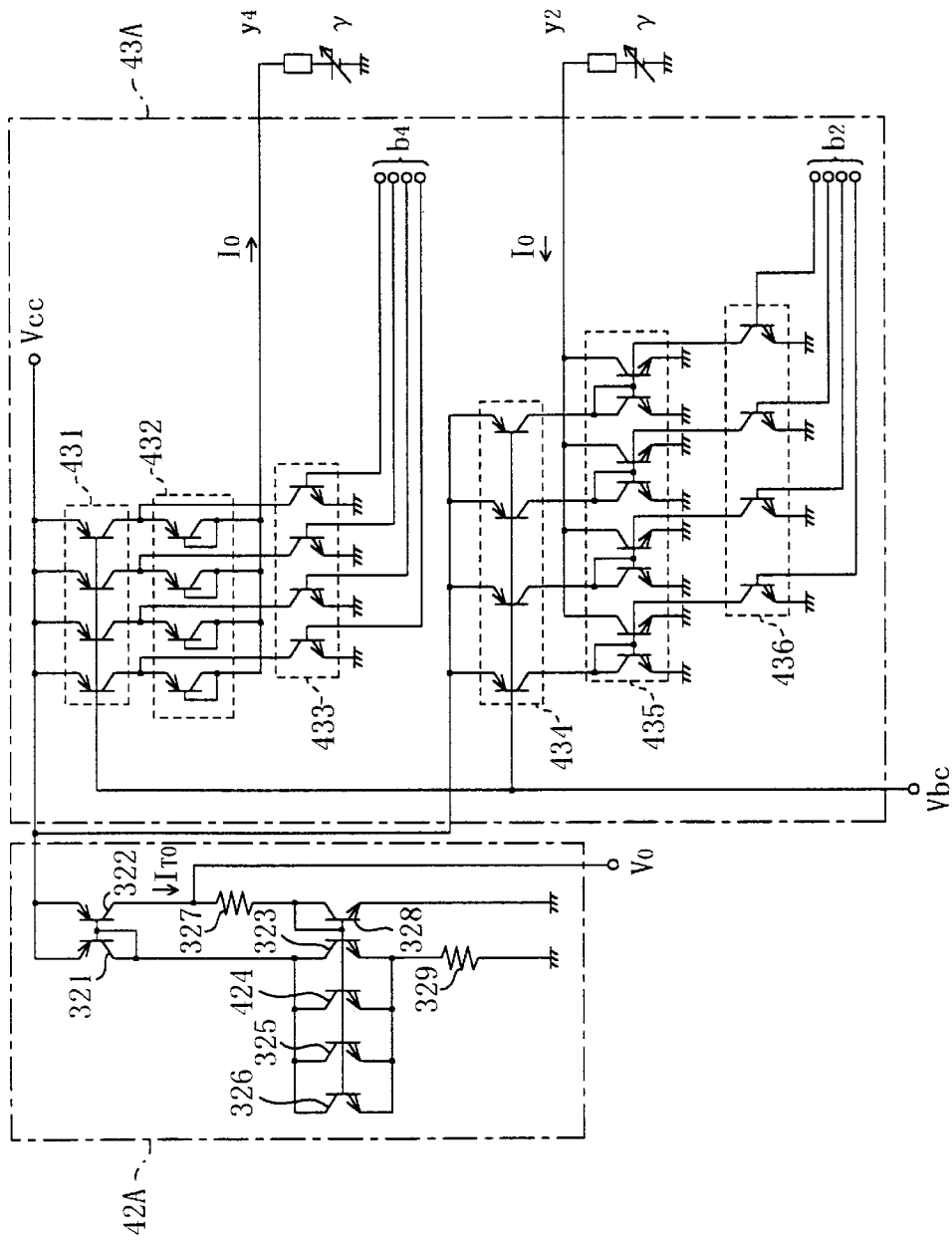
FIG. 9 is another detailed circuit diagram of the temperature sensor circuit of the temperature compensating crystal oscillation device of the first embodiment.

FIG. 9 shows a part of the circuit configuration of a constant voltage generating circuit, including the constant voltage circuit 12 and the temperature sensor circuit 13 of FIG. 1, for generating and outputting a second control voltage $y_2$ and a fourth control voltage $y_4$ independent of the ambient temperature. This constant voltage generating circuit includes a constant voltage circuit (not shown) and a bandgap reference circuit 42A and a current mirror circuit 43A serving as the temperature sensor circuit. The constant voltage circuit has a configuration equivalent to the constant voltage circuit 41 of FIG. 7. The bandgap reference circuit 42A of FIG. 9 has the same configuration as the bandgap reference circuit 42 of FIG. 8, and hence, the description is omitted with like reference numerals used to refer to like elements shown in FIG. 8.

Also, the current mirror circuit 43A of FIG. 9 is connected with the ROM/RAM circuit 16 of FIG. 1, so that the temperature compensating parameters can be adjusted. For example, in order to cope with change of a 4-bit signal $b_4$ corresponding to the constant term of the fourth control voltage $y_4$ input from the ROM/RAM circuit 16, the current mirror circuit 43A includes four PNP transistors 431 supplied, at their shared base, with the base voltage Vbc input from the constant voltage circuit, four PNP transistors 432 for transferring the constant current $I_0$, and four switching NPN transistors 433 respectively connected in parallel with the PNP transistors 432 and closed/opened in accordance with the 4-bit signal $b_4$. The current mirror circuit 43A further includes four PNP transistors 434 supplied, at their shared base, with the base voltage Vbc input from the constant voltage circuit, eight NPN transistors 435 constituting four current mirror circuits respectively connected in parallel with the four PNP transistors 434 for absorbing the current through the mirror inversion, and four switching NPN transistors 436 respectively connected in parallel with the four groups of NPN transistors 435 and closed/opened in accordance with a 4-bit signal $b_2$. When the number of transistors in an on-state among the four switching NPN transistors 433 is changed in accordance with the 4-bit signal $b_4$, the current for determining the fourth control voltage $y_4$ is increased/decreased, and when the number of transistors in an on-state among the four switching NPN transistors 436 is changed in accordance with the 4-bit signal $b_2$, the current for determining the second control voltage $y_2$ is increased/decreased.

Next, the control circuit 14 of this embodiment will be described with reference to the accompanying drawings.

FIG. 10 shows the detailed circuit configuration of the control circuit 14 of FIG. 1. As is shown in FIG. 10, the control circuit 14 for generating the control voltage Vc used for the temperature compensation of the VCXO 15 includes a MAX circuit 14a for receiving the first control voltage $y_1$, the second control voltage $y_2$ and the third control voltage $y_3$ generated by the constant voltage circuit 12 and the temperature sensor circuit 13 of FIG. 1 and for outputting the maximum voltage among these control voltages as a sixth control voltage $y_6$; and a MIN circuit 14b for receiving the fourth control voltage $y_4$ and the fifth control voltage $y_5$ generated by the constant voltage circuit 12 and the temperature sensor circuit 13 of FIG. 1 and the sixth control voltage $y_6$ output by the MAX circuit 14a and for outputting the minimum voltage among these control voltages as a seventh control voltage $y_7$. The seventh control voltage $y_7$ works as the control voltage Vc for the temperature compensation.

The MAX circuit 14a includes a first NPN transistor Q1 whose collector is supplied with a supply voltage Vcc, whose base is supplied with the first control voltage $y_1$ and whose emitter is connected with the input of a first constant current source $I_1$; a second NPN transistor Q2 whose collector is supplied with the supply voltage Vcc, whose base is supplied with the second control voltage $y_2$ and whose emitter is connected with the input of the first constant current source $I_1$; a third NPN transistor Q3 whose collector is supplied with the supply voltage Vcc, whose base is supplied with the third control voltage $y_3$ and whose emitter is connected with the input of the first constant current source $I_1$; and a fourth NPN transistor Q7 whose collector and base are connected with the output of a second constant current source $I_2$ for supplying a current with a value a half as large as that of the first constant current source $I_1$ and whose emitter is connected with the input of the first constant current source $I_1$, for outputting, at its collector, the maximum voltage among the first control voltage $y_1$, the second control voltage $y_2$ and the third control voltage $y_3$ as the sixth control voltage $y_6$.

The MIN circuit 14b includes a first PNP transistor Q6 whose base is connected with the collector of the fourth NPN transistor Q7, whose emitter is connected with the output of a third constant current source $I_3$ and whose collector is grounded; a second PNP transistor Q4 whose base is supplied with the fourth control voltage $y_4$, whose emitter is connected with the output of the third constant current source $I_3$ and whose collector is grounded; a third PNP transistor Q5 whose base is supplied with the fifth control voltage $y_5$, whose emitter is connected with the output of the third constant current source $I_3$ and whose collector is grounded; and a fourth PNP transistor Q8 whose emitter is connected with the output of the third constant current source $I_3$ and whose collector and base are connected with the input of a fourth constant current source $I_4$ for supplying a current with a value a half as large as that of the third constant current source $I_3$, for outputting, at its collector, the minimum voltage among the fourth control voltage $y_4$, the fifth control voltage $y_5$ and the sixth control voltage $y_6$ as the seventh control voltage $y_7$.

The MAX circuit 14a and the MIN circuit 14b having the aforementioned configurations are operated as follows:

In the MAX circuit 14a, the first NPN transistor Q1, the second NPN transistor Q2 and the third NPN transistor Q3 mutually share the collector and the emitter, the current from the second constant current source $I_2$ flows through the fourth NPN transistor Q7 to the first constant current source $I_1$ and the current value $I_2$ is set at $I_1/2$. Therefore, the remaining current value $I_1/2$ of the current value $I_1$ flows to one transistor supplied with the largest voltage at the base thereof among the first NPN transistor Q1, the second NPN transistor Q2 and the third NPN transistor Q3. As a result, a potential difference between the base and the emitter of the fourth NPN transistor Q7 is equal to a potential difference between the base and the emitter of that one transistor supplied with the largest voltage among the first NPN transistor Q1, the second NPN transistor Q2 and the third NPN transistor Q3. Accordingly, a voltage shared by the collector and the base of the fourth NPN transistor Q7 is equal to the maximum voltage among the first control voltage $y_1$, the second control voltage $y_2$ and the third control voltage $y_3$.

Also, in the MIN circuit 14b, the first PNP transistor Q6, the second PNP transistor Q4 and the third PNP transistor Q5 mutually share the emitter, and the collectors of these transistors are all grounded. Therefore, a voltage shared by the collector and the base of the fourth PNP transistor Q8 is equal to the minimum voltage among those supplied to the first PNP transistor Q6, the second PNP transistor Q4 and the third PNP transistor Q5.

In this manner, according to the control circuit 14 of this embodiment for generating the control voltage Vc for the temperature compensation of the VCXO 15, the polygonal lines approximation of the temperature compensation characteristic can be performed by outputting a group of five continuously and linearly changing control voltages as the seventh control voltage $y_7$ corresponding to the control voltage Vc by using plural simple bipolar circuits.

Furthermore, since all of the constant voltage circuit 12, the temperature sensor circuit 13 and the control circuit 14 together working as a function generator for generating the control voltage Vc for the temperature compensation include analog circuits alone, there is no possibility of occurrence of a quantum noise in principle, and hence, frequency skip can be prevented from occurring at the connecting portion between polygonal lines. In addition, since there is no need to provide the function generator with a clock generator, a clock noise can also be avoided.

Although the output of the MAX circuit 14a is received by the MIN circuit 14b in FIG. 10, the order of the connection of the MAX circuit 14a and the MIN circuit 14b can be reversed. Specifically, in that case, the third control voltage $y_3$, the fourth control voltage $y_4$ and the fifth control voltage $y_5$ are input to the MIN circuit 14b, whose output is used as the sixth control voltage $y_6$. The sixth control voltage $y_6$, the first control voltage $y_1$ and the second control voltage $y_2$ are input to the MAX circuit 14a, whose output is used as the seventh control voltage $y_7$, namely, the output of the control circuit 14.

Now, the control voltage Vc used for the temperature compensation generated by the constant voltage circuit 12, the temperature sensor circuit 13 and the control circuit 14 of FIG. 1 together working as the function generator will be described by using graphs and formulas.

Figure 11A:
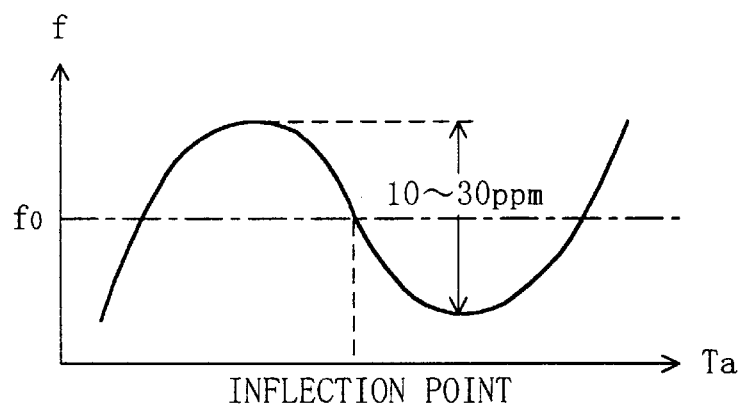
Figure 11B:
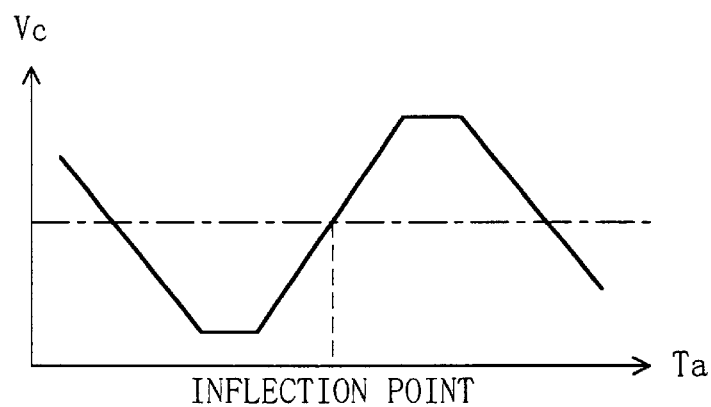
Figure 11C:
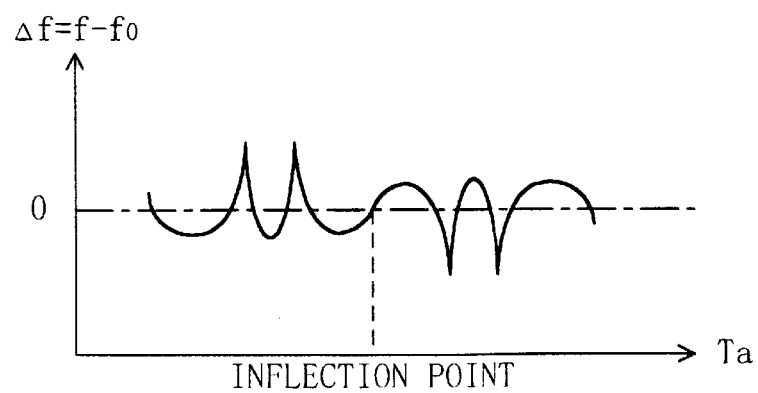

FIGS. 11(a) through 11(c) show the compensation of the oscillation frequency f of the VCXO 15 using the temperature compensating control voltage Vc, and FIG. 11(a) shows the dependency on the ambient temperature $T_a$ of the oscillation frequency f output by the VCXO 15 without the temperature compensation, wherein $f_0$ indicates a reference frequency determined by a specification of, for example, a portable telephone. FIG. 11(b) shows the dependency on the ambient temperature $T_a$ of the control voltage Vc (i.e., the seventh control voltage $y_7$) for the temperature compensation output by the control circuit 14, and FIG. 11(c) shows the temperature dependency of a difference $\Delta f$ between the oscillation frequency f of the VCXO 15 and the reference frequency $f_0$ attained by applying the control voltage Vc to the VCXO 15.

Figure 12:
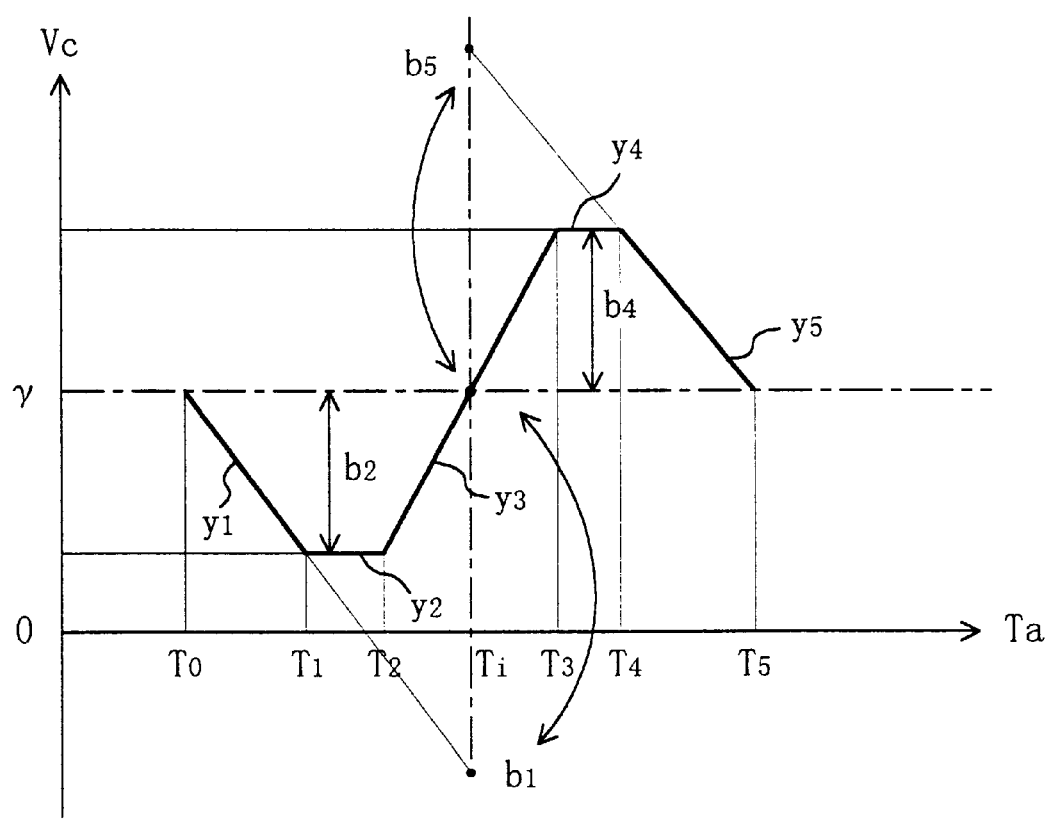
FIG. 12 is a graph for showing the ambient temperature dependency of the control voltage to be used for the temperature compensation using polygonal lines approximation in the temperature compensating crystal oscillation device of the first embodiment.

FIG. 12 shows the details of the graph of FIG. 11(b), and shows a group of polygonal lines respectively corresponding to the first control voltage $y_1$ in a first temperature region ($T_0 \leq T_a < T_1$), the second control voltage $y_2$ in a second temperature region ($T_1 \leq T_a < T_2$), the third control voltage $y_3$ in a third temperature region ($T_2 \leq T_a < T_3$), the fourth control voltage $y_4$ in a fourth temperature region ($T_3 \leq T_a < T_4$), and the fifth control voltage $y_5$ in a fifth temperature region ($T_4 \leq T_a < T_5$). As is shown in FIG. 12, the X-axis indicates the ambient temperature $T_a$, the Y-axis indicates the control voltage Vc, a center temperature of the control voltage Vc is indicated as $T_i$, and a voltage difference from a voltage for attaining the reference frequency at the center temperature $T_i$ is indicated as $\gamma$.

The linear functional formulas of $y_1$ through $y_5$ are:

$$y_1 = -a_1(T_a - T_i) - b_1 + \gamma \tag{1}$$

(whereas $T_0 \leq T_a < T_1$, $a_1 > 0$, and $b_1 > 0$)

$$y_2 = -b_2 + \gamma \tag{2}$$

(whereas $T_1 \leq T_a < T_2$ and $b_2 > 0$)

$$y_3 = a_3(T_a - T_i) + \gamma \tag{3}$$

(whereas $T_2 \leq T_a < T_3$ and $a_3 > 0$)

$$y_4 = b_4 + \gamma \tag{4}$$

(whereas $T_3 \leq T_a < T_4$ and $b_4 > 0$)

$$y_5 = -a_5(T_a - T_i) + b_5 + \gamma \tag{5}$$

(whereas $T_4 \leq T_a \leq T_5$, $a_5 > 0$, $b_5 > 0$, $a_1 \approx a_5$, $b_2 \approx b_4$ and $b_1 \approx b_5$)

At this point, the center temperature $T_i$ corresponds to the inflection point temperature of a quartz oscillator, and is approximately 25° C. in a general quartz oscillator.

Now, the relationship between the sixth control voltage $y_6$ and the first through third control voltages $y_1$, $y_2$ and $y_3$ and the relationship between the seventh control voltage $y_7$, namely, the control voltage Vc, and the fourth through sixth control voltages $y_4$, $y_3$ and $y_6$ will be described on the basis of the MAX circuit 14a and the MIN circuit 14b of FIG. 10.

In the MAX circuit 14a, when the emitter currents of the first NPN transistor Q1, the second NPN transistor Q2, the third NPN transistor Q3 and the fourth NPN transistor Q7 are indicated as $I_{EQ1}$, $I_{EQ2}$, $I_{EQ3}$ and $I_{EQ7}$, respectively, the following relationship holds:

$$I_{EQ1} + I_{EQ2} + I_{EQ3} = I_{EQ7} = I_1/2 = I_2 \tag{6}$$

Also, the emitter currents of the respective NPN transistors are represented as follows:

$$I_{EQ1} = I_{SN} \exp\{(q/kT)\cdot(y_1 - V_1)\} \tag{7}$$

$$I_{EQ2} = I_{SN} \exp\{(q/kT)\cdot(y_2 - V_1)\} \tag{8}$$

$$I_{EQ3} = I_{SN} \exp\{(q/kT)\cdot(y_3 - V_1)\} \tag{9}$$

$$I_{EQ7} = I_{SN} \exp\{(q/kT)\cdot(y_6 - V_1)\} \tag{10}$$

wherein $I_{SN}$ indicates a reverse saturation current of the NPN transistor, q indicates a charge amount of electrons, k indicates the Boltzmann's constant, T indicates an absolute temperature, and $V_1$ indicates the shared emitter potential of the NPN transistor.

Accordingly, when the formulas (7) through (10) are substituted for the formula (6) and the resultant formula is solved for $y_6$, the following formula (11) representing the relationship between the sixth control voltage $y_6$ and the first through third control voltages $y_1$, $y_2$ and $y_3$ can be obtained:

$$y_6 = (kT/q)\cdot\ln\{\exp(qy_1/kT) + \exp(qy_2/kT) + \exp(qy_3/kT)\} \tag{11}$$

Similarly, in the MIN circuit 14b, the emitter currents of the first PNP transistor Q6, the second PNP transistor Q4, the third PNP transistor Q5 and the fourth PNP transistor Q8 are indicated as $I_{EQ6}$, $I_{EQ4}$, $I_{EQ5}$ and $I_{EQ8}$, respectively, the following relationship holds:

$$I_{EQ6} + I_{EQ4} + I_{EQ5} = I_{EQ8} = I_3/2 = I_4 \tag{12}$$

Furthermore, the emitter currents of the respective PNP transistors are represented as follows:

$$I_{EQ6} = I_{SP} \exp\{(q/kT)\cdot(V_2-y_6)\} \quad (13)$$

$$I_{EQ4} = I_{SP} \exp\{(q/kT)\cdot(V_2-y_4)\} \quad (14)$$

$$I_{EQ5} = I_{SP} \exp\{(q/kT)\cdot(V_2-y_5)\} \quad (15)$$

$$I_{EQ8} = I_{SP} \exp\{(q/kT)\cdot(V_2-y_7)\} \quad (16)$$

wherein $I_{SP}$ indicates a reverse saturation current of the PNP transistor, q indicates a charge amount of electrons, k indicates the Boltzmann's constant, T indicates an absolute temperature, and $V_2$ indicates the shared emitter potential of the PNP transistor.

Accordingly, when the formulas (13) through (16) are substituted for the formula (12) and the resultant is solved for $y_7$, the following formula (17) representing the relationship between the seventh control voltage $y_7$ and the fourth through sixth control voltages $y_4$, $y_5$ and $y_6$ can be obtained:

$$y_7 = (-kT/q)\cdot\ln\{\exp(-qy_6/kT) + \exp(-qy_4/kT) + \exp(-qy_5/kT)\} \quad (17)$$

Furthermore, by substituting the sixth control voltage $y_6$ represented by the formula (11) for the formula (17), the desired formula (18) can be obtained as follows:

$$y_7 = (-kT/q)\cdot\ln[1/\{\exp(qy_1/kT) + \exp(qy_2/kT) + \exp(qy_3/kT)\} + \exp(-qy_4/kT) + \exp(-qy_5/kT)] \quad (18)$$

Next, an exemplified configuration of the ROM/RAM circuit 16 of this embodiment shown in FIG. 1 will be described.

Figure 13:
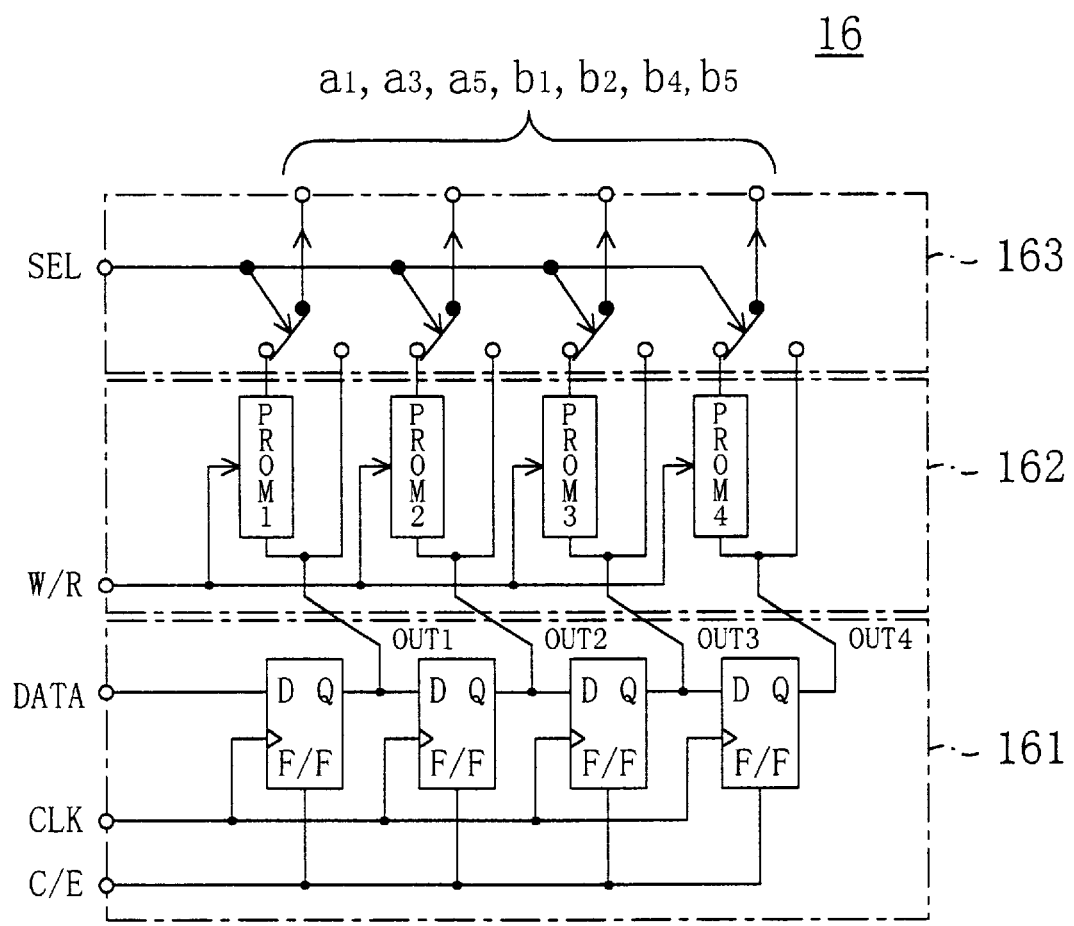
FIG. 13 is a detailed circuit diagram of a ROM/RAM circuit of the temperature compensating crystal oscillation device of the first embodiment.

FIG. 13 shows the circuit configuration of the ROM/RAM circuit 16 used in the temperature compensating crystal oscillation device of this embodiment. As is shown in FIG. 13, though it is merely one example, the ROM/RAM circuit 16 includes a RAM data input circuit 161 as a serial data input portion including serially connected four flip-flops, a PROM circuit 162 including four programmable ROMs each receiving and storing each bit of output data of the RAM data input circuit 161, and a switch circuit 163 for externally receiving a selection signal SEL and selecting either the output data of the RAM data input circuit 161 or output data of the PROM circuit 162. In this case, the output data of the ROM/RAM circuit 16 is output, for example, to the current mirror circuit 33 of FIG. 5 as the 4-bit signal $a_1$ or the like. Although the exemplified ROM/RAM circuit 16 has a configuration for coping with 4-bit data, the invention is not limited to this configuration and the bit number can be determined in accordance with the number of the temperature compensating parameters described below.

Figure 14:
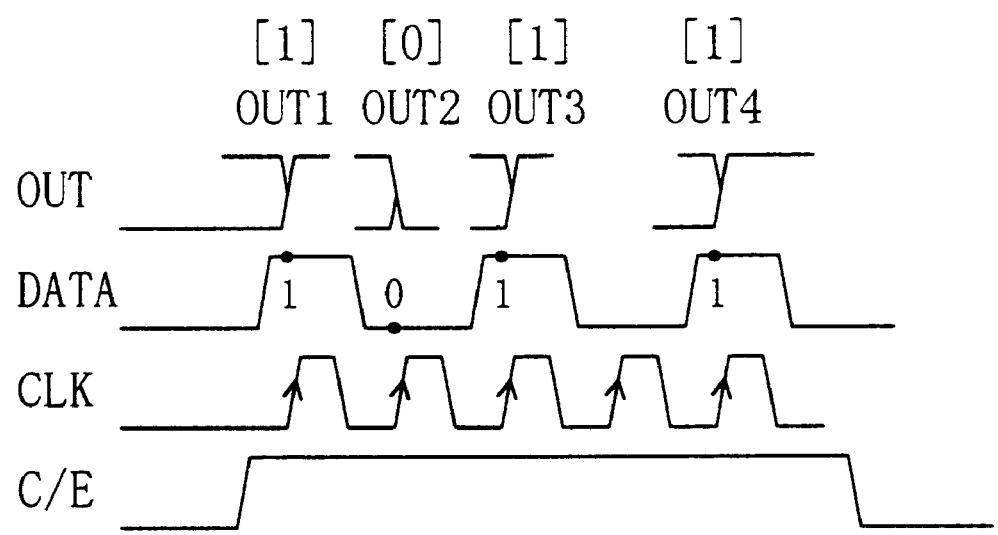
FIG. 14 is a timing chart of RAM data input to the ROM/RAM circuit of the temperature compensating crystal oscillation device of the first embodiment.

The operation of the ROM/RAM circuit 16 will now be described with reference to a timing chart of RAM data input shown in FIG. 14.

First, in order to write desired data in the PROM circuit 162, a C/E signal which corresponds to an enable signal in the RAM data input circuit 161 is activated so as to enable the data input, and a read/write signal W/R in the PROM circuit 162 is set in the write mode. Serial data of, for example, 1, 0, 1 and 1 are successively input from the data input terminal DATA to the RAM data input circuit 161 at a rise of a clock signal CLK. As a result, as is shown in FIG. 14, the first output data "1" is output to the output terminal OUT1 of the first flip-flop, the second output data "0" is output to the output terminal OUT2 of the second flip-flop, the third output data "1" is output to the output terminal OUT3 of the third flip-flop, and the fourth output data "1" is output to the output terminal OUT4 of the fourth flip-flop. Next, in the PROM circuit 162 of FIG. 13, the first output data is stored in the PROM1, the second output data is stored in the PROM2, the third output data is stored in the PROM3 and the fourth output data is stored in the PROM4.

In order to directly output the data having been input to the RAM data input circuit 161, the selection signal SEL in the switch circuit 163 is set at a level for passing the data through. In order to read the data stored in the PROM circuit 162, the selection signal SEL in the switch circuit 163 is set at a level for selecting the PROM.

Modification 1 of Embodiment 1

A first modification of the first embodiment will now be described with reference to the accompanying drawing.

FIG. 15 shows the circuit configuration of a control circuit of a crystal oscillation device according to the first modification. In FIG. 15, like reference numerals are used to refer to like elements used in the control circuit of FIG. 10, and the description is omitted. The control circuit 14 of FIG. 15 includes a MAX circuit 14c for receiving the first control voltage $y_1$, the second control voltage $y_2$ and the third control voltage $y_3$ generated by the constant voltage circuit 12 and the temperature sensor circuit 13 of FIG. 1 and for outputting the maximum voltage among these control voltages as the sixth control voltage $y_6$; and a MIN circuit 14d for receiving the fourth control voltage $y_4$ and the fifth control voltage $y_5$ generated by the constant voltage circuit 12 and the temperature sensor circuit 13 of FIG. 1 and the sixth control voltage $y_6$ output from the MAX circuit 14c and for outputting the minimum voltage among these control voltages as the seventh control voltage $y_7$.

In the MAX circuit 14c, a first resistance R1 is serially connected between the emitter of the first NPN transistor Q1 and the first constant current source $I_1$, a second resistance R2 is serially connected between the emitter of the second NPN transistor Q2 and the first constant current source $I_1$, a third resistance R3 is serially connected between the emitter of the third NPN transistor Q3 and the first constant current source $I_1$, and a fourth resistance R7 is serially connected between the emitter of the fourth NPN transistor Q7 and the first constant current source $I_1$.

Similarly, in the MIN circuit 14d, a fifth resistance R6 is serially connected between the emitter of the first PNP transistor Q6 and the third constant current source $I_3$, a sixth resistance R4 is serially connected between the emitter of the second PNP transistor Q4 and the third constant current source $I_3$, a seventh resistance R5 is serially connected between the emitter of the third PNP transistor Q5 and the third constant current source $I_3$, and an eighth resistance R8 is serially connected between the emitter of the fourth PNP transistor Q8 and the third constant current source $I_3$.

In this modification, since the resistances are serially connected with the emitters of the NPN transistors Q1, Q2, Q3 and Q7 in the MAX circuit 14c and the resistances are serially connected with the emitters of the PNP transistors Q6, Q4, Q5 and Q8 in the MIN circuit 14d, the connecting portions between the respective temperature regions in the control voltage Vc shown in FIG. 12 can be smoothed. In general, in cubic functional approximation using polygonal lines, an approximation error $\Delta f$ ($=f-f_0$) corresponding to a difference between the oscillation frequency f after the temperature compensation and the reference frequency $f_0$ of a quartz oscillator is largest at a connecting portion of the polygonal lines. However, the connecting portions between the temperature regions can be thus smoothed, the approximation error can be reduced.

Modification 2 of Embodiment 1

A second modification of the first embodiment will now be described with reference to the accompanying drawings.

Figure 16A:
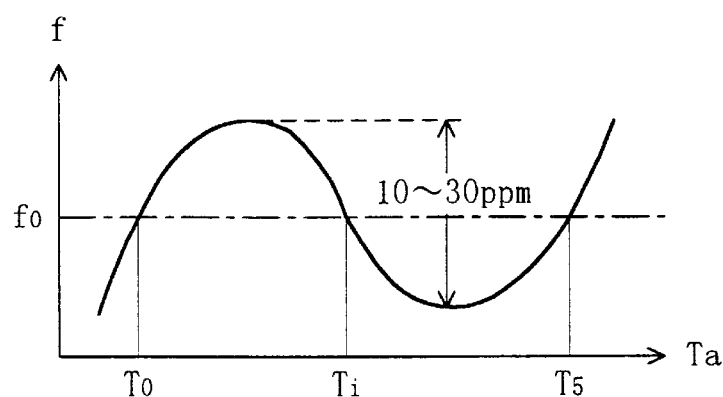
Figure 16B:
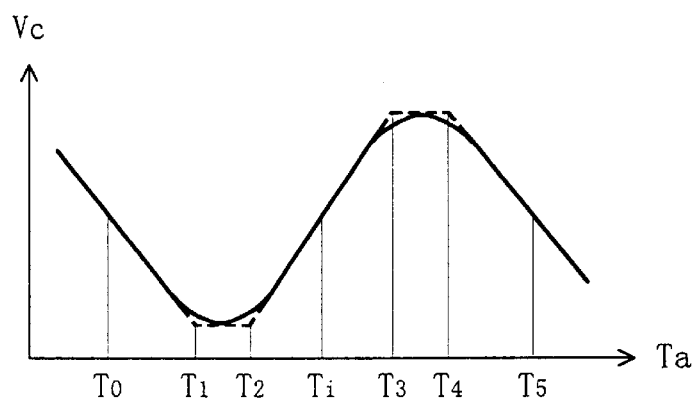
Figure 16C:
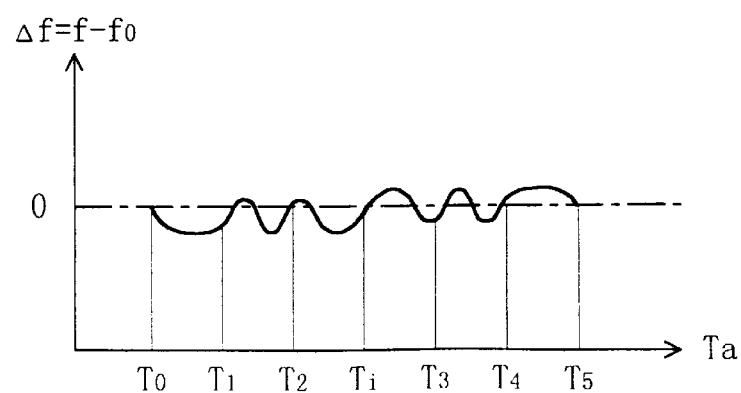

FIGS. 16(a) through 16(c) show the temperature dependency of an oscillation frequency attained by using a control circuit of a crystal oscillation device according to the second modification, wherein FIG. 16(a) shows the temperature dependency of the oscillation frequency before the temperature compensation, FIG. 16(b) shows the temperature dependency of a control voltage Vc used for the temperature compensation of a VCXO generated by the control circuit of this modification and FIG. 16(c) shows the temperature dependency of a difference $\Delta f$ between the oscillation frequency f attained after the temperature compensation by using the control voltage Vc and a reference frequency $f_0$.

As a characteristic of this modification, the lines of the control voltages to be connected in the boundaries between the temperature regions are smoothly connected in an analog manner by gradually transforming the lines of the control voltages in accordance with temperature change. Therefore, the generated control voltage can be more approximated to a cubic function, resulting in decreasing the difference $\Delta f$ in the oscillation frequency.

Figure 17A:
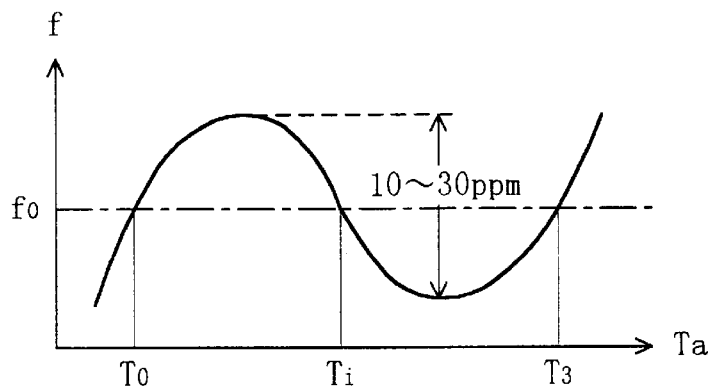
Figure 17B:
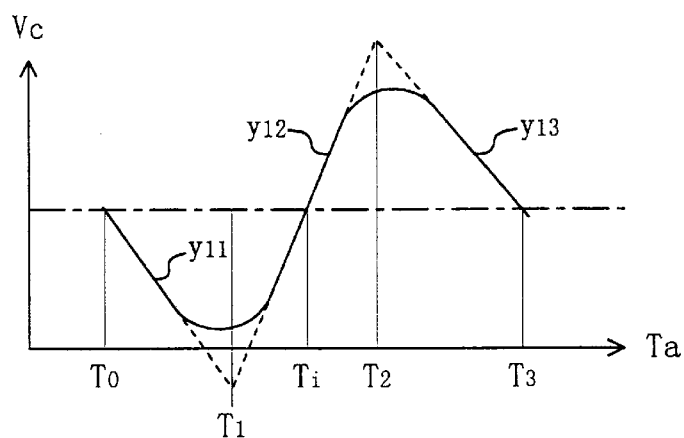
Figure 17C:
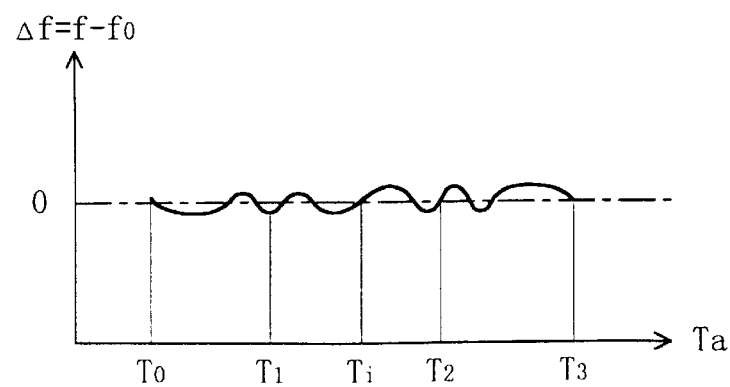

Furthermore, when the ambient temperature $T_a$ is divided into three regions of, $T_0 \leq T_a < T_1$, $T_1 \leq T_a < T_2$ and $T_2 \leq T_a \leq T_3$, and straight lines $y_{11}$, $y_{12}$ and $y_{13}$ of three control voltages alone are used as is shown in FIG. 17, the same effect as is exhibited by the approximation using the five straight lines $y_1$ through $y_5$ can be attained by making the connecting portions smooth in an analog manner.

In the adjustment of the temperature compensation, decrease in the number of straight lines used for the polygonal lines approximation can be a significant factor to decrease the storage capacity of the ROM/RAM circuit, which will be described below.

Modification 3 of Embodiment 1

A third modification of the first embodiment will now be described.

The temperature characteristic of the oscillation frequency f of a quartz oscillator is point-symmetrical about the inflection point temperature $T_i$ at a lower temperature side and a higher temperature side as is shown in FIG. 11(a), and in this modification, the point-symmetry is used for generating a group of control voltages Vc which are point-symmetrical about the inflection point temperature $T_i$ at the lower temperature side and the higher temperature side.

Specifically, in the aforementioned formulas (1) through (5) representing the first through fifth control voltages $y_1$ through $y_5$, the proportional coefficient $a_1$ of the formula (1) is equal to the proportional coefficient $a_5$ of the formula (5), the constant $b_1$ of the formula (1) is equal to the constant $b_5$ of the formula (5), and the constant $b_2$ of the formula (2) is equal to the constant $b_4$ of the formula (4).

In this manner, the circuit constant of one internal element of the control circuit 14 which determines the temperature characteristic at the lower temperature side and the higher temperature side can be designed by using a predetermined proportion to the circuit constant of another internal element, and hence, the storage capacity of the ROM/RAM circuit 16 can be largely decreased.

At this point, the control voltage Vc for the temperature compensation of a quartz oscillator is assumed to be represented by the following cubic function:

$$Vc = \alpha(T-T_i)^3 + \beta(T-T_i) + \gamma \quad (19)$$

wherein $\alpha$ indicates a negative cubic temperature coefficient, $\beta$ indicates a linear temperature coefficient, $\gamma$ is a constant corresponding to a voltage difference from a voltage for attaining a reference frequency at an inflection point temperature, T indicates an absolute temperature and $T_i$ indicates the inflection point temperature corresponding to an inflection point of the cubic function.

FIG. 18 is a table listing memory capacities of the ROM/RAM circuit required by various control circuit systems. In the case where the parameter for adjusting the temperature compensation of the control voltage is limited to the parameter $\alpha$ of the cubic temperature characteristic, in order to dependently adjust the temperature compensating parameters of the first through fifth control voltages $y_1$ through $y_5$ and attain the stability of the oscillation frequency f of ±2.5 ppm in the desired temperature range, each of the proportional coefficients $a_1$, $a_3$ and $a_5$ requires 4 bits, each of the constants $b_1$ and $b_5$ requires 4 bits, and each of the constants $b_2$ and $b_4$ requires 2 bits in the aforementioned formulas (1) through (5). As a result, a D/A converter of 24 bits in total is required.

However, when the control voltage is point-symmetrical at the lower temperature side and the higher temperature side as in this modification, the bits for adjusting the constants $a_5$, $b_5$ and $b_4$ are not necessary because $a_1$, $=a_5$, $b_1=b_5$ and $b_2=b_4$. As a result, the temperature compensation can be adjusted by a D/A converter of 14 bits in total.

Modification 4 of Embodiment 1

A fourth modification of the first embodiment will now be described with reference to the accompanying drawings.

Figure 19A:
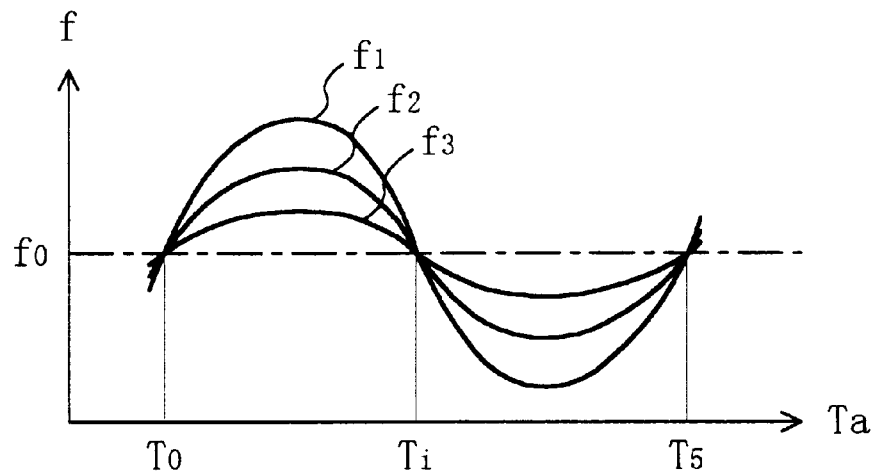
FIG. 19(a) is a graph for showing the ambient temperature dependency attained by different cubic temperature coefficients of the oscillation frequency before the temperature compensation and FIG. 19(b) is a graph for showing the ambient temperature dependency of a control voltage output by a control circuit of a crystal oscillation device according to a fourth modification of the first embodiment.
Figure 19B:
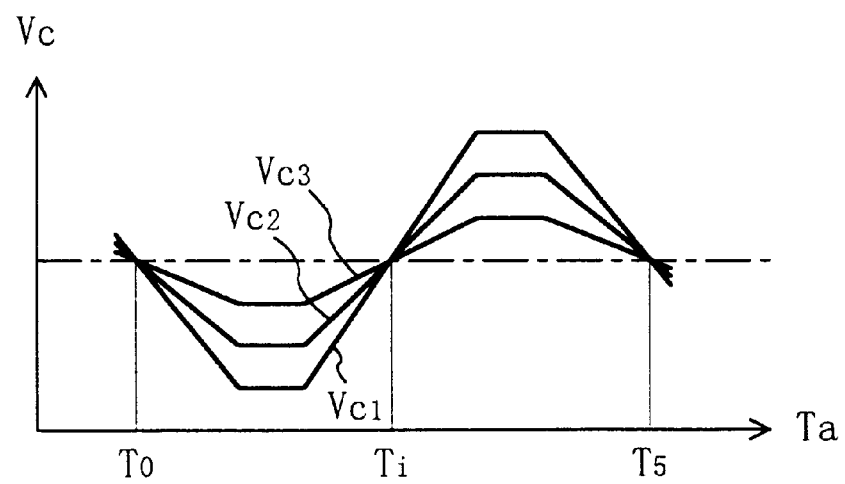

FIGS. 19(a) and 19(b) show the temperature dependency of a control voltage output by a control circuit of a crystal oscillation device according to a fourth modification of the first embodiment, wherein FIG. 19(a) shows cubic curves $f_1$, $f_2$ and $f_3$ attained by different cubic temperature coefficients $\alpha$ in the oscillation frequency of a quartz oscillator and FIG. 19(b) shows control voltages Vc1, Vc2 and Vc3 for compensating the corresponding cubic curves.

In this modification, the temperature coefficients (proportional coefficients) of the temperature characteristics of the control voltage group including the first through fifth control voltages $y_1$ through $y_5$ and varied in the shape of polygonal lines in accordance with the temperature are provided with predetermined proportions to one another.

Thus, in determining the various parameters such as the circuit constant of the control circuit 14, the parameter of one internal element can be designed by using the predetermined proportion to the parameter of another internal element. As a result, the memory capacity of the ROM/RAM circuit 16 can be largely decreased.

Now, optimal proportions for minimizing the approximation error between the cubic temperature coefficient $\alpha$ and the control voltages $y_1$ through $y_5$ will be specifically introduced. When the control voltage peculiar to a quartz oscillator is assumed to be an ideal control voltage Vci, the formula (19) is changed into the following formula (20):

$$Vci = \alpha(T-T_i)^3 + \beta(T-T_i) + \gamma \quad (20)$$

With the operating temperature range of the crystal oscillation device indicated as $T_o$, the ideal control voltage Vci is separated into a linear function Vci1 represented by the formula (25) and a cubic function vci3 represented by the formula (26), both of which pass through three points represented by the following formulas (21) through (23), and the cubic function vci3 is subjected to the polygonal lines approximation:

$$[T, Vci] = [(T_i - T_o), Vci(T_i - T_o)] \quad (21)$$

$$[T, Vci] = [T_i, \gamma] \quad (22)$$

$$[T, Vci]=[(T_i+T_o), Vci(T_i+T_o)] \quad (23)$$

$$Vci=Vci1+Vci3 \quad (24)$$

$$Vci1=(\beta+\alpha T_o^2)(T-T_i)+\gamma \quad (25)$$

$$Vci3=\alpha(T-T_i)^3-\alpha T_o^2(T-T_i) \quad (26)$$

Figure 20A:
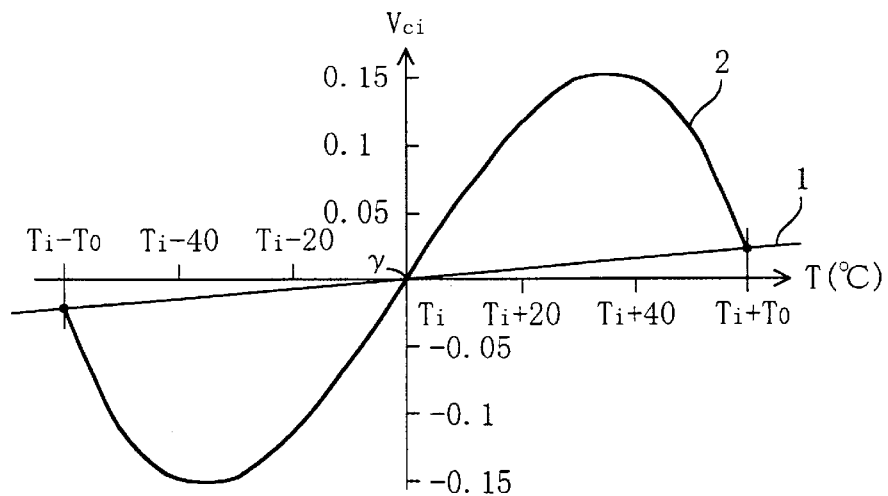
FIGS. 20(a) through 20(c) are graphs for showing generation of the control voltage output by the control circuit of the crystal oscillation device of the fourth modification of the first embodiment.
Figure 20B:
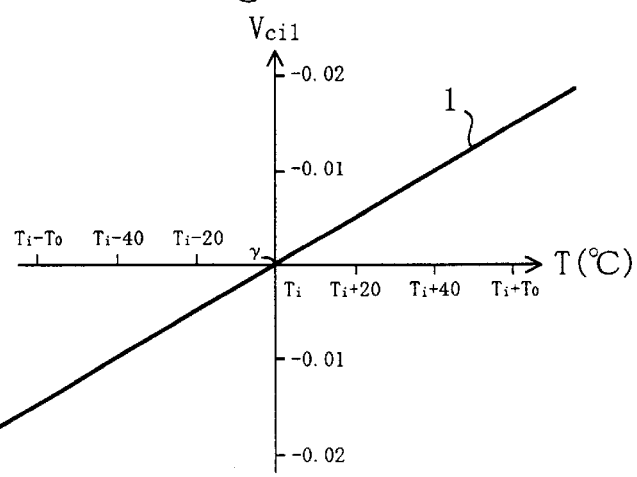
Figure 20C:
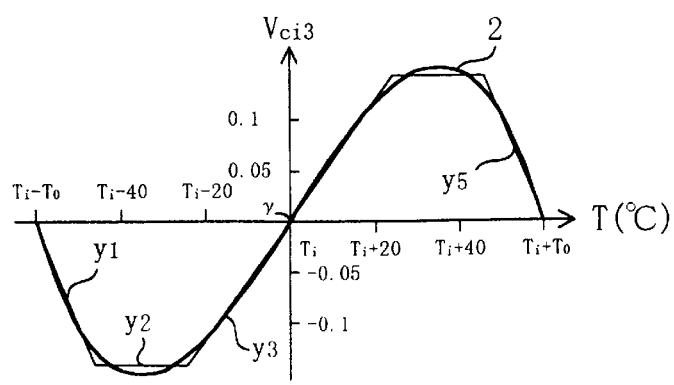

The linear function Vci1 and the cubic function Vci3 are shown in FIGS. 20(a) through 20(c). A line 1 indicates the linear function Vci1 and a curve 2 indicates the cubic function Vci3 in FIG. 20(a), merely the linear function Vci1 is shown in FIG. 20(b), and FIG. 20(c) shows the polygonal lines approximation of the cubic function Vci3 shown as the curve 2 by using a group of lines $y_1$ through $y_5$ corresponding to the five control voltages of the embodiment.

At this point, the approximation error in the polygonal lines approximation is minimized in each region in the following cases: In the first temperature region ($T_i-T_o \leq T < T_i - 0.755T_o$), it is minimized when the first control voltage $y_1$ is:

$$y_1 = -1.46\alpha T_o^2(T-T_i) - 1.46\alpha T_o^3 \quad (27)$$

$$= -a_1(T-T_i) - b_1 \quad (28)$$

In the second temperature region ($T_i-0.755T_o \leq T < T_i-0.398T_o$), it is minimized when the second control voltage $y_2$ is:

$$y_2 = -0.358\alpha T_o^3 \quad (29)$$

$$= -b_2 \quad (30)$$

In the third temperature region ($T_i-0.398T_o \leq T < T_i+0.398T_o$), it is minimized when the third control voltage $y_3$ is:

$$y_3 = 0.9\alpha T_o^2(T-T_i) \quad (31)$$

$$= a_3(T-T_i) \quad (32)$$

In the fourth temperature region ($T_i+0.398T_o \leq T < T_i+0.755T_o$), it is minimized when the fourth control voltage $y_4$ is:

$$y_4 = 0.358\alpha T_o^3 \quad (33)$$

$$= b_4 \quad (34)$$

In the fifth temperature region ($T_i+0.755T_o \leq T \leq T_i+T_o$), it is minimized when the fifth control voltage $y_5$ is:

$$y_5 = -1.46\alpha T_o^2(T-T_i) + 1.46\alpha T_o^3 \quad (35)$$

$$= -a_5(T-T_i) + b_5 \quad (36)$$

Figure 21A:
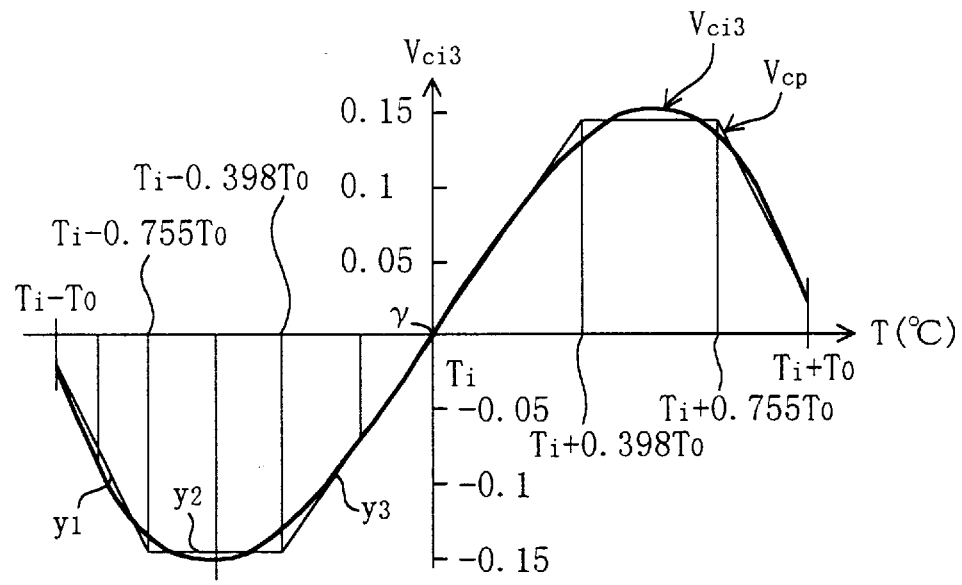
FIG. 21(a) is a graph for showing the respective ambient temperature dependencies of the control voltage output by the control circuit of the crystal oscillation device of the fourth modification of the first embodiment and an ideal control voltage peculiar to a quartz oscillator and FIG. 21(b) is a graph for showing a difference between the ideal control voltage and an approximation control voltage.
Figure 21B:
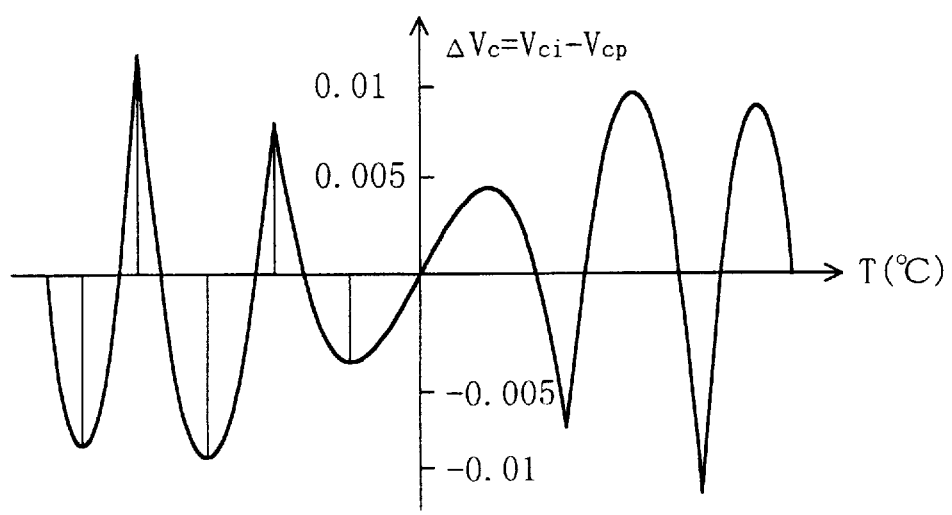

FIG. 21(a) shows the cubic function Vci3 of the formula (26), the first control voltage $y_1$ of the formula (27), the second control voltage $y_2$ of the formula (29), the third control voltage $y_3$ of the formula (31), the fourth control voltage $y_4$ of the formula (33), and the fifth control voltage $y_5$ of the formula (35). FIG. 21(b) shows a difference $\Delta Vc$ between the ideal control voltage Vci3 shown in FIG. 21(a) and an approximation control voltage Vcp obtained through the polygonal lines approximation using the control voltages $y_1$ through $y_5$.

Then, the coefficients of the approximation control voltage Vcp are collected on the left side and the coefficients of the ideal control voltage Vci are collected on the right side. When the coefficients of the formula (27) and (28) and the coefficients of the formulas (35) and (36) are compared, the following are obtained:

$$a_1=a_5=1.46\alpha T_o^2 \quad (37)$$

$$b_1=b_5=1.46\alpha T_o^3 \quad (38)$$

when the coefficients of the formulas (31) and (32) are compared, the following is obtained:

$$a_3=0.9\alpha T_o^2 \quad (39)$$

When the coefficients of the formulas (29) and (30) and the coefficients of the formulas (33) and (34) are compared, the following is obtained:

$$b_2=b_4=0.358\alpha T_o^3 \quad (40)$$

By transforming the formulas (37) through (40), the formulas representing the desired proportions between the cubic temperature coefficient $\alpha$ and the proportional coefficients of the lines used for the polygonal lines approximation can be obtained as follows:

$$a_1/\alpha=1.46T_o^2 \quad (41)$$

$$a_3/\alpha=0.9T_o^2 \quad (42)$$

$$a_5/\alpha=1.46T_o^2 \quad (43)$$

$$b_1/\alpha=1.46T_o^3 \quad (44)$$

$$b_2/\alpha=0.358T_o^3 \quad (45)$$

$$b_4/\alpha=0.358T_o^3 \quad (46)$$

$$b_5/\alpha=1.46T_o^3 \quad (47)$$

At this point, when the inflection point temperature is assumed to be 25° C. and the operating temperature range $T_o$ is 60 degree, the ambient temperature $T_a$ in this modification is −35° C. through +85° C.

In this manner, even when each quartz oscillator has a different cubic coefficient $\alpha$ of the ideal control voltage Vci, the proportions of $\alpha$ are not varied respectively in $a_1/\alpha$, $a_3/\alpha$, $a_5/\alpha$, $b_1/\alpha$, $b_2/\alpha$, $b_4/\alpha$ and $b_5/\alpha$.

Accordingly, in this modification, the proportional coefficients $a_1$, $a_3$ and $a_5$ of the lines and the constants $b_1$, $b_2$, $b_4$ and $b_5$ of the lines are respectively provided with the proportions as is shown in the formulas (41) through (47). In this manner, in the adjustment of the cubic temperature coefficient $\alpha$ of a quartz oscillator, the circuit constants corresponding to the proportional coefficients $a_1$, $a_3$ and $a_5$ and the circuit constants corresponding to the constants $b_1$, $b_2$, $b_4$ and $b_5$ can be set in a batch, and hence, the adjustment can be performed by a D/A converter of 6 bits in total as is shown in FIG. 18. Therefore, even when the memory capacity of the ROM/RAM circuit 16 is small, fluctuations of the cubic temperature coefficient and the linear temperature coefficient derived from a cut angle of the AT cut of a quartz oscillator and fluctuation of the absolute value of the oscillation frequency can be both definitely adjusted.

Embodiment 2

A second embodiment of the invention will now be described with reference to the accompanying drawings.

Figure 22:
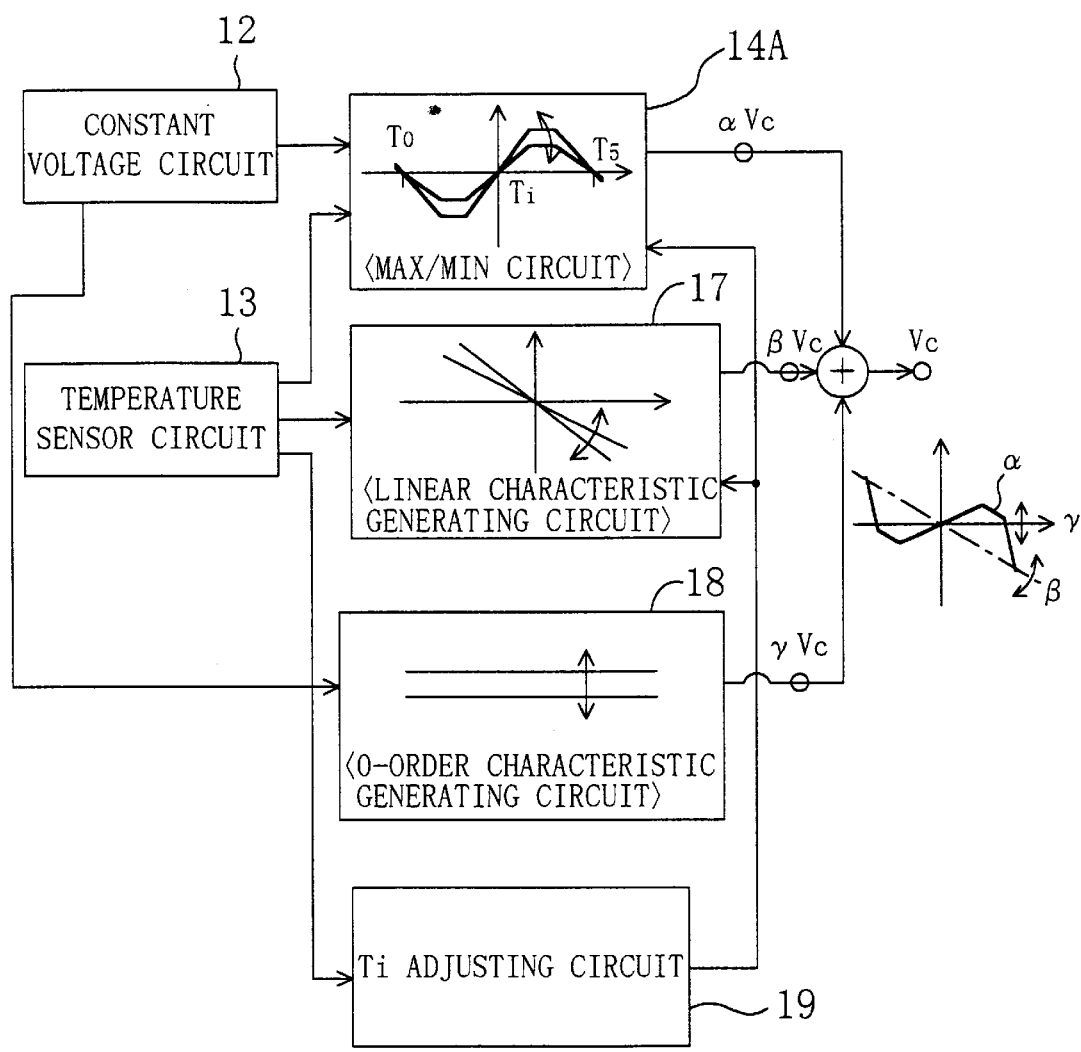
FIG. 22 is a functional block diagram of a functional generator used for temperature compensation in a temperature compensating crystal oscillation device according to a second embodiment of the invention.

FIG. 22 is a functional block diagram of a function generator for the temperature compensation used in a temperature compensating crystal oscillation device according to the second embodiment. As is shown in FIG. 22, the function generator includes a MAX/MIN circuit 14A having the same configuration as the control circuit 14 of the first embodiment for receiving the outputs of a constant voltage circuit 12 and a temperature sensor circuit 13 and for generating a cubic control voltage $\alpha$Vc corresponding to the cubic temperature characteristic parameter $\alpha$ within a predetermined temperature range in the control voltage Vc for the temperature compensation represented by the formula (19); a linear temperature characteristic generating circuit 17 for receiving the output of the temperature sensor circuit 13 and for generating a linear control voltage $\beta$Vc corresponding to a linear temperature characteristic parameter $\beta$ within a predetermined temperature range in the control voltage Vc for the temperature compensation represented by the formula (19); a zero-order temperature characteristic generating circuit 18 for receiving the output of the constant voltage circuit 12 and for generating a zero-order control voltage $\gamma$Vc corresponding to the zero-order temperature characteristic parameter $\gamma$ within a predetermined temperature range in the control voltage Vc for the temperature compensation represented by the formula (19), namely, independent of the temperature within a predetermined temperature; and a $T_i$ adjusting circuit 19 for receiving the output of the temperature sensor circuit 13, adjusting the value of an inflection point temperature $T_i$ shown in the formula (19) and outputting the adjusted value to the MAX/MIN circuit 14A and the linear temperature characteristic generating circuit 17.

In the function generator for generating the control voltage Vc for the temperature compensation of a VCXO of this embodiment, the control voltage Vc is generated by obtaining a sum of the output voltage $\alpha$ Vc of the MAX/MIN circuit 14A for performing, with the ambient temperature $T_a$ divided into five regions, the polygonal lines approximation using a linear function in each region, the output voltage $\beta$ Vc of the linear temperature characteristic generating circuit 17 for adjusting the linear characteristic of the temperature compensating parameter, and the output voltage $\gamma$ Vc of the zero-order temperature characteristic generating circuit 18 for adjusting the zero-order characteristic of the temperature compensating parameter, namely, a voltage difference, independent of the ambient temperature $T_a$, from the voltage for attaining a reference frequency at the inflection point temperature. Accordingly, the temperature compensation of the oscillation frequency of a quartz oscillator can be definitely carried out in the entire range of the ambient temperature $T_a$.

Figure 23A:
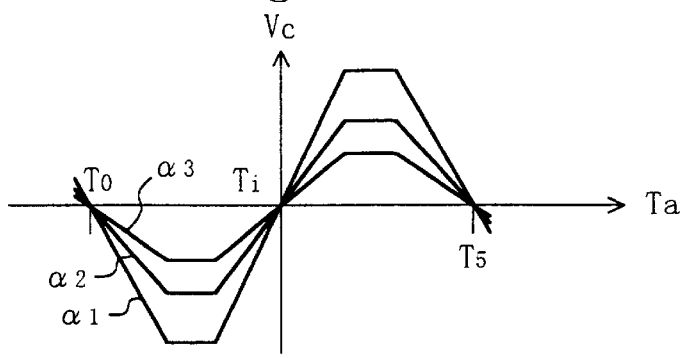
FIGS. 23(a) through 23(d) are graphs for explaining variation of a control voltage through adjustment of temperature compensating parameters and a inflection point temperature in the temperature compensating crystal oscillation device of the second embodiment.
Figure 23B:
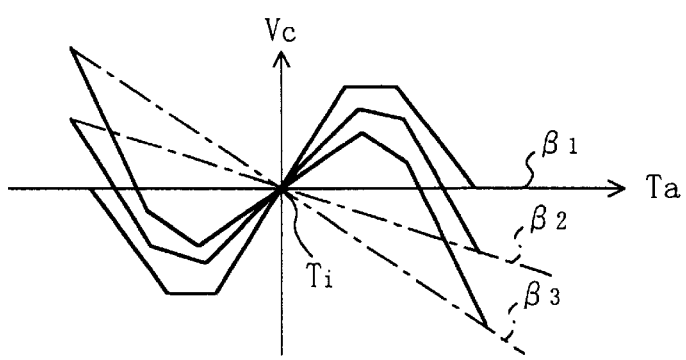
Figure 23C:
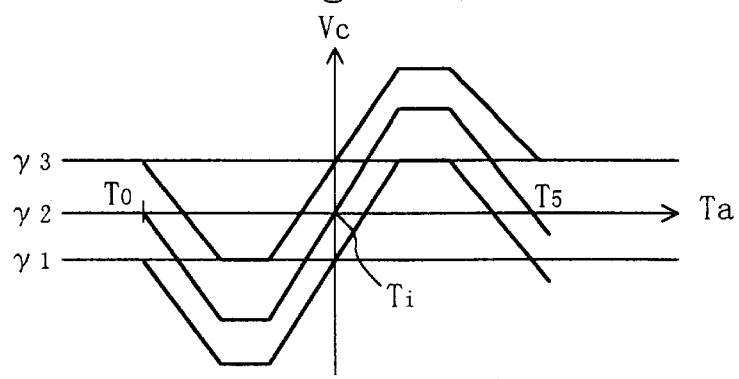
Figure 23D:
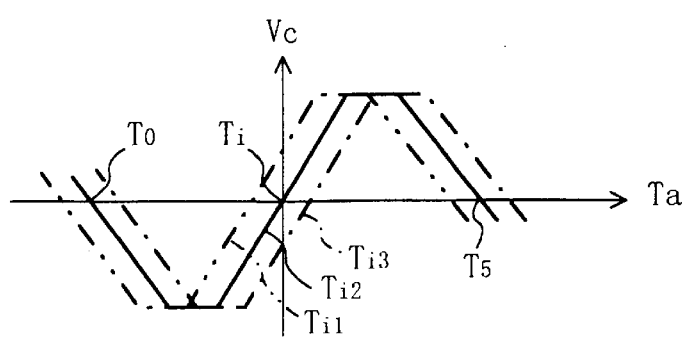

FIGS. 23(a) through 23(d) are graphs for illustrating variation of the control voltage Vc through the adjustment of the temperature compensating parameters $\alpha$, $\beta$, and $\gamma$ and the inflection point temperature $T_i$. FIG. 23(a) shows the variation derived from the cubic temperature characteristic parameter $\alpha$, FIG. 23(b) shows the variation derived from the linear temperature characteristic parameter $\beta$, FIG. 23(c) shows the variation derived from the zero-order temperature characteristic parameter $\gamma$, namely, the voltage difference from the voltage for attaining the reference frequency at the inflection point temperature, and FIG. 23(d) shows the variation derived from the inflection point temperature $T_i$.

As is shown in FIG. 23(a), when the cubic temperature characteristic parameter $\alpha$ is changed, the absolute values at the minimum point and the maximum point are decreased, and as is shown in FIG. 23(b), when the linear temperature characteristic parameter $\beta$ is changed, the temperature characteristic is rotated about the inflection point temperature $T_i$ (i.e., the inflection point). Also, as is shown in FIG. 23(c), when the zero-order temperature characteristic parameter $\gamma$ is changed, the so-called y-intercept is moved. Furthermore, as is shown in FIG. 23(d), when the inflection point temperature $T_i$ is changed, the characteristic graph is moved in the X-axis direction.

Embodiment 3

A third embodiment of the invention will now be described with reference to the accompanying drawings.

Figure 24:
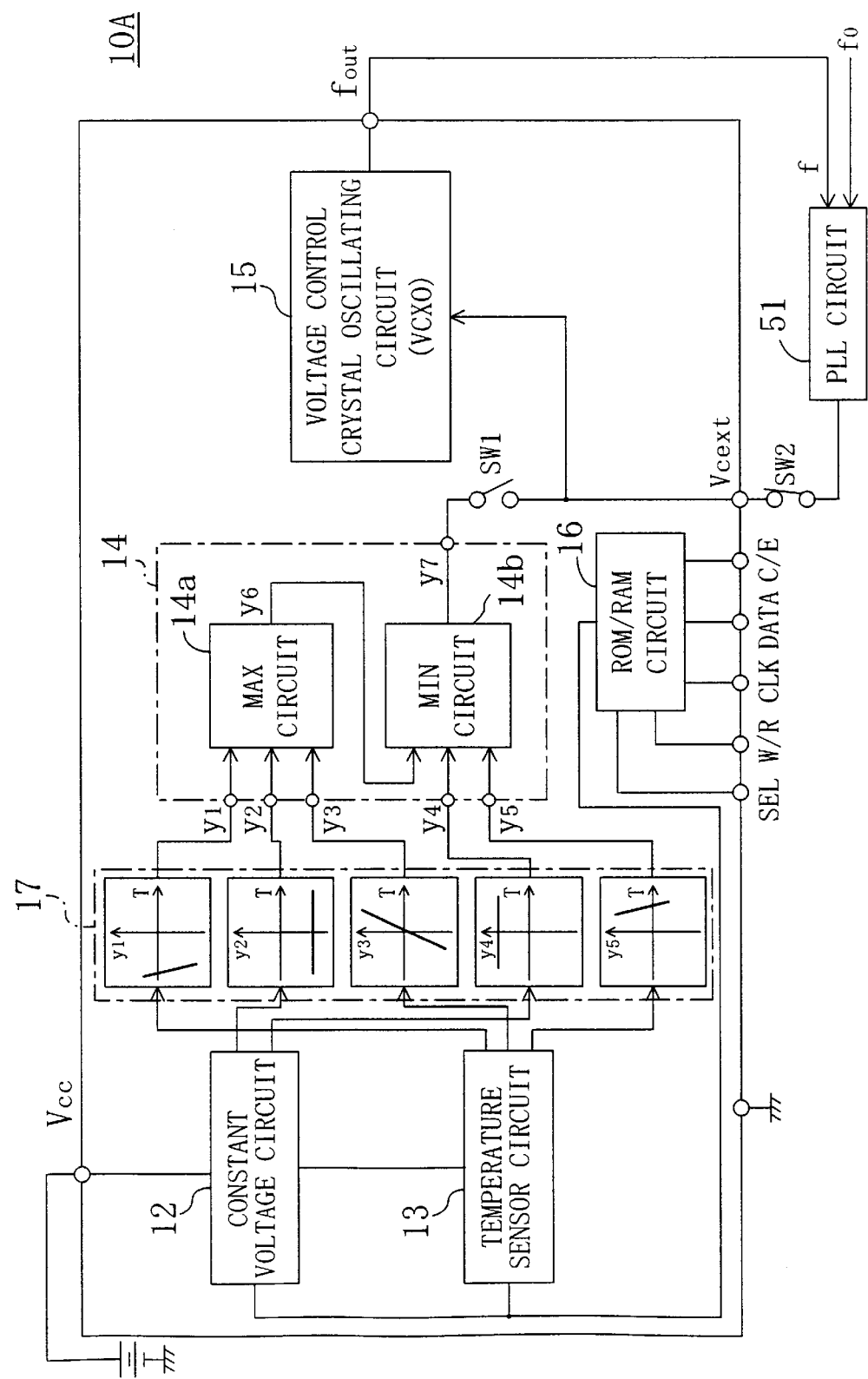
FIG. 24 is a functional block diagram for illustrating adjustment of an oscillation frequency in a temperature compensating crystal oscillation device according to a third embodiment of the invention.

FIG. 24 is a functional block diagram for illustrating the adjustment of an oscillation frequency in a temperature compensating crystal oscillation device according to the third embodiment. In FIG. 24, like reference numerals are used to refer to like elements shown in FIG. 1, and the description is omitted. In this embodiment, the constant voltage circuit 12, the temperature sensor circuit 13, the control circuit 14, the VCXO 15 and the ROM/RAM circuit 16 as optimizing means have the configurations equivalent to those of the first embodiment. Furthermore, as is shown in FIG. 24, the temperature compensating crystal oscillation device 10A of this embodiment is provided with a switch SW1 for connecting/disconnecting the control circuit 14 and the VCXO 15.

In general, each quartz oscillator included in the VCXO 15 has fluctuation in the AT cut angle, the frequency difference from a reference frequency at an inflection point temperature and the inflection point temperature $T_i$. Therefore, it is necessary to adjust the oscillation frequency of the VCXO 15 within a range of ±2.5 ppm before shipping.

The crystal oscillation device of this embodiment has the switch SW1 between the control circuit 14 and the VCXO 15. Therefore, the crystal oscillation device can definitely cope with a RAM mode and a ROM mode as follows: In the RAM mode, externally input data including the temperature compensating parameters are input to the RAM data input circuit 161 of the ROM/RAM circuit 16 through the external data input terminal DATA and the control voltage Vc is adjusted by using the data of the RAM data input circuit 161, so as to determine an optimal voltage characteristic. In the ROM mode, data selected in the RAM mode are written in a ROM portion of the ROM/RAM circuit 16 and the ROM data are read under actual use conditions, so as to output a control voltage Vc in accordance with the ambient temperature $T_a$.

The method of adjusting the oscillation frequency of the temperature compensating crystal oscillation device 10A having the aforementioned configuration will now be described with reference to the accompanying drawing.

Figure 25:
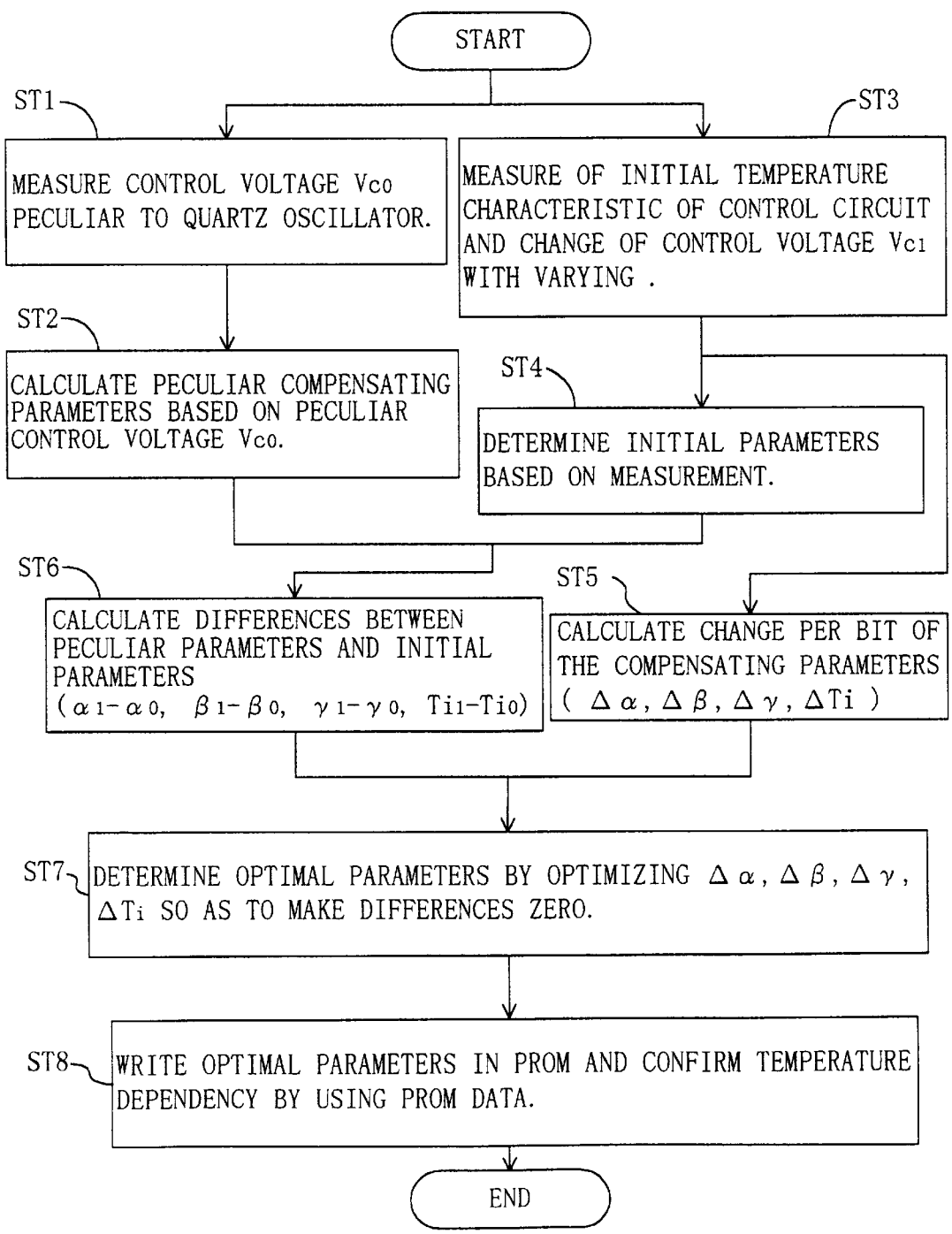
FIG. 25 is a flowchart for showing the adjustment of the temperature compensating crystal oscillation device of the third embodiment.
Figure 26A:
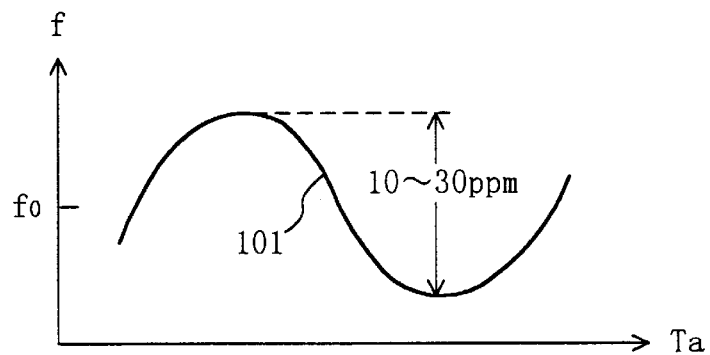
Figure 26B:
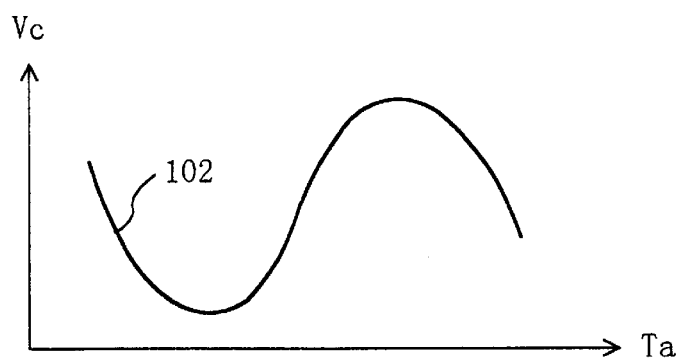
Figure 26C:
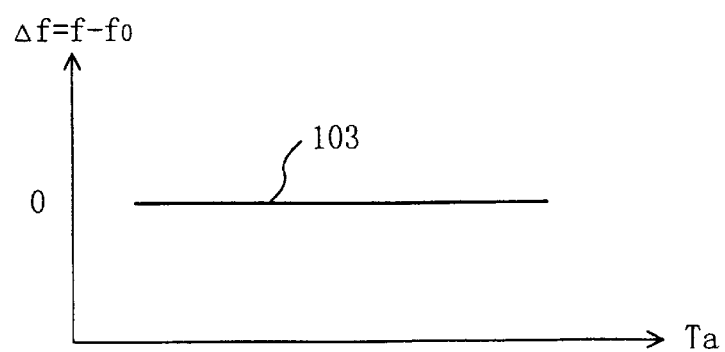
Figure 27:
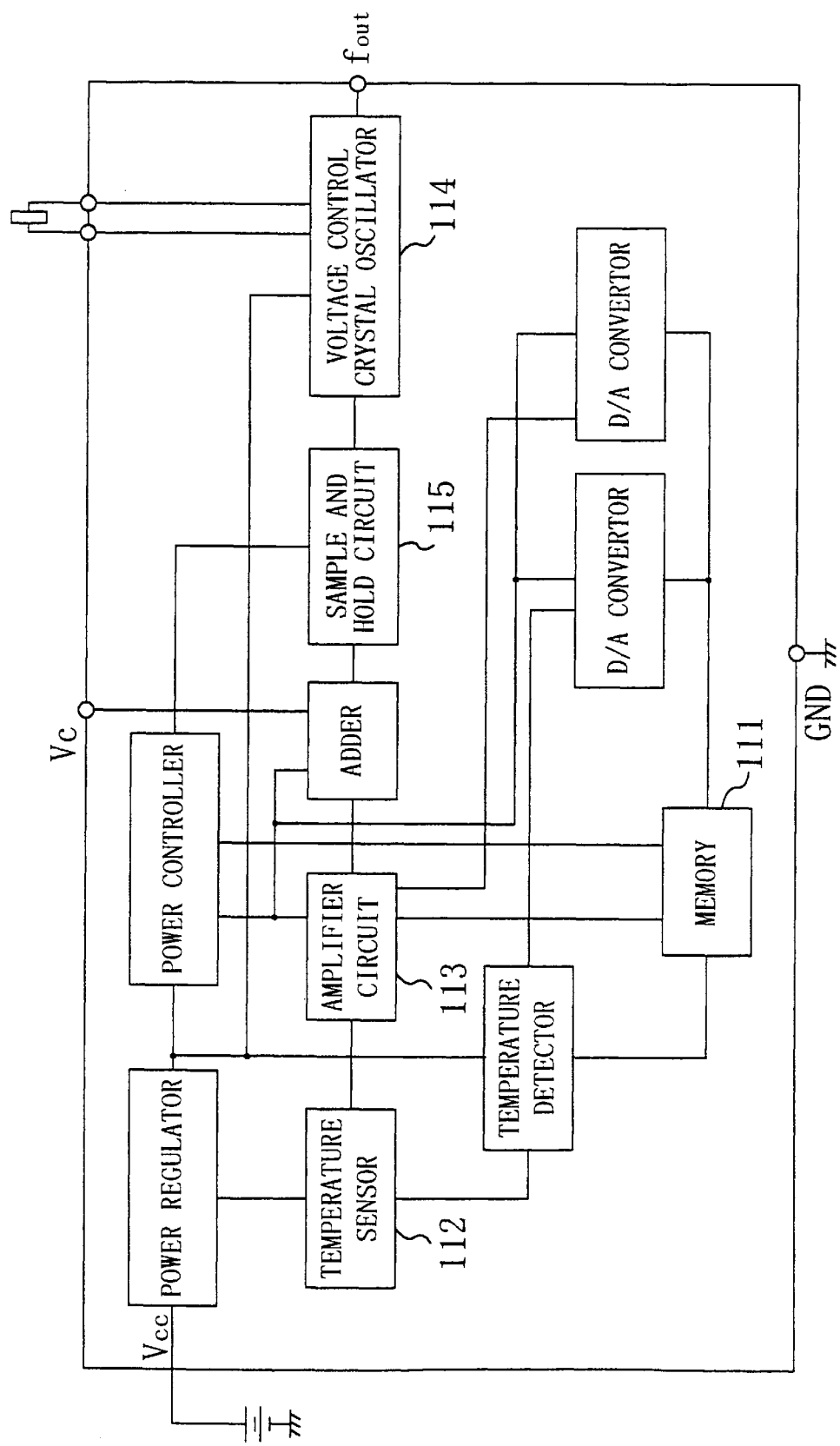
FIG. 27 is a functional block diagram of a conventional temperature compensating crystal oscillation device.
Figure 28A:
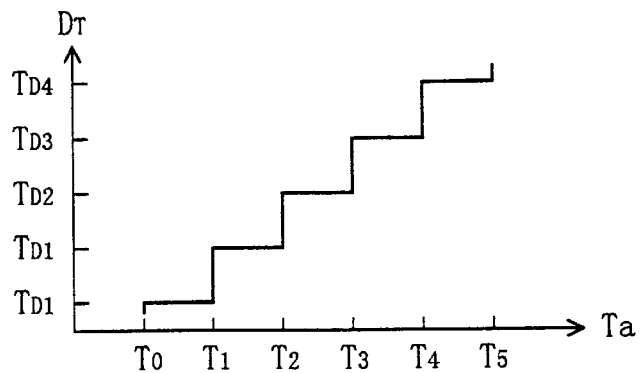
FIGS. 28(a) through 28(c) are graphs for explaining temperature compensation of the conventional temperature compensating crystal oscillation device.
Figure 28B:
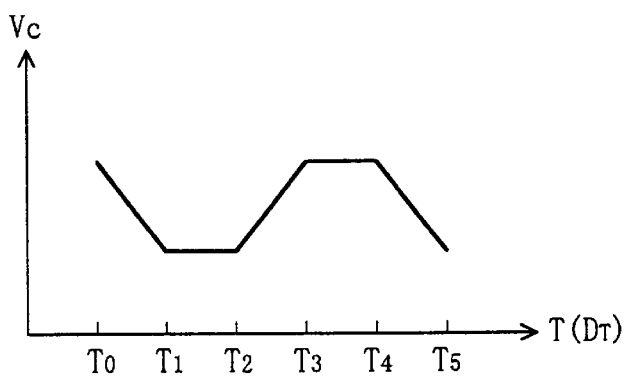
Figure 28C:
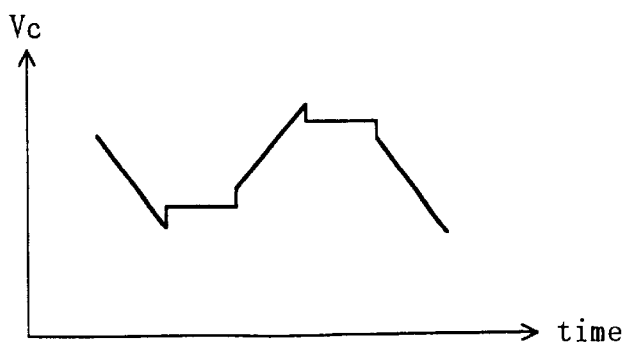

FIG. 25 is a flowchart for the method of adjusting the crystal oscillation device of this embodiment.

First, in a peculiar control voltage measuring step ST1, the switch SW1 of FIG. 24 is opened, one input terminal of a PLL circuit 51 is connected with the output terminal fout of the VCXO 15, and a predetermined frequency f0 independent of the ambient temperature is input to the other input terminal of the PLL circuit 51. Thus, an external control voltage Vcext is adjusted so that the oscillation frequency f output from the output terminal fout can be equal to the predetermined frequency f0. Then, after the crystal oscillation device 10A to be adjusted is placed in a constant temperature oven, the external control voltage Vcext is measured with the ambient temperature changed from a low temperature to a high temperature. In this manner, a peculiar control voltage Vc0, that is, an ideal control voltage at which the variation of the oscillation frequency f of the VCXO 15 caused by the temperature is 0, is obtained.

Next, in a peculiar parameter determining step ST2, on the basis of the temperature characteristic of the peculiar control voltage Vc0, parameters of a control signal corresponding to the cubic temperature coefficient, the linear temperature coefficient, the frequency difference from the reference frequency at the inflection point temperature and the inflection point temperature are calculated, and peculiar parameters are defined as $\alpha_0$, $\beta_0$, $\gamma_0$ and $T_{i0}$, respectively.

Then, in an initial control voltage characteristic measuring step ST3, a switch SW2 is opened with the switch SW1 short-circuited and the device is set in the RAM mode. Then, the temperature characteristic of an initial control voltage Vc1 of the control circuit 14 is measured as well as change of the temperature characteristic of the initial control voltage Vc1 in accordance with change of data corresponding to the respective parameters input to the RAM is measured.

Next, in an initial parameter determining step ST4, on the basis of the temperature characteristic of the initial control voltage Vc1, parameters for initial temperature compensation of the initial control voltage Vc1 corresponding to the cubic temperature coefficient, the linear temperature coefficient, the frequency difference from the reference frequency at the inflection point temperature and the inflection point temperature of the quartz oscillator are calculated and defined as $\alpha_1$, $\beta_1$, $\gamma_1$ and $T_{i1}$, respectively.

Subsequently, in a temperature compensating parameter change calculating step ST5, the amounts of change corresponding to 1 bit of the respective parameters as the RAM data are calculated and defined as $\Delta\alpha$, $\Delta\beta$, $\Delta\gamma$, $\Delta T_i$, respectively.

Then, in apeculiar parameter/initial parameter difference calculating step ST6, differences in the corresponding parameters between $\alpha_0$, $\beta_0$, $\gamma_0$ and $T_{i0}$ and $\alpha_1$, $\beta_1$, $\gamma_1$ and $T_{i1}$ are calculated.

Next, in an optimal parameter determining step ST7, on the basis of $\Delta\alpha$, $\Delta\beta$, $\Delta\gamma$ and $\Delta T_i$ calculated in the temperature compensating parameter change calculating step ST5, optimal parameters are determined so that the differences in the parameters calculated in the peculiar parameter/initial parameter difference calculating step ST6 can be approximated to zero.

Then, in an oscillation frequency characteristic confirming step ST8, the determined optimal parameters are written in the PROM circuit 162, and the device is set in the ROM mode. Then, the crystal oscillation device 10A to be adjusted is placed in a constant temperature oven again, and the temperature characteristic of the oscillation frequency f is measured, so as to confirm that the temperature dependency is set within a predetermined range. In the case where the temperature dependency exceeds the predetermined range, the procedure returns to an appropriate upstream step, and re-adjustment is carried out.

In this manner, according to this embodiment, the adjustment for suppressing the temperature dependency of the oscillation frequency within a predetermined range can be definitely realized with regard to the fluctuation of the AT cut angle, the fluctuation of the frequency difference from the reference frequency at the inflection point temperature and the fluctuation of the inflection point temperature of a quartz oscillator.

Moreover, the procedures of the peculiar control voltage measuring step ST1, the peculiar parameter determining step ST2, the initial control voltage characteristic measuring step ST3, the initial parameter determining step ST4, the temperature compensating parameter change calculating step ST5, the peculiar parameter/initial parameter difference calculating step ST6, the optimal parameter determining step ST7 and the oscillation frequency characteristic confirming step ST8 can be automatically performed by using a personal computer or the like. Therefore, by writing optimal parameters in accordance with each quartz oscillator in the ROM and automatically confirming the oscillation frequency by using the ROM data, time required for the entire process for adjusting the crystal oscillation device can be largely decreased and the accuracy can be remarkably improved.

What is claimed is:

1. A function generator comprising:

a first analog signal generating circuit for generating and outputting a predetermined analog signal substantially independent of an ambient temperature;

a second analog signal generating circuit for generating and outputting an analog signal dependent upon the ambient temperature;

storage means for storing control information respectively corresponding to first, second, third, fourth and fifth temperature regions obtained by dividing a feasible range of the ambient temperature into five continuous parts in this order along a direction from a low temperature to a high temperature;

a third analog signal generating circuit for receiving said signal from said first analog signal generating circuit and said signal from said second analog signal generating circuit and further receiving said control information from said storage means, and for generating and outputting first, second, third, fourth and fifth control signals respectively corresponding to said five temperature regions; and a control circuit for receiving said first through fifth control signals and generating to output a control signal as a function of a temperature based on each received signal, wherein said storage means stores as said control information:

a first proportional value defining a relationship between a proportional coefficient between a temperature used for generating said first control signal and the output value thereof and a cubic coefficient of a temperature characteristic of an oscillation frequency of a quartz oscillator;

a second proportional value defining a relationship between a constant between a temperature used for generating said second control signal and the output value thereof and said cubic coefficient;

a third proportional value defining a relationship between a proportional coefficient between a temperature used for generating said third control signal and the output value thereof and said cubic coefficient;

a fourth proportional value defining a relationship between a constant between a temperature used for generating said fourth control signal and the output value thereof and said cubic coefficient; and a fifth proportional value defining a relationship between a proportional coefficient between a temperature used for generating said fifth control signal and the output value thereof and said cubic coefficient, and wherein when the ambient temperature is in any of said first, second and third temperature regions, said control signal outputted from said control circuit comprises: any of said first, second and third control signals which is selected by said control circuit; and another signal generated by altering said selected signal so as to form a smooth curve in a region around a border between the temperature region to which the ambient temperature belongs and the adjacent temperature region, while when the ambient temperature is in either of said fourth and fifth temperature regions, said control signal outputted from said control circuit comprises: any of at least one of said first, second and third control signals including said third control signal, said fourth control signal and said fifth control signal which is selected by said control circuit; and another signal generated by altering said selected signal so as to form a smooth curve in a region around a border between the temperature region to which the ambient temperature belongs and the adjacent temperature region.

2. The function generator of claim 1,
wherein said control circuit includes:
   a first NPN transistor whose collector is supplied with a supply voltage, whose base is supplied with a first electric signal decreasing in proportion to the ambient temperature and whose emitter is connected with an input of a first current source;
   a second NPN transistor whose collector is supplied with the supply voltage, whose base is supplied with a second electric signal retaining a predetermined value independent of the ambient temperature and whose emitter is connected with the input of said first current source;
   a third NPN transistor whose collector is supplied with the supply voltage, whose base is supplied with a third electric signal increasing in proportion to the ambient temperature and whose emitter is connected with the input of said first current source;
   a fourth NPN transistor whose collector and base are connected with an output of a second current source having a current value a half as large as a current value of said first current source and whose emitter is connected with the input of said first current source;
   a first PNP transistor whose base is connected with the collector of said fourth NPN transistor, whose emitter is connected with an output of a third current source and whose collector is grounded;
   a second PNP transistor whose base is supplied with a fourth electric signal retaining a predetermined value independent of the ambient temperature, whose emitter is connected with the output of said third current source and whose collector is grounded;
   a third PNP transistor whose base is supplied with a fifth electric signal decreasing in proportion to the ambient temperature, whose emitter is connected with the output of said third current source and whose collector is grounded; and
   a fourth PNP transistor whose emitter is connected with the output of said third current source and whose collector and base are connected with an input of a fourth current source having a current value a half as large as a current value of said third current source,
said fourth NPN transistor selects an electric signal having a maximum voltage value among said first electric signal, said second electric signal and said third electric signal and outputs said selected electric signal at the collector thereof as a sixth electric signal,
said fourth PNP transistor selects an electric signal having a minimum voltage value among said fourth electric signal, said fifth electric signal and said sixth electric signal and outputs said selected electric signal at the collector thereof as a seventh electric signal, and
said control circuit outputs said seventh electric signal as said control signal.

3. The function generator of claim 2,
wherein a first resistance is serially connected between the emitter of said first NPN transistor and said first current source,
a second resistance is serially connected between the emitter of said second NPN transistor and said first current source,
a third resistance is serially connected between the emitter of said third NPN transistor and said first current source,
a fourth resistance is serially connected between the emitter of said fourth NPN transistor and said first current source,
a fifth resistance is serially connected between the emitter of said first PNP transistor and said third current source,
a sixth resistance is serially connected between the emitter of said second PNP transistor and said third current source,
a seventh resistance is serially connected between the emitter of said third PNP transistor and said third current source, and
an eighth resistance is serially connected between the emitter of said fourth PNP transistor and said third current source.

4. A function generator of claim 1,
wherein said control circuit comprises:
   a MAX circuit receiving said first, second and third control signals, and outputting any of said first, second and third control signals, whichever has a maximum value at a given temperature within any of said first, second and third temperature regions; and
   a MIN circuit receiving said fourth control signal, said fifth control signal and the signal outputted from said MAX circuit, and outputting any of said fourth control signal, said fifth control signal and the control signal outputted from said MAX circuit, whichever has a minimum value at a given temperature within either of said fourth and fifth temperature regions, and
wherein said control signal outputted from said control circuit is the signal outputted from said MIN circuit.

5. A function generator of claim 1,
wherein said control circuit comprises:
   a MAX circuit including a first differential amplification circuit with a first set of three input terminals for receiving said first, second and third control signals, respectively, and outputting a signal corresponding to a signal obtained by dividing each of said first, second and third control signals based on a resistance of each of nodes at which transistor circuits composing said first differential amplification circuit and each of said first set of input terminals are commonly connected; and
   a MIN circuit including a second differential amplification circuit with a second set of three input terminals for receiving said fourth control signal, said fifth control signal and the signal outputted from said MAX circuit, and outputting a signal corresponding to a signal obtained by dividing each of said fourth control signal, said fifth control signal and the signal outputted from said MAX circuit based on a resistance of other nodes at which other transistor circuits composing said second differential amplification circuit and each of said second set of input terminals are commonly connected, and wherein said control signal outputted from said control circuit is the signal outputted from said MIN circuit.

6. A function generator of claim 1, wherein said control circuit comprises:

a MIN circuit receiving said third, fourth and fifth control signals, and outputting any of said third, fourth and fifth control signals, whichever has a minimum value at a given temperature within any of said third, fourth and fifth temperature regions; and a MAX circuit receiving said first control signal, said second control signal and the signal outputted from said MIN circuit, and outputting any of said first control signal, said second control signal and the signal outputted from said MIN circuit, whichever has a maximum value at a given temperature within either of said first and second temperature regions, and wherein said control signal outputted from said control circuit is the signal outputted from said MAX circuit.

7. A function generator of claim 1, wherein said control circuit comprises:

a MIN circuit including a first differential amplification circuit with a first set of three input terminals for receiving said third, fourth and fifth control signals, respectively, and outputting a signal corresponding to a signal obtained by dividing each of said third, fourth and fifth control signals based on a resistance of each of nodes at which transistor circuits composing said first differential amplification circuit and each of said first set of input terminals are commonly connected; and a MAX circuit including a second differential amplification circuit with a second set of three input terminals for receiving said first control signal, said second control signal and the signal outputted from said MIN circuit, and outputting a signal corresponding to a signal obtained by dividing each of said first control signal, said second control signal and the signal outputted from said MIN circuit based on a resistance of each of other nodes at which other transistor circuits composing said second differential amplification circuit and each of said second set of input terminals are commonly connected, and wherein said control signal outputted from said control circuit is said signal outputted from said MAX circuit.

8. A function generator of claim 1, wherein said storage means comprises: a RAM data input circuit; a ROM circuit; and a switch circuit, said RAM data input circuit performing a parallel conversion on a serial data received from outside based on a clock signal when an operation enable signal indicates that operation is permitted, to generate a plurality of parallel data, and outputting said parallel data to said ROM circuit and said switch circuit;

a PROM circuit storing said parallel data received from said RAM data input circuit at a data storage circuit included in said PROM circuit when a read/write control signal indicates that write operation is permitted, while outputting said parallel data to said switch circuit when said read/write control signal indicates that read operation is permitted; and said switch circuit selecting either of said parallel data outputted from said RAM data input circuit and from said PROM circuit, and outputting said selected parallel data.

9. A crystal oscillation device comprising:

a first analog signal generating circuit for generating and outputting a predetermined analog signal substantially independent of an ambient temperature;

a second analog signal generating circuit for generating and outputting an analog signal dependent upon the ambient temperature;

storage means for storing control information respectively corresponding to first, second, third, fourth and fifth temperature regions obtained by dividing a feasible range of the ambient temperature into five continuous parts in this order along a direction from a low temperature to a high temperature;

a third analog signal generating circuit for receiving said signal from said first analog signal generating circuit and said signal from said second analog signal generating circuit and further receiving said control information from said storage means, and for generating to output first, second, third, fourth and fifth control signals respectively corresponding to said five temperature regions;

a control circuit for receiving said first through fifth control signals and generating to output a control signal as a function of a temperature based on each received signal; and a crystal oscillating circuit for receiving a control signal from said control circuit so as to be controlled to have an oscillation frequency at a predetermined value by said control signal, wherein said storage means stores as said control information:

a first proportional value defining a relationship between a proportional coefficient between a temperature used for generating said first control signal and the output value thereof and a cubic coefficient of a temperature characteristic of an oscillation frequency of a quartz oscillator;

a second proportional value defining a relationship between a constant between a temperature used for generating said second control signal and the output value thereof and said cubic coefficient;

a third proportional value defining a relationship between a proportional coefficient between a temperature used for generating said third control signal and the output value thereof and said cubic coefficient;

a fourth proportional value defining a relationship between a constant between a temperature used for generating said fourth control signal and the output value thereof and said cubic coefficient; and a fifth proportional value defining a relationship between a proportional coefficient between a temperature used for generating said fifth control signal and the output value thereof and said cubic coefficient, and wherein when the ambient temperature is in any of said first, second and third temperature regions, said control signal outputted from said control circuit comprises: any of said first, second and third control signals which is selected by said control circuit; and another signal generated by altering said selected signal so as to form a smooth curve in a region around a border between the temperature region to which the ambient temperature belongs and the adjacent temperature region, while when the ambient temperature is in either of said fourth and fifth temperature regions, said control signal outputted from said control circuit comprises: any of at least one of said first, second and third control signals including said third control signal, said fourth control signal and said fifth control signal which is selected by said control circuit; and another signal generating by altering said selected signal so as to form a smooth curve in a region around a border between the temperature region to which the ambient temperature belongs and the adjacent temperature region.

10. The crystal oscillation device of claim 9, wherein said control circuit includes:

a first NPN transistor whose collector is supplied with a supply voltage, whose base is supplied with a first electric signal decreasing in proportion to the ambient temperature and whose emitter is connected with an input of a first current source;

a second NPN transistor whose collector is supplied with the supply voltage, whose base is supplied with a second electric signal retaining a predetermined value independent of the ambient temperature and whose emitter is connected with the input of said first current source;

a third NPN transistor whose collector is supplied with the supply voltage, whose base is supplied with a third electric signal increasing in proportion to the ambient temperature and whose emitter is connected with the input of said first current source;

a fourth NPN transistor whose collector and base are connected with an output of a second current source having a current value a half as large as a current value of said first current source and whose emitter is connected with the input of said first current source;

a first PNP transistor whose base is connected with the collector of said fourth NPN transistor, whose emitter is connected with an output of a third current source and whose collector is grounded;

a second PNP transistor whose base is supplied with a fourth electric signal retaining a predetermined value independent of the ambient temperature, whose emitter is connected with the output of said third current source and whose collector is grounded;

a third PNP transistor whose base is supplied with a fifth electric signal decreasing in proportion to the ambient temperature, whose emitter is connected with the output of said third current source and whose collector is grounded; and a fourth PNP transistor whose emitter is connected with the output of said third current source and whose collector and base are connected with an input of a fourth current source having a current value a half as large as a current value of said third current source, said fourth NPN transistor selects an electric signal having a maximum voltage value among said first electric signal, said second electric signal and said third electric signal and outputs said selected electric signal at the collector thereof as a sixth electric signal, said fourth PNP transistor selects an electric signal having a minimum voltage value among said fourth electric signal, said fifth electric signal and said sixth electric signal and outputs said selected electric signal at the collector thereof as a seventh electric signal, and said control circuit outputs said seventh electric signal as said control signal.

11. The crystal oscillation device of claim 10, wherein a first resistance is serially connected between the emitter of said first NPN transistor and said first current source, a second resistance is serially connected between the emitter of said second NPN transistor and said first current source, a third resistance is serially connected between the emitter of said third NPN transistor and said first current source, a fourth resistance is serially connected between the emitter of said fourth NPN transistor and said first current source, a fifth resistance is serially connected between the emitter of said first PNP transistor and said third current source, a sixth resistance is serially connected between the emitter of said second PNP transistor and said third current source, a seventh resistance is serially connected between the emitter of said third PNP transistor and said third current source, and an eighth resistance is serially connected between the emitter of said fourth PNP transistor and said third current source.

12. The crystal oscillation device of claim 9, wherein said storage means comprises a RAM circuit and a ROM circuit:

said RAM circuit storing parameters for compensating the temperature dependency of the oscillation frequency of said crystal oscillating circuit, of said first through fifth control signals output by said control circuit, with varying each of said parameters with regard to each of said control signals; and said ROM circuit being programmable and storing an optimal parameter of said parameters with regard to each of said control signals.

13. The crystal oscillation device of claim 9, further comprising:

optimizing means for optimizing said control signals output by said control circuit independently of one another and in accordance with a cubic temperature coefficient, a linear temperature coefficient, a frequency difference from a reference frequency at a temperature of an inflection point and said temperature of the inflection point of the temperature dependency of the oscillation frequency of said crystal oscillating circuit.

14. A crystal oscillation device of claim 9, wherein said control circuit comprises:

a MAX circuit receiving said first, second and third control signals, and outputting any of said first, second and third control signals, whichever has a maximum value at a given temperature within any of said first, second and third temperature regions; and a MIN circuit receiving said fourth control signal, said fifth control signal and the signal outputted from said MAX circuit, and outputting any of said fourth control signal, said fifth control signal and the control signal outputted from said MAX circuit, whichever has a minimum value at a given temperature within either of said fourth and fifth temperature regions, and wherein said control signal outputted from said control circuit is the signal outputted from said MIN circuit.

15. A crystal oscillation device of claim 9, wherein said control circuit comprises:

a MAX circuit including a first differential amplification circuit with a first set of three input terminals for receiving said first, second and third control signals, respectively, and outputting a signal corresponding to a signal obtained by dividing each of said first, second and third control signals based on a resistance of each of nodes at which transistor circuits composing said first differential amplification circuit and each of said first set of input terminals are commonly connected; and a MIN circuit including a second differential amplification circuit with a second set of three input terminals for receiving said fourth control signal, said fifth control signal and the signal outputted from said MAX circuit, and outputting a signal corresponding to a signal obtained by dividing each of said fourth control signal, said fifth control signal and the signal outputted from said MAX circuit based on a resistance of other nodes at which other transistor circuits composing said second differential amplification circuit and each of said second set of input terminals are commonly connected, and wherein said control signal outputted from said control circuit is the signal outputted from said MIN circuit.

16. A crystal oscillation device of claim 9, wherein said control circuit comprises:

a MIN circuit receiving said third, fourth and fifth control signals, and outputting any of said third, fourth and fifth control signals, whichever has a minimum value at a given temperature within any of said third, fourth and fifth temperature regions; and a MAX circuit receiving said first control signal, said second control signal and the signal outputted from said MIN circuit, and outputting any of said first control signal, said second control signal and the signal outputted from said MIN circuit, whichever has a maximum value at a given temperature within either of said first and second temperature regions, and wherein said control signal outputted from said control circuit is the signal outputted from said MAX circuit.

17. A crystal oscillation device of claim 9, wherein said control circuit comprises:

a MIN circuit including a first differential amplification circuit with a first set of three input terminals for receiving said third, fourth and fifth control signals, respectively, and outputting a signal corresponding to a signal obtained by dividing each of said third, fourth and fifth control signals based on a resistance of each of nodes at which transistor circuits composing said first differential amplification circuit and each of said first set of input terminals are commonly connected; and a MAX circuit including a second differential amplification circuit with a second set of three input terminals for receiving said first control signal, said second control signal and the signal outputted from said MIN circuit, and outputting a signal corresponding to a signal obtained by dividing each of said first control signal, said second control signal and the signal outputted from said MIN circuit based on a resistance of each of other nodes at which other transistor circuits composing said second differential amplification circuit and each of said second set of input terminals are commonly connected, and wherein said control signal outputted from said control circuit is said signal outputted from said MAX circuit.

18. A crystal oscillation device of claim 9, wherein said storage means comprises: a RAM data input circuit; a ROM circuit; and a switch circuit, said RAM data input circuit performing a parallel conversion on a serial data received from outside based on a clock signal when an operation enable signal indicates that operation is permitted, to generate a plurality of parallel data, and outputting said parallel data to said ROM circuit and said switch circuit;

a PROM circuit storing said parallel data received from said RAM data input circuit at a data storage circuit included in said PROM circuit when a read/write control signal indicates that write operation is permitted, while outputting said parallel data to said switch circuit when said read/write control signal indicates that read operation is permitted; and said switch circuit selecting either of said parallel data outputted from said RAM data input circuit and from said PROM circuit, and outputting said selected parallel data.

19. A method of adjusting a crystal oscillation device including a first analog signal generating circuit for generating and outputting a predetermined analog signal substantially independent of an ambient temperature;

a second analog signal generating circuit for generating and outputting an analog signal dependent upon the ambient temperature;

a control circuit for receiving said signal from said first analog signal generating circuit and said signal from said second analog signal generating circuit, and for generating, with a feasible range of the ambient temperature continuously divided into a first temperature region, a second temperature region, a third temperature region, a fourth temperature region and a fifth temperature region in this order along a direction from a low temperature to a high temperature, control signals respectively corresponding to said five temperature regions;

a crystal oscillating circuit for receiving a control signal from said control circuit so as to be controlled to have an oscillation frequency at a predetermined value by said control signal;

a RAM circuit for storing parameters, for compensating a temperature dependency of the oscillation frequency of said crystal oscillating circuit, of said first through fifth control signals output by said control circuit, with varying each of said parameters with regard to each of said control signals; and a programmable ROM circuit for storing an optimal parameter of said parameters with regard to each of said control signals, said control circuit outputting a first control signal whose output value is decreased in proportion to increase of the temperature when the ambient temperature is in said first temperature region; a second control signal whose output value is continuous with said first control signal and is a predetermined value independent of the temperature when the ambient temperature is in said second temperature region; a third control signal whose output value is continuous with said second control signal and is increased in proportion to increase of the temperature when the ambient temperature is in said third temperature region; a fourth control signal whose output value is continuous with said third control signal and is a predetermined value independent of the temperature when the ambient temperature is in said fourth temperature region; and a fifth control signal whose output value is continuous with said fourth control signal and is decreased in proportion to increase of the temperature when the ambient temperature is in said fifth temperature region, said method comprising:

a peculiar parameter determining step of determining peculiar parameters by allowing said crystal oscillation device to stand at a temperature continuously varying from said first temperature region to said fifth temperature region and by calculating parameters of said control signals respectively corresponding to a cubic temperature coefficient, a linear temperature coefficient, a frequency difference from a reference frequency at a temperature of an inflection point and said temperature of the inflection point of the temperature characteristic of said crystal oscillating circuit so as to make variation of the oscillation frequency output by said crystal oscillating circuit caused by the temperature substantially zero;

an initial parameter determining step of determining initial parameters by measuring an initial temperature characteristic of said control signals output by said control circuit and by calculating the parameters of said control signals respectively corresponding to said cubic temperature coefficient, said linear temperature coefficient, said frequency difference from the reference frequency at said temperature of the inflection point and said temperature of the inflection point; and an optimal parameter writing step of obtaining change amounts of said control signals per unit of data corresponding to temperature compensating parameters stored in said RAM circuit by measuring a change amount of said initial temperature characteristic with changing said data corresponding to said temperature compensating parameters, obtaining differences between said initial parameters and said peculiar parameters, determining an optimal parameter of said control signals so as to minimize said differences on the basis of said change amounts of said control signals per unit of said data, and writing said optimal parameter in said ROM circuit.

20. A method of adjusting a crystal oscillation device including a first analog signal generating circuit for generating and outputting a predetermined analog signal substantially independent of an ambient temperature;

a second analog signal generating circuit for generating and outputting an analog signal dependent upon the ambient temperature;

a control circuit for receiving said signal from said first analog signal generating circuit and said signal from said second analog signal generating circuit, and for generating, with a feasible range of the ambient temperature continuously divided into a first temperature region, a second temperature region, a third temperature region, a fourth temperature region and a fifth temperature region in this order along a direction from a low temperature to a high temperature, control signals respectively corresponding to said five temperature regions;

a crystal oscillating circuit for receiving a control signal from said control circuit so as to be controlled to have an oscillation frequency at a predetermined value by said control signal;

a RAM circuit for storing parameters, for compensating a temperature dependency of the oscillation frequency of said crystal oscillating circuit, of said first through fifth control signals output by said control circuit, with varying each of said parameters with regard to each of said control signals; and a programmable ROM circuit for storing an optimal parameter of said parameters with regard to each of said control signals, said control circuit outputting a first control signal whose output value is decreased in proportion to increase of the temperature when the ambient temperature is in said first temperature region; a second control signal whose output value is continuous with said first control signal and is a predetermined value independent of the temperature when the ambient temperature is in said second temperature region; a third control signal whose output value is continuous with said second control signal and is increased in proportion to increase of the temperature when the ambient temperature is in said third temperature region; a fourth control signal whose output value is continuous with said third control signal and is a predetermined value independent of the temperature when the ambient temperature is in said fourth temperature region; and a fifth control signal whose output value is continuous with said fourth control signal and is decreased in proportion to increase of the temperature when the ambient temperature is in said fifth temperature region, said method comprising:

a peculiar control voltage measuring step of measuring a peculiar control voltage which reduces variation of the oscillation frequency output by said crystal oscillating circuit caused by the temperature to about zero, by allowing said crystal oscillation device to stand at a temperature continuously varying from said first temperature region to said fifth temperature region;

a peculiar parameter determining step of determining peculiar parameters respectively corresponding to a cubic temperature coefficient, a linear temperature coefficient, a frequency difference from a reference frequency at a temperature of an inflection point and said temperature of the inflection point of the temperature characteristic of a crystal oscillator in said crystal oscillating circuit, based on temperature characteristic of said peculiar control voltage;

an initial control voltage characteristic measuring step of measuring temperature characteristic of an initial control voltage of said control circuit by changing temperature compensating parameters received by and stored in said RAM circuit;

an initial parameter determining step of determining initial parameters based on said temperature characteristic of said initial control voltage by calculating parameters of said control signals respectively corresponding to said cubic temperature coefficient, said linear temperature coefficient, said frequency difference from the reference frequency at said temperature of the inflection point and said temperature of the inflection point of said crystal oscillator in said crystal oscillation circuit;

a change amount calculating step of calculating by bit, change amounts of said temperature compensating parameters stored in said RAM circuit;

a difference calculating step of calculating differences between said peculiar parameters and said initial parameters; and an optimal parameter determining step of determining an optimal parameter which reduces said differences to about zero, based on said change amounts calculated by bit.

21. A function generator comprising:

a first analog signal generating circuit for generating and outputting a predetermined analog signal substantially independent of an ambient temperature;

a second analog signal generating circuit for generating and outputting an analog signal dependent upon the ambient temperature;

a control circuit for receiving said signal from said first analog signal generating circuit and said signal from said second analog signal generating circuit, and for generating and outputting, with a feasible range of the ambient temperature continuously divided into a first temperature region, a second temperature region, a third temperature region, a fourth temperature region and a fifth temperature region in this order along a direction from a low temperature to a high temperature, control signals respectively corresponding to said five temperature regions, wherein said function generator selects any of said control signals and generates a control signal serving as a function of a temperature from the selected signal, and wherein said control circuit comprises:

a first control signal generating circuit for outputting a first control signal whose output value is varied in proportion to increase of the temperature at a first change rate when the ambient temperature is in said first temperature region;

a second control signal generating circuit for outputting a second control signal whose output value is a predetermined value independent of the temperature when the ambient temperature is in said second temperature region;

a third control signal generating circuit for outputting a third control signal whose output value is varied in proportion to increase of the temperature at a second change rate when the ambient temperature is in said third temperature region;

a fourth control signal generating circuit for outputting a fourth control signal whose output value is a predetermined value independent of the temperature when the ambient temperature is in said fourth temperature region;

a fifth control signal generating circuit for outputting a fifth control signal whose output value is varied in proportion to increase of the temperature at a third change rate;

a maximum value signal output circuit for receiving said first, second and third control signals and outputting as a maximum value signal, any of said first, second and third control signals, whichever has a maximum value; and a minimum value signal output circuit for receiving said maximum value signal, said fourth control signal, and said fifth control signal, and outputting as a minimum value signal, any of said maximum value signal, said fourth control signal and said fifth control signal, whichever has a minimum value, and wherein said control signal generated by said function generator is said minimum value signal.

22. A function generator comprising:

a first analog signal generating circuit for generating and outputting a predetermined analog signal substantially independent of an ambient temperature;

a second analog signal generating circuit for generating and outputting an analog signal dependent upon the ambient temperature;

a control circuit for receiving said signal from said first analog signal generating circuit and said signal from said second analog signal generating circuit, and for generating and outputting, with a feasible range of the ambient temperature continuously divided into a first temperature region, a second temperature region, a third temperature region, a fourth temperature region and a fifth temperature region in this order along a direction from a low temperature to a high temperature, control signals respectively corresponding to said five temperature regions, wherein said function generator selects any of said control signals and generates a control signal as a function of a temperature from the selected signal, and wherein said control circuit comprises:

a first control signal generating circuit for outputting a first control signal whose output value is varied in proportion to increase of the temperature at a first change rate when the ambient temperature is in said first temperature region;

a second control signal generating circuit for outputting a second control signal whose output value is a predetermined value independent of the temperature when the ambient temperature is in said second temperature region;

a third control signal generating circuit for outputting a third control signal whose output value is varied in proportion to increase of the temperature at a second change rate when the ambient temperature is in said third temperature region;

a fourth control signal generating circuit for outputting a fourth control signal whose output value is a predetermined value independent of the temperature when the ambient temperature is in said fourth temperature region;

a fifth control signal generating circuit for outputting a fifth control signal whose output value is varied in proportion to increase of the temperature at a third change rate;

a minimum value signal output circuit for receiving said third, fourth and fifth control signals and outputting as a minimum value signal, any of said third, fourth and fifth control signals, whichever has a minimum value; and a maximum value signal output circuit for receiving said minimum value signal, said first control signal, and said second control signal, and outputting as a maximum value signal, any of said minimum value signal, said first control signal, and said second control signal, whichever has a maximum value, and wherein said control signal outputted from said control circuit is said maximum value signal.

23. A crystal oscillator comprising:

a first analog signal generating circuit for generating and outputting a predetermined analog signal substantially independent of an ambient temperature;

a second analog signal generating circuit for generating and outputting an analog signal dependent upon the ambient temperature;

a control circuit for receiving said signal from said first analog signal generating circuit and said signal from said second analog signal generating circuit, and for generating and outputting, with a feasible range of the ambient temperature continuously divided into a first temperature region, a second temperature region, a third temperature region, a fourth temperature region and a fifth temperature region in this order along a direction from a low temperature to a high temperature, control signals respectively corresponding to said five temperature regions; and a crystal oscillation circuit for receiving a control signal from said control circuit so as to be controlled to have an oscillation frequency at a predetermined value by said control signal, wherein said control circuit selects any of said control signals and generates a control signal serving as a function of a temperature from the selected signal, and wherein said control circuit comprises:

a first control signal generating circuit for outputting a first control signal whose output value is varied in proportion to increase of the temperature at a first change rate when the ambient temperature is in said first temperature region;

a second control signal generating circuit for outputting a second control signal whose output value is a predetermined value independent of the temperature when the ambient temperature is in said second temperature region;

a third control signal generating circuit for outputting a third control signal whose output value is varied in proportion to increase of the temperature at a second change rate when the ambient temperature is in said third temperature region;

a fourth control signal generating circuit for outputting a fourth control signal whose output value is a predetermined value independent of the temperature when the ambient temperature is in said fourth temperature region;

a fifth control signal generating circuit for outputting a fifth control signal whose output value is varied in proportion to increase of the temperature at a third change rate;

a maximum value signal output circuit for receiving said first, second and third control signals and outputting as a maximum value signal, any of said first, second and third control signals, whichever has a maximum value; and a minimum value signal output circuit for receiving said meaximum value signal, said fourth control signal, and said fifth control signal, and outputting as a minimum value signal, any of said maximum value signal, said fourth control signal and said fifth control signal, whichever has a minimum value, and wherein said control signal generated by said function generator is said minimum value signal.

24. A crystal oscillation circuit comprising:

a first analog signal generating circuit for generating and outputting a predetermined analog signal substantially independent of an ambient temperature;

a second analog signal generating circuit for generating and outputting an analog signal dependent upon the ambient temperature;

a control circuit for receiving said signal from said first analog signal generating circuit and said signal from said second analog signal generating circuit, and for generating and outputting, with a feasible range of the ambient temperature continuously divided into a first temperature region, a second temperature region, a third temperature region, a fourth temperature region and a fifth temperature region in this order along a direction from a low temperature to a high temperature, control signals respectively corresponding to said five temperature regions; and a crystal oscillation circuit for receiving a control signal from said control circuit so as to be controlled to have an oscillation frequency at a predetermined value by said control signal, wherein said control circuit selects any of said control signals and generates a control signal as a function of a temperature from the selected signal, and wherein said control circuit comprises:

a first control signal generating circuit for outputting a first control signal whose output value is varied in proportion to increase of the temperature at a first change rate when the ambient temperature is in said first temperature region;

a second control signal generating circuit for outputting a second control signal whose output value is a predetermined value independent of the temperature when the ambient temperature is in said second temperature region;

a third control signal generating circuit for outputting a third control signal whose output value is varied in proportion to increase of the temperature at a second change rate when the ambient temperature is in said third temperature region;

a fourth control signal generating circuit for outputting a fourth control signal whose output value is a predetermined value independent of the temperature when the ambient temperature is in said fourth temperature region;

a fifth control signal generating circuit for outputting a fifth control signal whose output value is varied in proportion to increase of the temperature at a third change rate;

a minimum value signal output circuit for receiving said third, fourth and fifth control signals and outputting as a minimum value signal, any of said third, fourth and fifth control signals, whichever has a minimum value; and a maximum value signal output circuit for receiving said minimum value signal, said first control signal, and said second control signal, and outputting as a maximum value signal, any of said minimum value signal, said first control signal, and said second control signal, whichever has a maximum value, and wherein said control signal generated by said control circuit is said maximum value signal.

25. A function generator comprising:

a first analog signal generating circuit for generating and outputting a predetermined analog signal substantially independent of an ambient temperature;

storage means for storing control information respectively corresponding to first, second and third temperature regions obtained by dividing a feasible range of the ambient temperature into three continuous parts in this order along a direction from a low temperature to a high temperature;

a second analog signal generating circuit for receiving said signal from said first analog signal generating circuit and said control information from said storage means, and for generating and outputting first, second and third control signals respectively corresponding to said three temperature regions; and a control circuit for receiving said first through third control signals and generating to output a control signal as a function of a temperature based on each received signal, wherein said storage means stores as said control information:

a first proportional value defining a relationship between a proportional coefficient between a temperature used for generating said first control signal and the output value thereof and a cubic coefficient of a temperature characteristic of an oscillation frequency of a quartz oscillator;

a second proportional value defining a relationship between a proportional coefficient between a temperature used for generating said second control signal and the output value thereof and said cubic coefficient;

a third proportional value defining a relationship between a proportional coefficient between a temperature used for generating said third control signal and the out put value thereof and said cubic coefficient, wherein said control circuit comprises:

a MAX circuit receiving said first and second control signals, and outputting either of said first and second control signals, whichever has a maximum value at a given temperature within either of said first and second temperature regions; and a MIN circuit receiving said third control signal and the signal outputted from said MAX circuit, and outputting either of said third control signal and the signal outputted from said MAX circuit, whichever has a minimum value at a given temperature within said third temperature region, and wherein said control signal outputted from said control circuit is the signal outputted from said MIN circuit.

26. A function generator of claim 25, wherein said control circuit comprises:

a MAX circuit including a first differential amplification circuit with a first set of two input terminals for receiving said first and second control signals, respectively, and outputting a signal corresponding to a signal obtained by dividing each of said first and second control signals based on a resistance of each of nodes at which transistor circuits composing said first differential amplification circuit and each of said first set of input terminals are commonly connected; and a MIN circuit including a second differential amplification circuit with a second set of two input terminals for receiving said third control signal and the signal outputted from said MAX circuit, and outputting a signal corresponding to a signal obtained by dividing each of said third control signal and the signal outputted from said MAX circuit based on a resistance of each of other nodes at which other transistor circuits composing said second differential amplification circuit and each of said second set of input terminals are commonly connected, and wherein said control signal outputted from said control circuit is said signal outputted from said MIN circuit.

27. A function generator of claim 25, wherein said control circuit comprises:

a MIN circuit receiving said second and third control signals, and outputting either of said second and third control signals, whichever has a minimum value at a given temperature in either of said second and third temperature regions; and a MAX circuit receiving said first control signal and the signal outputted from said MIN circuit, and outputting either of said first control signal and the signal outputted from said MIN circuit, whichever has a maximum value at a given temperature within said first temperature region, and wherein said control signal outputted from said control circuit is the signal outputted from said MAX circuit.

28. A function generator of claim 25, wherein said control circuit comprises:

a MIN circuit including a first differential amplification circuit with a first set of two input terminals for receiving said second and third control signals, respectively, and outputting a signal corresponding to a signal obtained by dividing each of said second and third control signals based on a resistance of each nodes at which transistor circuits composing said first differential amplification circuit and each of said first set of input terminals are commonly connected; and a MAX circuit including a second differential amplification circuit with a second set of two input terminals for receiving said first control signal and the signal outputted from said MAX circuit, and outputting a signal corresponding to a signal obtained by dividing each of said first control signal and the signal outputted from said MAX circuit based on a resistance of each of other nodes at which other transistor circuits composing said second differential amplification circuit and each of said second set of input terminals are commonly connected, and wherein said control signal outputted from said control circuit is the signal outputted from said MAX circuit.

* * * * *